(12) United States Patent
Lubomirsky et al.

(10) Patent No.: US 7,654,221 B2
(45) Date of Patent: Feb. 2, 2010

(54) APPARATUS FOR ELECTROLESS DEPOSITION OF METALS ONTO SEMICONDUCTOR SUBSTRATES

(75) Inventors: Dmitry Lubomirsky, Cupertino, CA (US); Arulkumar Shanmugasundram, Sunnyvale, CA (US); Ian A. Pancham, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 620 days.

(21) Appl. No.: 11/175,251

(22) Filed: Jul. 6, 2005

(65) Prior Publication Data

US 2005/0260345 A1   Nov. 24, 2005

Related U.S. Application Data

(63) Continuation-in-part of application No. 10/996,342, filed on Nov. 22, 2004, now Pat. No. 7,323,058, application No. 11/175,251, which is a continuation-in-part of application No. 10/680,325, filed on Oct. 6, 2003, now Pat. No. 7,223,308, and a continuation-in-part of application No. 10/965,220, filed on Oct. 14, 2004, now Pat. No. 7,341,633, application No. 11/175,251, which is a continuation-in-part of application No. 11/043,442, filed on Jan. 26, 2005.

(60) Provisional application No. 60/539,491, filed on Jan. 26, 2004, provisional application No. 60/575,553, filed on May 28, 2004.

(51) Int. Cl.
  *B05C 13/00* (2006.01)
(52) U.S. Cl. .................. 118/52; 118/319; 118/320; 118/724; 118/725; 118/728; 118/729; 118/730; 118/500

(58) Field of Classification Search ............... 118/500, 118/503, 724, 725, 52, 319, 320, 728–730; 165/80.1, 80.2, 80, 5; 156/345.1, 345.52, 156/345.53; 438/748; 205/184, 186; 204/227, 204/232, 275.1
See application file for complete search history.

(56) References Cited

U.S. PATENT DOCUMENTS 2,369,620 A    2/1945   Sullivan et al.

(Continued)

FOREIGN PATENT DOCUMENTS

EP    0 329 406    8/1989

(Continued)

OTHER PUBLICATIONS

U.S. Appl. No. 09/245,780, (Dordi, et al.), filed Feb. 5, 1999.

(Continued)

*Primary Examiner*—Laura Edwards
(74) *Attorney, Agent, or Firm*—Patterson & Sheridan

(57) ABSTRACT

An electroless deposition system and electroless deposition stations are provided. The system includes a processing mainframe, at least one substrate cleaning station positioned on the mainframe, and an electroless deposition station positioned on the mainframe. The electroless deposition station includes an environmentally controlled processing enclosure, a first processing station configured to clean and activate a surface of a substrate, a second processing station configured to electrolessly deposit a layer onto the surface of the substrate, and a substrate shuttle positioned to transfer substrates between the first and second processing stations. The electroless deposition station also includes various fluid delivery and substrate temperature controlling devices to perform a contamination free and uniform electroless deposition process.

17 Claims, 25 Drawing Sheets

U.S. PATENT DOCUMENTS

| | | | |
|---|---|---|---|
| 3,937,857 A | 2/1976 | Brummett et al. |
| 4,006,047 A | 2/1977 | Brummett et al. |
| 4,113,492 A | 9/1978 | Sato et al. |
| 4,232,060 A | 11/1980 | Mallory et al. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory et al. |
| 4,428,815 A | 1/1984 | Powell et al. |
| 4,432,635 A | 2/1984 | Mayer et al. |
| 4,616,596 A | 10/1986 | Helber, Jr. et al. |
| 4,632,857 A | 12/1986 | Mallory, Jr. |
| 4,758,926 A | 7/1988 | Herrell et al. |
| 4,810,520 A | 3/1989 | Wu |
| 4,894,260 A | 1/1990 | Kumasaka et al. |
| 4,968,375 A * | 11/1990 | Sato et al. ............... 156/345.23 |
| 5,147,692 A | 9/1992 | Bengston |
| 5,203,911 A | 4/1993 | Sricharoenchaikit et al. |
| 5,222,310 A | 6/1993 | Thompson et al. |
| 5,224,504 A | 7/1993 | Thompson et al. |
| 5,230,743 A | 7/1993 | Thompson et al. |
| 5,235,139 A | 8/1993 | Bengston et al. |
| 5,240,497 A | 8/1993 | Shacham et al. |
| 5,248,527 A | 9/1993 | Uchida et al. |
| 5,259,407 A | 11/1993 | Tuchida et al. |
| 5,380,560 A | 1/1995 | Kaja et al. |
| 5,384,284 A | 1/1995 | Doan et al. |
| 5,415,890 A | 5/1995 | Kloiber et al. |
| 5,423,716 A | 6/1995 | Strasbaugh |
| 5,478,462 A | 12/1995 | Walsh |
| 5,510,216 A | 4/1996 | Calabrese et al. |
| 5,566,744 A | 10/1996 | Tepman |
| 5,622,593 A | 4/1997 | Arasawa et al. |
| 5,648,125 A | 7/1997 | Cane |
| 5,674,787 A | 10/1997 | Zhao et al. |
| 5,695,810 A | 12/1997 | Dubin et al. |
| 5,705,223 A | 1/1998 | Bunkofske |
| 5,720,818 A | 2/1998 | Donde et al. |
| 5,733,816 A | 3/1998 | Iyer et al. |
| 5,755,859 A | 5/1998 | Brusic et al. |
| 5,801,442 A | 9/1998 | Hamilton et al. |
| 5,804,456 A | 9/1998 | Aintila |
| 5,824,599 A | 10/1998 | Shacham-Diamand et al. |
| 5,830,805 A | 11/1998 | Shacham-Diamand et al. |
| 5,843,538 A | 12/1998 | Ehrsam et al. |
| 5,846,598 A | 12/1998 | Semkow et al. |
| 5,885,749 A | 3/1999 | Huggins et al. |
| 5,891,513 A | 4/1999 | Dubin et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,932,077 A | 8/1999 | Reynolds |
| 5,933,757 A | 8/1999 | Yoshikawa et al. |
| 5,966,940 A | 10/1999 | Gower et al. |
| 5,969,422 A | 10/1999 | Ting et al. |
| 5,998,240 A | 12/1999 | Hamilton et al. |
| 6,010,962 A | 1/2000 | Liu et al. |
| 6,015,724 A | 1/2000 | Yamazaki |
| 6,015,747 A | 1/2000 | Lopatin et al. |
| 6,065,424 A | 5/2000 | Shacham-Diamand et al. |
| 6,066,575 A | 5/2000 | Reardon et al. |
| 6,077,780 A | 6/2000 | Dubin |
| 6,107,199 A | 8/2000 | Allen et al. |
| 6,110,530 A | 8/2000 | Chen et al. |
| 6,113,702 A | 9/2000 | Halpin et al. |
| 6,113,771 A | 9/2000 | Landau et al. |
| 6,136,163 A | 10/2000 | Cheung et al. |
| 6,136,693 A | 10/2000 | Chan et al. |
| 6,140,234 A | 10/2000 | Uzoh et al. |
| 6,144,099 A | 11/2000 | Lopatin et al. |
| 6,153,935 A | 11/2000 | Edelstein et al. |
| 6,154,369 A | 11/2000 | Martinez, Jr. et al. |
| 6,165,912 A | 12/2000 | McConnell et al. |
| 6,171,661 B1 | 1/2001 | Zheng et al. |
| 6,174,812 B1 | 1/2001 | Hsiung et al. |
| 6,177,661 B1 | 1/2001 | Lee et al. |
| 6,180,523 B1 | 1/2001 | Lee et al. |
| 6,197,150 B1 | 3/2001 | Kwag et al. |
| 6,197,181 B1 | 3/2001 | Chen |
| 6,197,364 B1 | 3/2001 | Paunovic et al. |
| 6,197,688 B1 | 3/2001 | Simpson |
| 6,228,233 B1 | 5/2001 | Lakshmikanthan et al. |
| 6,239,038 B1 | 5/2001 | Wen |
| 6,241,825 B1 | 6/2001 | Wytman |
| 6,242,349 B1 | 6/2001 | Nogami et al. |
| 6,245,670 B1 | 6/2001 | Cheung et al. |
| 6,251,236 B1 | 6/2001 | Stevens |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,853 B1 | 7/2001 | Dordi et al. |
| 6,277,263 B1 | 8/2001 | Chen |
| 6,290,833 B1 | 9/2001 | Chen |
| 6,291,348 B1 | 9/2001 | Lopatin et al. |
| 6,303,010 B1 | 10/2001 | Woodruff et al. |
| 6,309,520 B1 | 10/2001 | Woodruff et al. |
| 6,309,524 B1 | 10/2001 | Woodruff et al. |
| 6,319,387 B1 | 11/2001 | Krishnamoorthy et al. |
| 6,323,128 B1 | 11/2001 | Sambucetti et al. |
| 6,342,733 B1 | 1/2002 | Hu et al. |
| 6,344,410 B1 | 2/2002 | Lopatin et al. |
| 6,368,966 B1 | 4/2002 | Krishnamoorthy et al. |
| 6,416,647 B1 | 7/2002 | Dordi et al. |
| 6,432,819 B1 | 8/2002 | Pavate et al. |
| 6,436,267 B1 | 8/2002 | Carl et al. |
| 6,436,816 B1 | 8/2002 | Lee et al. |
| 6,441,492 B1 | 8/2002 | Cunningham |
| 6,444,027 B1 | 9/2002 | Yang et al. |
| 6,463,938 B2 | 10/2002 | Bran |
| 6,465,765 B2 | 10/2002 | Katayama et al. |
| 6,486,533 B2 | 11/2002 | Krishnamoorthy et al. |
| 6,516,815 B1 | 2/2003 | Stevens et al. |
| 6,528,409 B1 | 3/2003 | Lopatin et al. |
| 6,548,411 B2 | 4/2003 | Wirth et al. |
| 6,565,729 B2 | 5/2003 | Chen et al. |
| 6,573,606 B2 | 6/2003 | Sambucetti et al. |
| 6,605,874 B2 | 8/2003 | Leu et al. |
| 6,616,967 B1 | 9/2003 | Test |
| 6,645,550 B1 | 11/2003 | Cheung et al. |
| 6,666,949 B1 | 12/2003 | Hillman et al. |
| 6,699,380 B1 | 3/2004 | Chen et al. |
| 6,717,189 B2 | 4/2004 | Inoue et al. |
| 6,743,473 B1 | 6/2004 | Parkhe et al. |
| 6,806,186 B2 | 10/2004 | Chen et al. |
| 6,811,675 B2 | 11/2004 | Chen |
| 6,824,612 B2 | 11/2004 | Stevens et al. |
| 6,824,621 B2 | 11/2004 | Shibagaki |
| 6,846,519 B2 | 1/2005 | Ivanov et al. |
| 6,908,512 B2 | 6/2005 | Ivanov et al. |
| 6,913,651 B2 | 7/2005 | Ivanov et al. |
| 7,223,308 B2 | 5/2007 | Pancham et al. |
| 7,235,483 B2 | 6/2007 | Ivanov |
| 2001/0030366 A1 | 10/2001 | Nakano et al. |
| 2002/0036143 A1 | 3/2002 | Segawa et al. |
| 2002/0083960 A1 | 7/2002 | Wirth et al. |
| 2002/0098681 A1 | 7/2002 | Hu et al. |
| 2002/0108861 A1* | 8/2002 | Emesh et al. ................. 205/81 |
| 2003/0010645 A1 | 1/2003 | Ting et al. |
| 2003/0075808 A1 | 4/2003 | Inoue et al. |
| 2003/0116439 A1 | 6/2003 | Seo et al. |
| 2003/0181040 A1 | 9/2003 | Ivanov et al. |

| | | |
|---|---|---|
| 2003/0190426 A1 | 10/2003 | Padhi et al. |
| 2004/0052963 A1 | 3/2004 | Ivanov et al. |
| 2004/0084143 A1 | 5/2004 | Ivanov et al. |
| 2004/0094186 A1 | 5/2004 | Ivanov |
| 2004/0097071 A1 | 5/2004 | Ivanov |
| 2004/0234696 A1 | 11/2004 | Hongo et al. |
| 2005/0072525 A1 | 4/2005 | Pancham et al. |

FOREIGN PATENT DOCUMENTS

| | | |
|---|---|---|
| EP | 0 475 567 | 3/1992 |
| EP | 0 913 498 | 5/1999 |
| EP | 1114 882 A2 | 11/2001 |
| EP | 1 209 251 A2 | 5/2002 |
| EP | 1 496 542 | 1/2005 |
| GB | 2285174 | 6/1995 |
| JP | 04131395 | 5/1992 |
| JP | 7-297543 | 11/1995 |
| JP | 07 235473 A | 1/1996 |
| JP | 11-124682 | 5/1999 |
| JP | 11 279797 A | 1/2000 |
| WO | WO 97/22419 | 6/1997 |
| WO | WO 97/22733 | 6/1997 |
| WO | WO 99/54920 | 10/1999 |
| WO | WO-9954920 | 10/1999 |

OTHER PUBLICATIONS

Eze, F. C., "Electroless deposition of CoO thin films," J. Phys. D: Appl. Phys. 32 (1999), pp. 533-540.

Eze, et al., "Chemical-bath-deposited cobalt sulphide films: preparation effects," Materials Chemistry and Physics, 47 (1997), pp. 31-36.

Lopatin, et al., "Thin Electroless barrier for copper films", Part of the SPIE Conference of Multilevel Interconnect technology II, SPIE vol. 3508 (1998), pp. 65-77.

Pearlstein, Fred. "Electroless Plating," J. Res. Natl. Bur. Stan., Ch. 31 (1963), pp. 710-747.

The Chinese Journal of Nonferrous Metals, vol. 10, No. 1, Feb. 2, 2000, Abstract included.

Shacham-Diamand, et al., "Electrochemically deposited thin film alloys for ULSI and MEMS applications," Microelectronic Engineering 50 (2000), pp. 525-531.

Saito, et al., "Electroless deposition of Ni-B, Co-B and Ni-Co-B alloys using dimethylamineborane as a reducing agent," Journal of Applied Electrochemistry 28 (1998), pp. 559-563.

Shacham-Diamand, et al. "Material properties of electroless 100-200 nm thick CoWP films," Electrochemical Society Proceedings, vol. 99-34, pp. 102-110.

Yosi Shacham-Diamand, et al. "High Aspect Ratio Quarter-Micron Electroless Copper Integrated Technology", Microelectronic Engineering 37/38 (1997) pp. 77-88.

C.K. Hu, et al. "Reduced Electromigration of Cu Wires by Surface Coating" Applied Physics Letters, vol. 81, No. 10, Sep. 2, 2002—pp. 1782-1784.

Lin, et al., "Manufacturing of Cu Electroless Nickel/Sn-Pb Flip Chip Solder Bumps", IEEE Transactions on Advanced Packaging, vol. 22, No. 4 (Nov. 1999), pp. 575-579.

Lowenheim, Frederick A., *Modern Electroplating*, Chapter 31, pp. 70-79 ($3^{rd}$ ed., Wiley & Sons 1974).

"Metallization & Interconnect", Semitool Products, printed Oct. 27, 1998, 4 pages.

"Wafer Back Surface Film Removal", Colombo, L., Central R&D, SGS-Thomson Microelectronics, Agrate, Italy, 6 pages.

"Tantalum, Copper and Damascene: The Future of Interconnects", Singer, P., Semiconductor International, Jun. 1998, 6 pages.

VERTEQ Online, Products Overview, printed Oct. 27, 1998, 5 pages.

"Electric Contacts" Theory and Application, Holm, R. and Holm, E., Springer-Verlag New York, Inc., 1967, 27 pages.

"Ney Contact Manual", Pitney, K.E., 1974, 19 pages.

"Wafer Processing", Singer, P., Semiconductor International, Jun. 1998, p. 70.

Sugihara et al., "Plating fog generation in the forming of printed circuits by the additive method", *Journal of Applied Electrochemistry*, 27(9) (Sep. 1997), pp. 1111-1117.

U.S. Appl. No. 09/522,726 (Kalyanam et al.), filed Mar. 10, 2000.

PCT Invitation to Pay Additional Fees and Partial International Search Report for International Application No. PCT/US2006/002619 dated Jan. 28, 2009.

PCT International Search Report and Written Opinion dated Mar. 4, 2009 for International Application No. PCT/US2006/002619.

Partial PCT Search Report for PCT/US04/032879 dated Jan. 11, 2005.

PCT International Search Report and Written Opinion for PCT/US04/032879 dated Apr. 6, 2005.

Prosecution History for U.S. Appl. No. 11/043,442, filed Jan. 26, 2005.

Prosecution History for U.S. Appl. No. 11/743,413, filed May 2, 2007.

\* cited by examiner

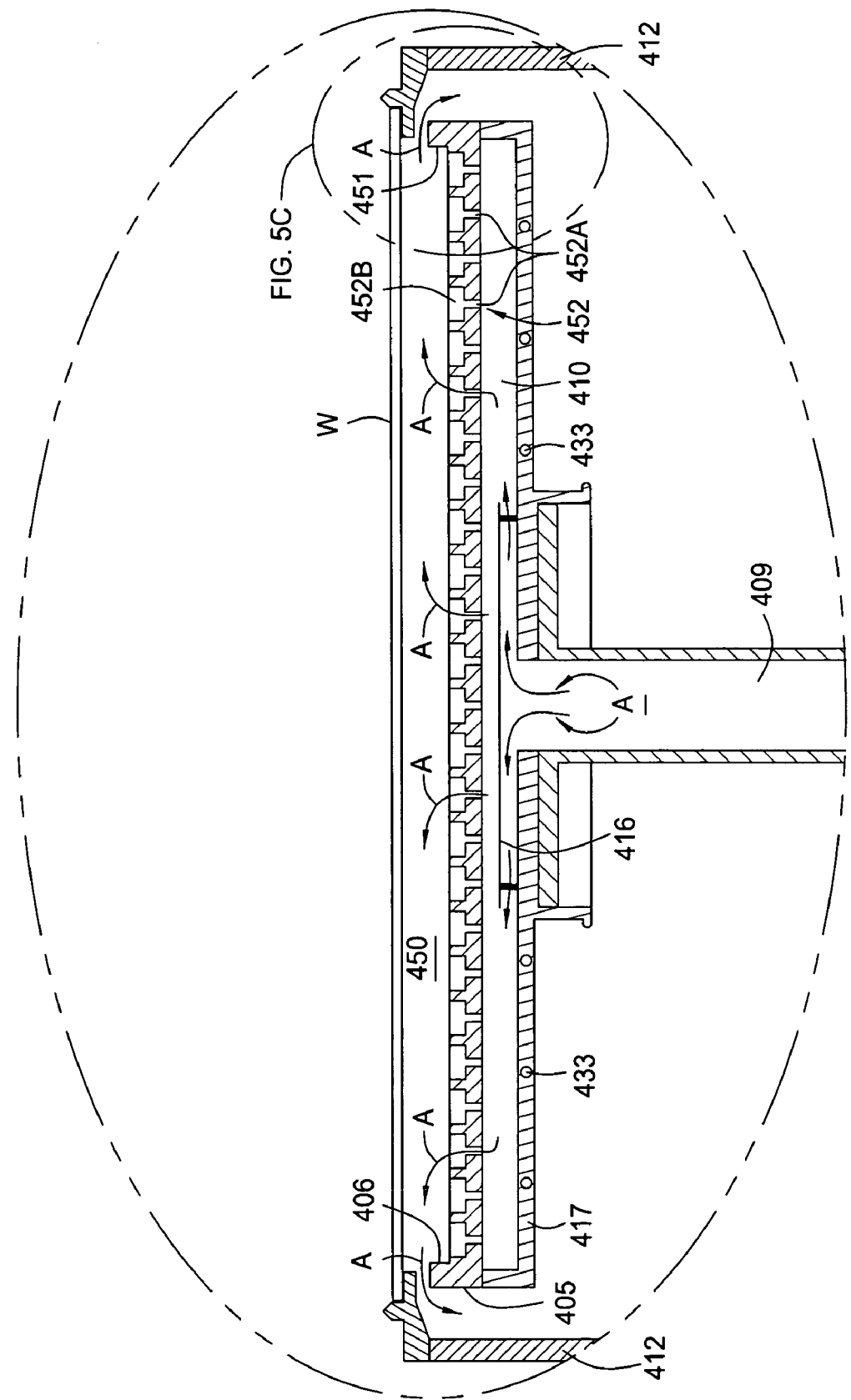

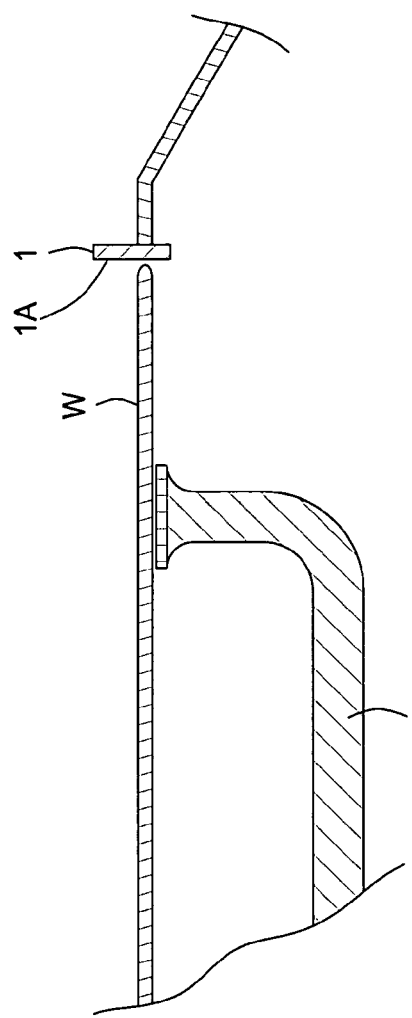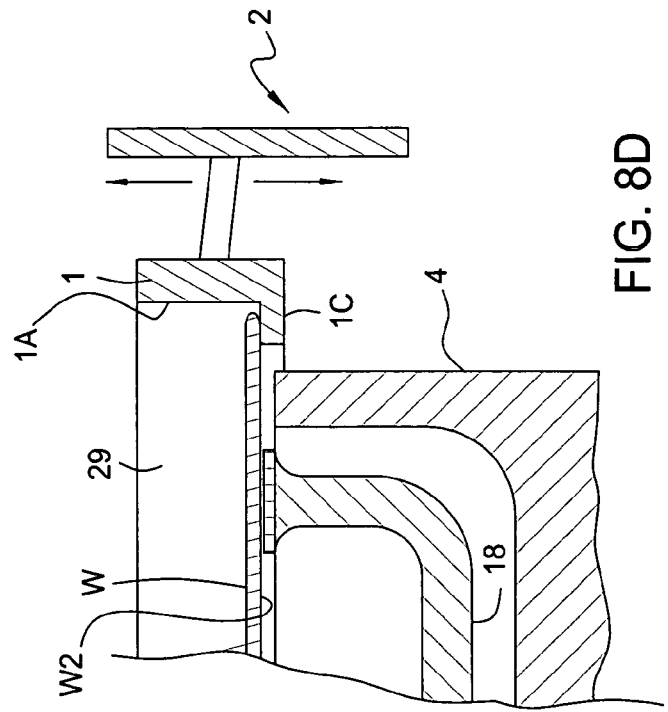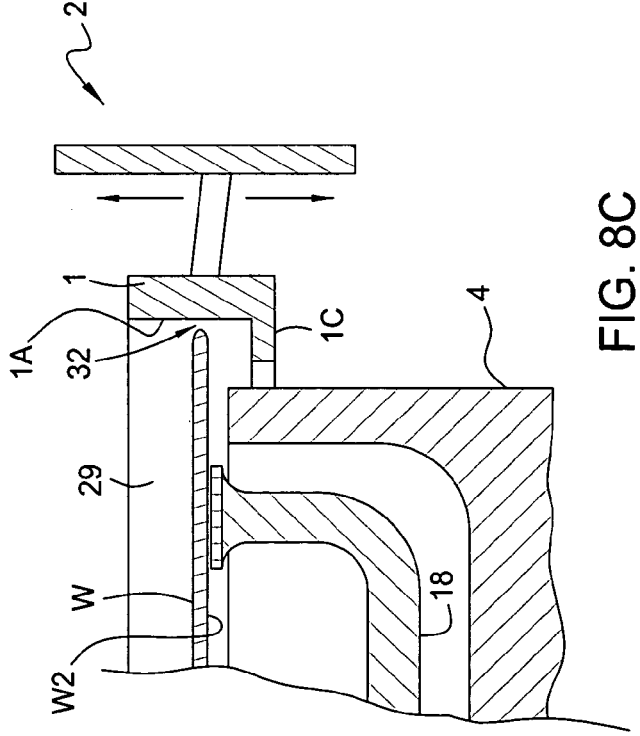
FIG. 8B
FIG. 8C
FIG. 8D

APPARATUS FOR ELECTROLESS DEPOSITION OF METALS ONTO SEMICONDUCTOR SUBSTRATES

CROSS-REFERENCE TO RELATED APPLICATIONS

This application is a continuation-in-part of U.S. patent application Ser. No. 10/996,342, filed Nov. 22, 2004, now U.S. Pat. No. 7,323,058, issued Jan. 29, 2008, which claims benefit of U.S. provisional patent application Ser. No. 60/539, 491, filed Jan. 26, 2004. This application is also a continuation-in-part of U.S. patent application Ser. No. 10/680,325, filed Oct. 6, 2003, now U.S. Pat. No. 7,223,308, issued on May 28, 2007. This application is a continuation-in-part of U.S. patent application Ser. No. 10/965,220, filed Oct. 14, 2004, now U.S. Pat. No. 7,341,633, issued Mar. 12, 2008, which claims benefit of U.S. provisional patent application Ser. No. 60/539,491, filed Jan. 26, 2004. This application is a continuation-in-part of U.S. patent application Ser. No. 11/043,442, filed Jan. 26, 2005, which claims benefit of U.S. provisional patent application Ser. No. 60/575,553, filed May 28, 2004. The disclosure of each of the aforementioned related patent applications is herein incorporated by reference.

BACKGROUND OF THE INVENTION

1. Field of the Invention

Embodiments of the invention generally relate to an electroless deposition system for semiconductor processing.

2. Description of the Related Art

Metallization of sub-100 nanometer sized features is a foundational technology for present and future generations of integrated circuit manufacturing processes. More particularly, in devices such as ultra large scale integration-type devices, i.e., devices having integrated circuits with several million logic gates, the multilevel interconnects that lie at the heart of these devices are generally formed by filling high aspect ratio, i.e., greater than about 25:1, interconnect features with a conductive material, such as copper. At these dimensions, conventional deposition techniques, such as chemical vapor deposition and physical vapor deposition, cannot be used to reliably fill interconnect features. As a result, plating techniques, i.e., electrochemical plating and electroless plating, have emerged as promising processes for void free filling of sub-100 nanometer sized high aspect ratio interconnect features in integrated circuit manufacturing processes. Additionally, electrochemical and electroless plating processes have also emerged as promising processes for depositing other layers, such as capping layers.

However, with regard to electroless plating processes, conventional electroless processing systems and methods have faced several challenges, such as accurately controlling the deposition process and the defect ratios in the resulting deposition layers. More particularly, conventional systems have suffered from poor substrate temperature control, as the resistive heaters and heat lamps used on conventional electroless cells have not consistently provided a uniform temperature across the surface of the substrate, which is critical to the uniformity of electroless deposition processes. Additionally, conventional electroless systems have not implemented control over the environment inside the electroless deposition chamber, which has recently been shown to have a substantial impact on defect ratios.

Also, due to environmental and cost-of-ownership (CoO) concerns it may desirable to reduce the waste of expensive electroless plating processing chemicals by reducing the required flow to get sufficient uniform coverage on the receiving surface of the substrate. Since the speed and uniformity with which the electroless processing solutions are delivered to the substrate surface can affect the deposition process results, an apparatus and method is needed to uniformly deliver the various processing solutions. It is also desirable to control the substrate temperature by use of conduction and convective heat transfer on the backside of the substrate when a liquid is in contact with, and flowing between, the substrate and a supporting base plate member.

Further, a functional and efficient integrated platform for electroless deposition processes capable of depositing uniform layers with minimal defects has not been developed. As such, there is a need for an integrated electroless deposition apparatus capable of depositing uniform layers having minimal defects.

SUMMARY OF THE INVENTION

Embodiments of the invention provide an electroless processing chamber adapted to process a substrate, comprising a platen assembly positioned in a processing region, the platen assembly comprising a base member having a fluid aperture formed therethrough; a fluid diffusion member sealably positioned to the base member and having an upstream side and a downstream side, wherein the fluid diffusion member has a plurality of fluid passages in fluid communication with the upstream side and the downstream side; a fluid volume formed between the base member and the upstream side of the fluid diffusion member; a feature protruding a first distance above the downstream side of the diffusion member; and a rotatable substrate support assembly positioned in a processing region and having a substrate supporting surface, wherein the rotatable substrate support is adapted to rotate relative to the platen assembly.

Embodiments of the invention also provide an electroless processing chamber adapted to process a substrate, comprising a platen assembly positioned in a processing region, the platen assembly comprising a base member having a fluid aperture formed therethrough; a fluid diffusion member sealably positioned to the base member and having a upstream side and a downstream side; a fluid volume formed between the base member and the upstream side of the fluid diffusion member; and a plurality of fluid passages formed in the fluid diffusion member, wherein the plurality of fluid passages are in fluid communication with the downstream side and the upstream side of the fluid diffusion member and at least one of the plurality of fluid passages further comprise a first feature that is in fluid communication with the upstream side and has a first cross-sectional area; and a second feature having a second cross-sectional area, wherein the first feature and the second feature are in fluid communication; and a rotatable substrate support assembly positioned in a processing region and having a substrate supporting surface, wherein the rotatable substrate support is adapted to rotate relative to the platen assembly.

Embodiments of the invention also provide an electroless processing chamber adapted to process a substrate, comprising a rotatable substrate support assembly positioned in a processing region of an electroless processing chamber and having one or more substrate supporting surfaces; an edge dam positioned in the processing region and having a first surface, wherein the edge dam and/or a substrate positioned on the one or more substrate supporting surfaces may be positioned to form a gap between the first surface and an edge of the substrate; and a fluid source that is adapted to deliver an electroless processing solution to a surface of a substrate positioned on the substrate support.

Embodiments of the invention also provide an electroless processing chamber adapted to process a substrate, comprising a rotatable substrate support assembly positioned in a processing region of an electroless processing chamber and having one or more radially spaced substrate supporting features that each have a substrate supporting surface; a bowl assembly positioned in the processing region and having one or more walls that form a fluid volume that is adapted to receive the one or more radially spaced substrate supporting features and a fluid positioned therein; a fluid source in fluid communication with the fluid volume and a substrate that is positioned on the one or more substrate supporting surfaces; and a fluid heater in thermal communication with the fluid positioned in the fluid volume.

Embodiments of the invention also provide an electroless processing chamber adapted to process a substrate, comprising a platen assembly positioned in a processing region, the platen assembly comprising a fluid diffusion member having an upstream side and a downstream side and a plurality of fluid passages in fluid communication between the upstream side and the downstream side; a first base member having a first fluid aperture formed therethrough, wherein the first base member is sealably positioned to the fluid diffusion member and the first fluid aperture is in fluid communication with at least one of the plurality of fluid passages formed in the fluid diffusion member; and a second base member having a second fluid aperture formed there through, wherein the second base member is sealably positioned to the fluid diffusion member and the second fluid aperture is in fluid communication with at least one of the plurality of fluid passages formed in the fluid diffusion member; and a rotatable substrate support assembly positioned in a processing region and having a substrate supporting surface, wherein the rotatable substrate support is adapted to rotate relative to the platen assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the inventions and are therefore not to be considered limiting of its scope, for the inventions may admit to other equally effective embodiments.

FIG. 5B is a cross-sectional view of an exemplary platen assembly positioned in the fluid processing station illustrated in FIG. 5A.

FIG. 8B is a vertical cross-sectional view of an exemplary edge dam positioned in the fluid processing station illustrated in FIG. 8A.

FIG. 8C is a cross-sectional view of another embodiment of an edge dam positioned in the fluid processing station illustrated in FIG. 8A.

FIG. 8D is a cross-sectional view of the exemplary edge dam illustrated in FIG. 8C in which the edge dam is in contact with the substrate.

DETAILED DESCRIPTION OF THE PREFERRED EMBODIMENT

Figure 1:
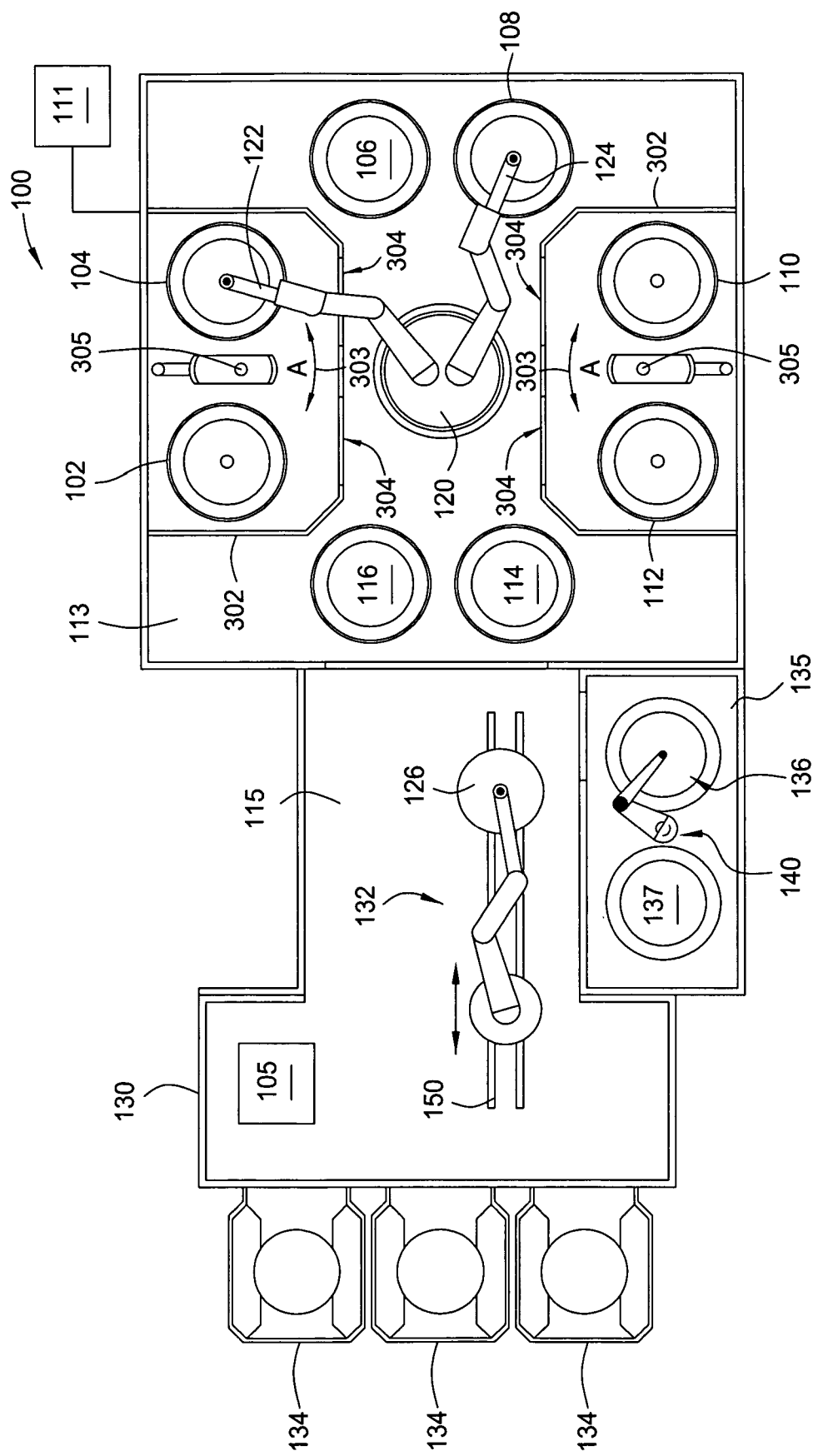
FIG. 1 is a plan view of an exemplary substrate processing system.

FIG. 1 illustrates an embodiment of a system 100. System 100 includes a factory interface 130 that includes a plurality of substrate loading stations 134 configured to interface with substrate containing cassettes. A factory interface robot 132 is positioned in the factory interface 130 and is configured to access and transfer substrates 126 into and out of the cassettes positioned on the substrate loading stations 134. The factory interface robot 132 also extends into a link tunnel 115 that connects the factory interface 130 to a mainframe 113. The position of factory interface robot 132 allows for access to substrate loading stations 134 to retrieve substrates therefrom, and to then deliver the substrates 126 to one of the processing cell locations 114, 116 positioned on the mainframe 113, or alternatively, to the anneal chamber 135. Similarly, factory interface robot 132 may be used to retrieve a substrate 126 from the processing cell locations 114, 116 or the anneal chamber 135 after a substrate processing sequence is complete. In this situation factory interface robot 132 may deliver the substrate 126 back to one of the cassettes positioned on the substrate loading stations 134 for removal from system 100.

The factory interface 130 may also include a metrology inspection station 105, which may be used to inspect substrates before and/or after processing in system 100. The metrology inspection station 105 may be used, for example, to analyze the characteristics, e.g., thickness, planarity, grain structure, topography, etc., of materials deposited on the substrate. Exemplary metrology inspection stations that may be used in embodiments of the invention include the BX-30 Advanced Interconnect Measurement System, and CD-SEM or DR-SEM inspection stations, all of which are commercially available from Applied Materials, Inc. of Santa Clara, Calif. An exemplary metrology inspection station is also illustrated in commonly assigned U.S. Patent Application Ser. No. 60/513,310, filed on Oct. 21, 2003, entitled "Plating System with Integrated Substrate Inspection", which is hereby incorporated by reference in its entirety to the extent not inconsistent with the present invention.

The anneal chamber 135 generally includes a two position anneal chamber, wherein a cooling plate 136 and a heating plate 137 are positioned adjacent each other with a substrate transfer robot 140 positioned proximate thereto, e.g., between the two stations. The substrate transfer robot 140 is generally configured to move substrates between the heating plate 137 and the cooling plate 136. System 100 may include a plurality of anneal chambers 135, wherein the anneal chambers 135 may be in a stacked configuration. Further, although the anneal chamber 135 is illustrated as being positioned such that it is accessed from the link tunnel 115, embodiments of the invention are not limited to any particular configuration or placement of the anneal chamber 135. As such, the anneal chamber 135 may be positioned in direct communication with the mainframe 113, i.e., accessed by mainframe robot 120, or alternatively, the anneal chamber 135 may be positioned in communication with the mainframe 113, i.e., the anneal chamber may be positioned on the same system as mainframe 113, but may not be in direct contact with the mainframe 113 or accessible from the mainframe robot 120. For example, as illustrated in FIG. 1, the anneal chamber 135 may be positioned in direct communication with the link tunnel 115, which allows for access to mainframe 113 via robots 132 and/or 120. Additional description of the anneal chamber 135 and the operation thereof may be found in commonly assigned U.S. Pat. No. 7,311,810, entitled "Two Position Anneal Chamber," issued on Dec. 25, 2007, which is hereby incorporated by reference in its entirety to the extent not inconsistent with the present invention.

Mainframe 113 includes a centrally positioned mainframe robot 120. Mainframe robot 120 generally includes one or more blades 122, 124 configured to support and transfer substrates. Additionally, mainframe robot 120 and the accompanying blades 122, 124 are generally configured to independently extend, rotate, pivot, and vertically move so that the mainframe robot 120 may simultaneously insert and remove substrates to/from the plurality of processing cell locations 102, 104, 106, 108, 110, 112, 114, 116 positioned on mainframe 113. Similarly, factory interface robot 132 also includes the ability to rotate, extend, pivot, and vertically move its substrate support blade, while also allowing for linear travel along the robot track 150 that extends from the factory interface 130 to the mainframe 113.

Generally, the processing cell locations 102, 104, 106, 108, 110, 112, 114, 116 may be any number of processing cells utilized in a substrate processing system. More particularly, the processing cells or locations may be configured as electrochemical plating cells, rinsing cells, bevel clean cells, spin rinse dry cells, substrate surface cleaning cells (which collectively includes cleaning, rinsing, and etching cells), electroless plating cells (which includes pre and post clean cells, activation cells, deposition cells, etc.), metrology inspection stations, and/or other processing cells that may be beneficially used in conjunction with a deposition processing system and/or platform.

Each of the respective processing cell locations 102, 104, 106, 108, 110, 112, 114, 116 and robots 132, 120 are generally in communication with a system controller 111, which may be a microprocessor-based control system configured to receive inputs from both a user and/or various sensors positioned on the system 100, and appropriately control the operation of system 100 in accordance with the inputs and/or a predetermined processing recipe. The controller 111 generally contains a memory device (not shown) and a CPU (not shown) which are utilized by the controller 111 to retain various programs, process the programs, and execute the programs when necessary. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 111 determines which tasks are performable in the processing chamber. Preferably, the program is software readable by the controller 111 and includes instructions to monitor and control the electroless process based on defined rules and input data.

Additionally, the processing cell locations 102, 104, 106, 108, 110, 112, 114, 116 are also in communication with a fluid delivery system, such as the fluid inlet system 1200 discussed below, which is configured to supply the necessary processing fluids to the respective processing cell locations during processing. Generally, the fluid delivery system(s) are controlled by the system controller 111. An exemplary processing fluid delivery system may be found in commonly assigned U.S. patent application Ser. No. 10/438,624, entitled "Multi-Chemistry Electrochemical Processing System," filed on May 14, 2003, which is hereby incorporated by reference in its entirety to the extent not inconsistent with the present invention.

In an exemplary system 100, as illustrated in FIG. 1, the processing cell locations 102, 104, 106, 108, 110, 112, 114, 116 may be configured as follows. Processing cell locations 114 and 116 may be configured as an interface between the wet processing stations on the mainframe 113 and the generally dry processing stations or regions in the link tunnel 115, anneal chamber 135, and the factory interface 130. The processing cell locations 114, 116 located at the interface may be spin rinse dry cells and/or substrate cleaning cells, for example. Each of the processing cell locations 114 and 116 may include a spin rinse dry cell and a substrate cleaning cell in a stacked configuration. Alternatively, processing cell location 114 may include a spin rinse dry cell, while processing cell location 116 may include a substrate cleaning cell. In yet another embodiment, each of the cell locations 114, 116 may include a combination spin rinse dry cell and substrate cleaning cell. A detailed description of an exemplary spin rinse dry cell that may be used in embodiments of the invention may be found in commonly assigned U.S. patent application Ser. No. 10/680,616, entitled "Spin Rinse Dry Cell," filed on Oct. 6, 2003, which is hereby incorporated by reference in its entirety to the extent not inconsistent with the present invention.

Processing cell locations 106, 108 may be configured as substrate cleaning cells, and more particularly, processing cell locations 106, 108 may be configured as substrate bevel cleaning cells, i.e., cells configured to remove excess deposition from the perimeter, and optionally, the backside of a substrate after a deposition process has been completed. An exemplary bevel cleaning cell is described in commonly assigned U.S. patent application Ser. No. 10/826,492, entitled "Integrated Bevel Clean Chamber," filed on Apr. 16, 2004, which is hereby incorporated by reference in its entirety to the extent not inconsistent with the present invention. Embodiments of the invention further contemplate that processing cell locations 106, 108 may be omitted from system 100, if desired. Additionally, processing cell locations 106, 108 may be configured as electroless processing cells or cell pairs, as will be further discussed herein.

Processing cell locations 102, 104 and 110, 112 may be configured as electroless processing cells. The electroless processing cell locations 102, 104, 110, 112 may be positioned on the mainframe 113 within processing enclosures 302 in a configuration where two processing cells are positioned in each processing enclosure 302, i.e., processing cell locations 110 and 112 may operate as first and second processing cells in a first processing enclosure 302, and processing cell locations 102 and 104 may operate as third and fourth processing cells in a second processing enclosure 302. Additionally, as noted above, embodiments of the invention contemplate that processing cell locations 106 and 108 may have a processing enclosure 302 positioned over the processing cell locations 106, 108, and these processing cell locations 106, 108 may be configured to operate in similar fashion to processing cell locations 102, 104, 110, 112, if desired.

The electroless processing cells positioned in the processing enclosures 302 may include plating or plating support cells, e.g., electrochemical plating cells, electroless plating cells, electroless activation cells, and/or substrate rinse or clean cells. In the exemplary electroless system 100, one fluid processing cell in each pair of cells on system 100 will be an activation cell and the other processing cell of the pair will be an electroless deposition cell. This configuration will generally be duplicated on the opposing side of the system 100 in the opposing processing enclosure 302. For example, although the invention is not limited to any particular configuration, processing cell location 102 may be configured as an electroless activation cell, while processing cell location 104 is configured as an electroless deposition cell. Similarly, processing cell location 112 may be configured as an electroless activation cell, while processing cell location 110 is configured as an electroless deposition cell. The processing cells in the respective processing enclosures 302 generally operate independently from each other under the control of system controller 111.

Figure 2:
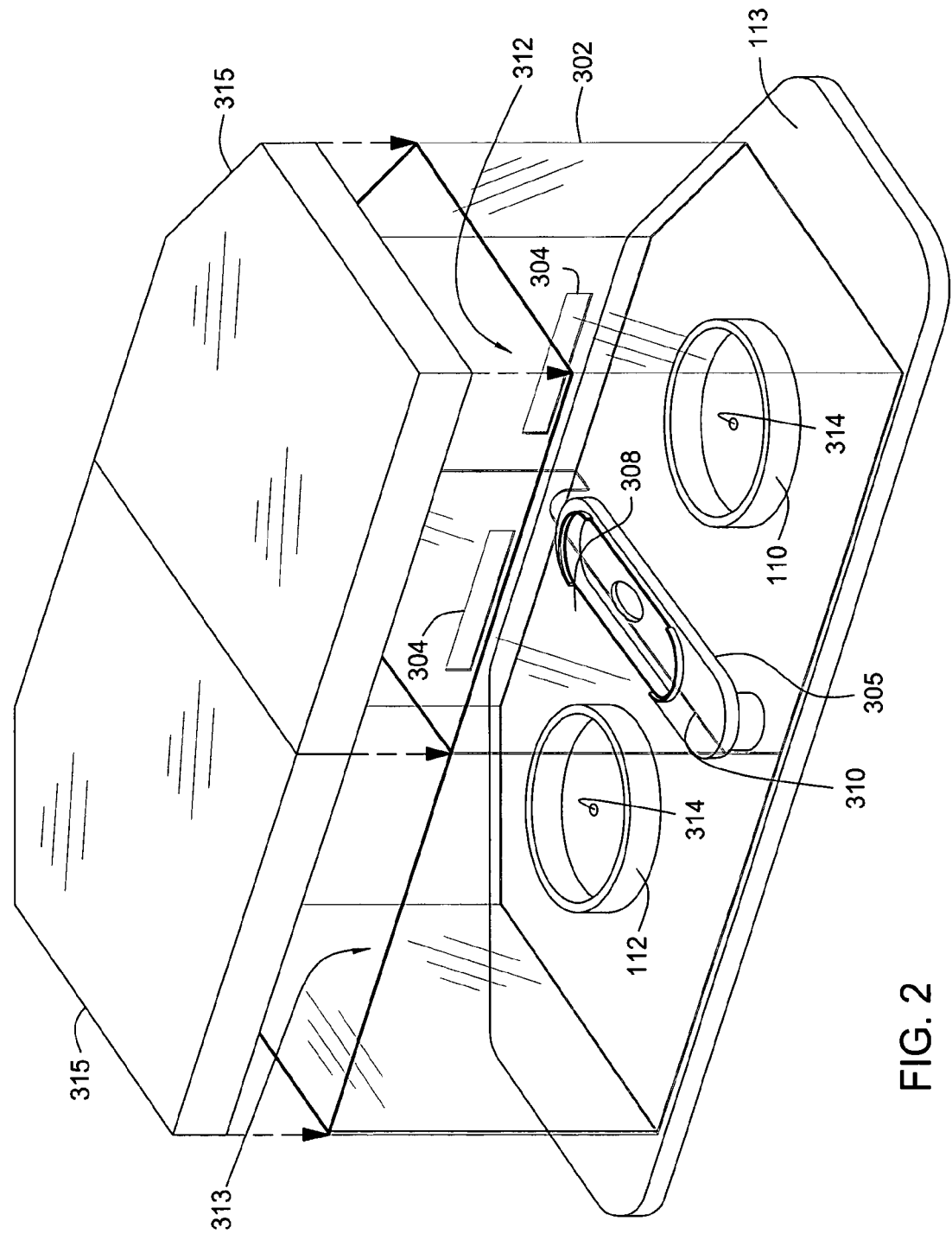
FIG. 2 is a perspective view of an exemplary electroless deposition system and enclosure included in the substrate processing system.

FIG. 2 is a perspective view of an exemplary electroless deposition system 100 and enclosure 302, which is shown for example in processing cell locations 110, 112. The hardware of the processing cell locations 110, 112 has been omitted from FIG. 2 for clarity. A processing enclosure 302 defines a controlled processing environment around the pair of processing cell locations 110, 112. The processing enclosure 302 may include a central interior wall 308 that generally bisects the processing volume into two substantially equally sized processing volumes 312, 313. Although the central interior wall 308 is optional, when it is implemented, the central interior wall 308 generally creates a first processing volume 312 above processing cell location 110 and a second processing volume 313 above processing cell location 112. The first and second processing volumes 312, 313 are substantially isolated from each other by the central interior wall 308; however, a lower portion of the central interior wall 308 includes a notch or slot 310 formed therein. The slot 310 is sized to accommodate a substrate transfer shuttle 305 that is positioned between processing cell locations 110, 112. The substrate transfer shuttle 305 is generally configured to transfer substrates between the respective processing cells (110⇆112) without requiring the use of the mainframe robot 120. Substrate transfer shuttle 305 may be a vacuum chuck-type substrate support member that is configured to pivot about a point such that a distal substrate supporting end of the substrate transfer shuttle 305 moves in the direction of arrow 303 (shown in FIG. 1) to transfer substrates between the respective processing cell locations 110, 112. Each of the respective processing volumes 312, 313 also may include an access port 304 that is sealable and configured to allow a robot, such as mainframe robot 120 to access the respective processing volumes 312, 313 to insert and remove substrates therefrom.

Each of the respective processing volumes 312, 313 also includes an environmental control assembly 315 (shown in FIG. 2 removed from contact with the processing enclosure for clarity) positioned on an upper portion of the respective processing volumes 312, 313. The environmental control assembly 315 includes a processing gas source (not shown) that is in fluid communication with the process volumes 312, 313 and is configured to provide a processing gas to the respective processing volumes 312, 313. The processing gas source is generally configured to provide a controlled flow of an inert gas, such as nitrogen, helium, hydrogen, argon, and/or mixtures of these or other gases commonly used in semiconductor processing, to the respective processing volumes 312, 313. The environmental control assembly 315 further includes a particle filtration system, such as a high efficiency particulate air (HEPA) type filtration system. The particle filtration system is used to remove particulate contaminants from the gas flow entering the processing volumes 312, 313. The particle filtration system is also used to generate a generally linear and equal flow of the processing gas toward processing cell locations below. The environmental control assembly 315 may further include devices configured to control humidity, temperature, pressure, etc. in the respective processing volumes 312, 313. The system controller 111 may be used to regulate the operation of the environmental control assembly and exhaust port 314, along with other components of the system 100, to control the oxygen content within the processing volumes 312, 313 in accordance with either a processing recipe or inputs received from sensors or detectors (not shown) positioned in the processing volumes 312, 313.

In operation, the processing gas is generally provided to the processing volumes 312, 313 by the environmental control assembly 315. The introduction of the processing gas into the respective processing volumes 312, 313 operates to fill the interior of the enclosed processing environment with an inert gas, thus purging the interior of processing volumes 312, 313 of gases, such as oxygen for example, that may degrade the electroless plating process. Generally, the processing gas source introduces the processing gas into the processing volumes 312, 313 near the top or upper portion of the processing volumes 312, 313 above the processing cell locations 110, 112 and near the center of the respective processing volumes 312, 313. The processing gas is generally introduced into the processing volumes 312, 313 through a HEPA-type filtration system configured to minimize airborne particles and equalize both the flow rate and direction of the processing gas such that the gas is flowing uniformly and at a continuous flow rate toward the processing cell locations 110, 112.

Each of the processing cell locations 110, 112 also includes at least one exhaust port 314 (or multiple radially positioned exhaust ports 314 if desired) positioned to facilitate uniform flow of the processing gas from the gas supply in the environmental control assembly 315 toward the processing cell locations 110, 112. The exhaust port 314 may be positioned below the substrate being processed at the respective processing cell locations 110, 112, or alternatively, the exhaust port 314 may be positioned radially outward from the respective processing cell locations 110, 112. Regardless of positioning, the exhaust port 314 is configured to facilitate uniform flow of the processing gas while optionally evacuating fluid and chemical vapors from the respective processing cell locations 110, 112.

A typical process for supplying the inert gas to the processing volumes 312, 313 includes supplying the inert gas at a flow rate of between about 10 slm and about 300 slm, or more particularly, between about 12 slm and about 80 slm. In general, the flow rate should be sufficient to minimize the amount of undesirable gasses generated, residing or leaking into the processing volumes. The flow rate of the inert gas may be reduced when the respective processing volumes 312, 313 are closed, i.e., when the access ports 304 are closed. When the access ports 304 are open, i.e., when substrates are being transferred into or out of the processing enclosure 302, the processing gas flow rate is increased to create an outflow of gas from the processing enclosure 302. This outflow of gas is configured to prevent ambient gases, and in particular oxygen, from entering into the interior of the processing enclosure. Once the access ports 304 are closed, the processing gas flow rate may be decreased to a flow rate that accommodates substrate processing. This flow rate may be maintained for a period of time prior to initiating substrate processing, so that any incoming oxygen may be removed from the processing volumes 312, 313 prior to initiating a processing sequence. The exhaust port 314 works cooperatively with the processing gas supply to remove oxygen from the processing volumes 312, 313. The exhaust port 314 is generally in communication with a standard fabrication facility exhaust system and is used to remove processing gases from the processing volumes 312, 313. In alternative embodiments of the invention, the processing volumes 312, 313 may include a vacuum pump positioned in fluid communication with the processing volumes 312, 313. The vacuum pump may be used to further reduce the presence of unwanted gases in the processing volumes 312, 313. Regardless of the exhaust or pump configurations, the environmental control assemblies 315 are generally configured to maintain the oxygen content in the interior of the processing volumes 312, 313 below about 500 ppm during substrate processing, and more particularly, below about 100 ppm during substrate processing.

The combination of the environmental control assembly 315, the exhaust port 314, and the system controller 111 also allows system 100 to control the oxygen content of the processing volumes 312, 313 during specific processing steps, wherein one processing step may require a first oxygen content for optimal results and a second processing step may require a second oxygen content for optimal results, where the first and second oxygen contents are different from each other. In addition to the oxygen content, system controller 111 may be configured to control other parameters of the processing enclosure, such as temperature, humidity, pressure, etc. as desired for a particular processing sequence. These specific parameters may be modified by heaters, chillers, humidifiers, dehumidifiers, vacuum pumps, gas sources, air filters, fans, etc., all of which may be included in the environmental control assembly 315 and positioned in fluid communication with the processing volumes 312, 313 and controlled by the system controller 111.

The processing volumes 312, 313 are generally sized to facilitate electroless plating processes, i.e., processing volumes 312, 313 are sized such that the gas supply of the environmental control assembly 315 can maintain a low oxygen content (generally less than about 500 ppm, or more particularly, less than about 100 ppm) during a processing step, while also allowing for sufficient volume to support evaporation of fluid solutions in the volume without vapor saturation of the processing volumes 312, 313. In terms of volume of head space generally required to prevent vapor saturation, the inventors have found that the head space for each processing location 110, 112 will generally be between about 1000 $in^3$ and about 5000 $in^3$ for a 300 mm substrate processing location. As such, the head space for the processing volumes 312, 313 of the invention when configured for 300 mm substrate processing will generally be between about 1500 $in^3$ and about 5000 $in^3$, or between about 2000 $in^3$ and about 4000 $in^3$, or between about 2000 $in^3$ and about 3000 $in^3$, for example. As such, the vertical distance from the upper surface of the substrate positioned in one of the processing cell locations 110, 112 to the top of the processing volume 312, 313 across the area of the processing location (this volume is generally referred to as the head space) is generally between about 6 inches and about 40 inches high and has the diameter or cross section of the processing location 110, 112. More particularly, the head space may be between about 12 inches and about 36 inches in height, and the horizontal dimension of the processing volumes 312, 313 generally approximates the perimeter of the respective processing cell locations 110, 112, which are generally sized to be between about 10% and about 50% larger than the diameter of the substrates being processed in the respective processing cell locations 110, 112. These dimensions are important to the operation of the apparatus of the invention, as it has been shown that smaller processing volumes are prone to vapor saturation, which has a negative impact on electroless plating processes. As such, the inventors have determined that adequate head space (the cross sectional area of the processing location over the distance from the substrate to the top of the enclosure) is important to prevent vapor saturation and defects that may be associated therewith.

While the processing volumes 312, 313 are generally isolated from each other, the slot 310 allows for gases in one processing volume to pass into the adjacent processing volume. As such, embodiments of the invention provide for a higher pressure in one processing volume than in the adjacent processing volume. This pressure differential allows for control over the cross talk between the respective processing volumes 312, 313, as the gas flow between the processing volumes will be in the same direction and at the same rate if the pressure differential is maintained. Accordingly, one of the processing cells can be configured as a cool processing cell, such as an activation cell, and the other processing cell can be configured as a heated processing cell, such as an electroless deposition cell. In this embodiment, the heated processing cell is pressurized to a higher pressure, and as such, the heated fluid processing cell is always flowing gases through the slot 310 into the cooler fluid processing cell. This configuration prevents the cooler processing cell from reducing the temperature of the heated processing cell, as the heated processing cell, i.e., the electroless deposition cell, is generally more susceptible to defects as a result of temperature variation than cooled fluid processing cell, i.e., the activation cell.

In another embodiment, the respective processing volumes 312, 313 may be completely isolated from each other by the central interior wall 308, i.e., substrate transfer shuttle 305 and slot 310 are removed. In this embodiment, the mainframe robot 120 may be used to service or access each of the isolated processing volumes 312, 313 individually via the respective access ports 304 and may operate to transfer substrates between the respective processing volumes 312, 313.

Figure 3:
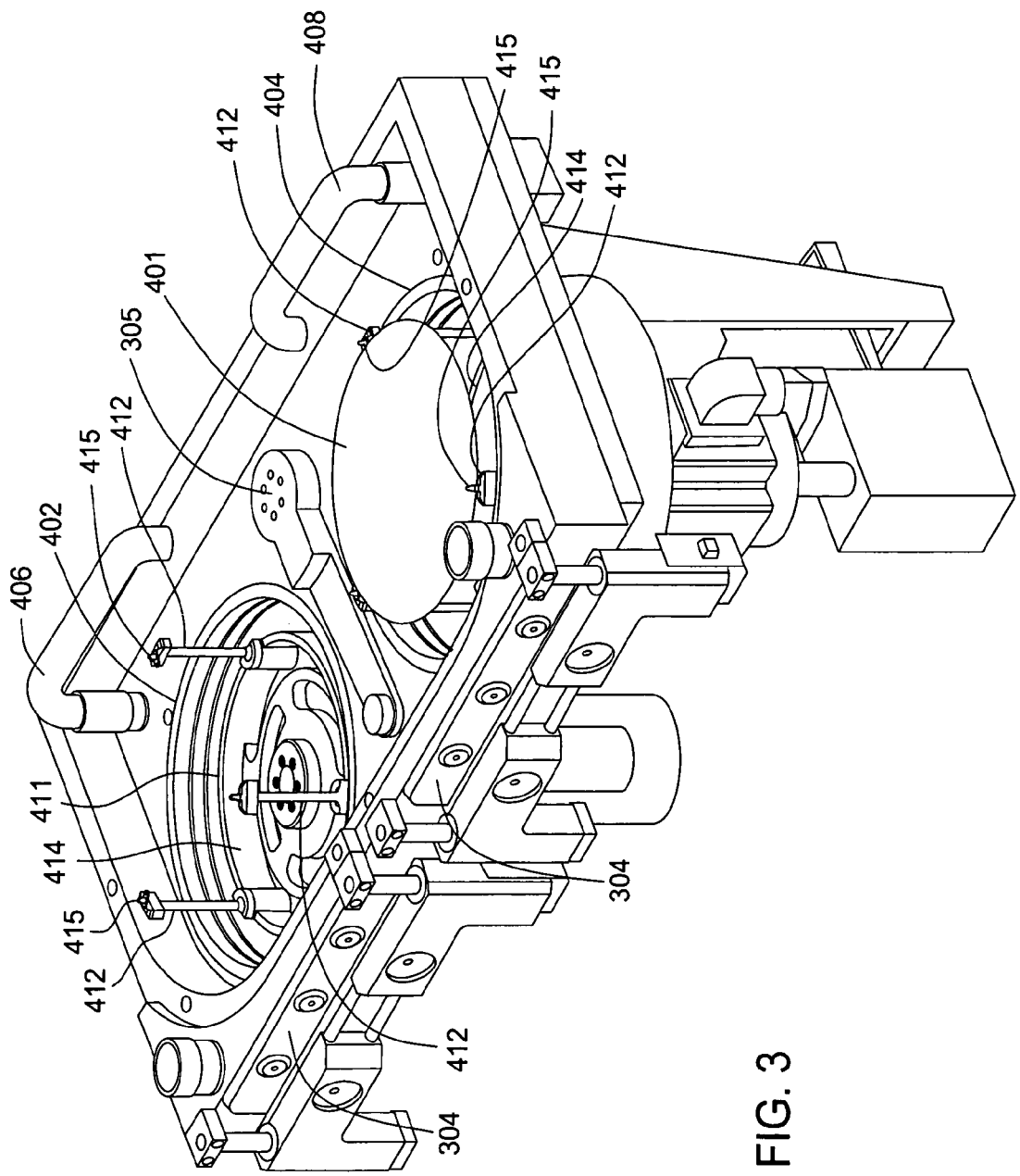
FIG. 3 is a perspective view of an exemplary electroless deposition system with the enclosure removed.

FIG. 3 is a perspective view of an exemplary deposition station 400 with the processing enclosure 302 removed therefrom. The deposition station 400 generally represents an embodiment of the processing cells illustrated in FIGS. 1 and 2. The processing cells illustrated in deposition station 400 may be an electroless activation station 402 and an electroless deposition station 404. The substrate transfer shuttle 305 is positioned between stations 402, 404 and is configured to transfer substrates between the respective stations 402, 404. Each of stations 402, 404 includes a rotatable substrate support assembly 414 that is configured to support a substrate 401 for processing in the respective station in a face up orientation, i.e., the processing surface of the substrate 401 is facing away from the substrate support assembly 414. In FIG. 3, station 402 does not have a substrate 401 illustrated on the substrate support assembly 414, while station 404 has a substrate 401 supported on the substrate support assembly 414 to show the respective stations in both a loaded and empty states. Generally, the hardware configuration of the respective stations 402, 404 will be the same; however, embodiments of the invention are not limited to configurations where the stations 402, 404 have identical hardware therein. For example, the inventors contemplate that the deposition station 404 may have a platen assembly 403, which is further described herein, while the electroless activation station 402 may be configured without the platen assembly 403.

Figure 4:
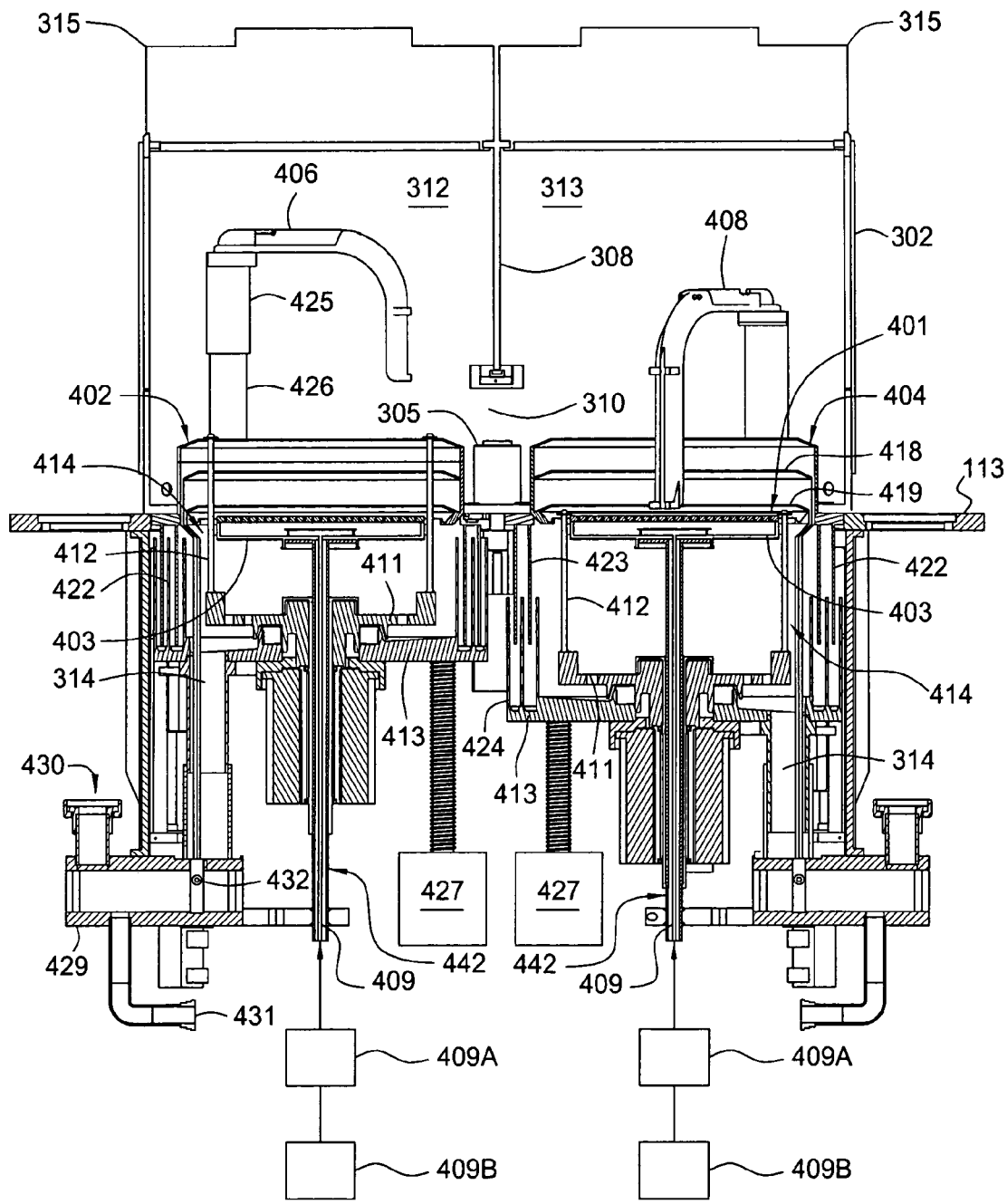
FIG. 4 is vertical a cross-sectional view of an exemplary electroless deposition system and enclosure.

The substrate support assembly 414, which is also shown in the sectional view of FIG. 4, includes a ring 411 having a plurality of vertically extending substrate support fingers 412 extending therefrom. The substrate support fingers 412 generally include an upper horizontal surface configured to support an edge or bevel of a substrate 401, as generally illustrated at processing location 404 in FIG. 3 and in the sectional view of FIG. 4. The substrate support fingers 412 may further include a vertical post member 415 positioned to center the substrate 401 on the respective support fingers 412. The substrate support assembly 414 further includes a lift assembly 413, which is illustrated and further described herein with respect to FIG. 4, that is configured to vertically actuate ring 411, and thus support fingers 412, to load and unload substrates 401 from the respective stations 402, 404.

Figure 9:
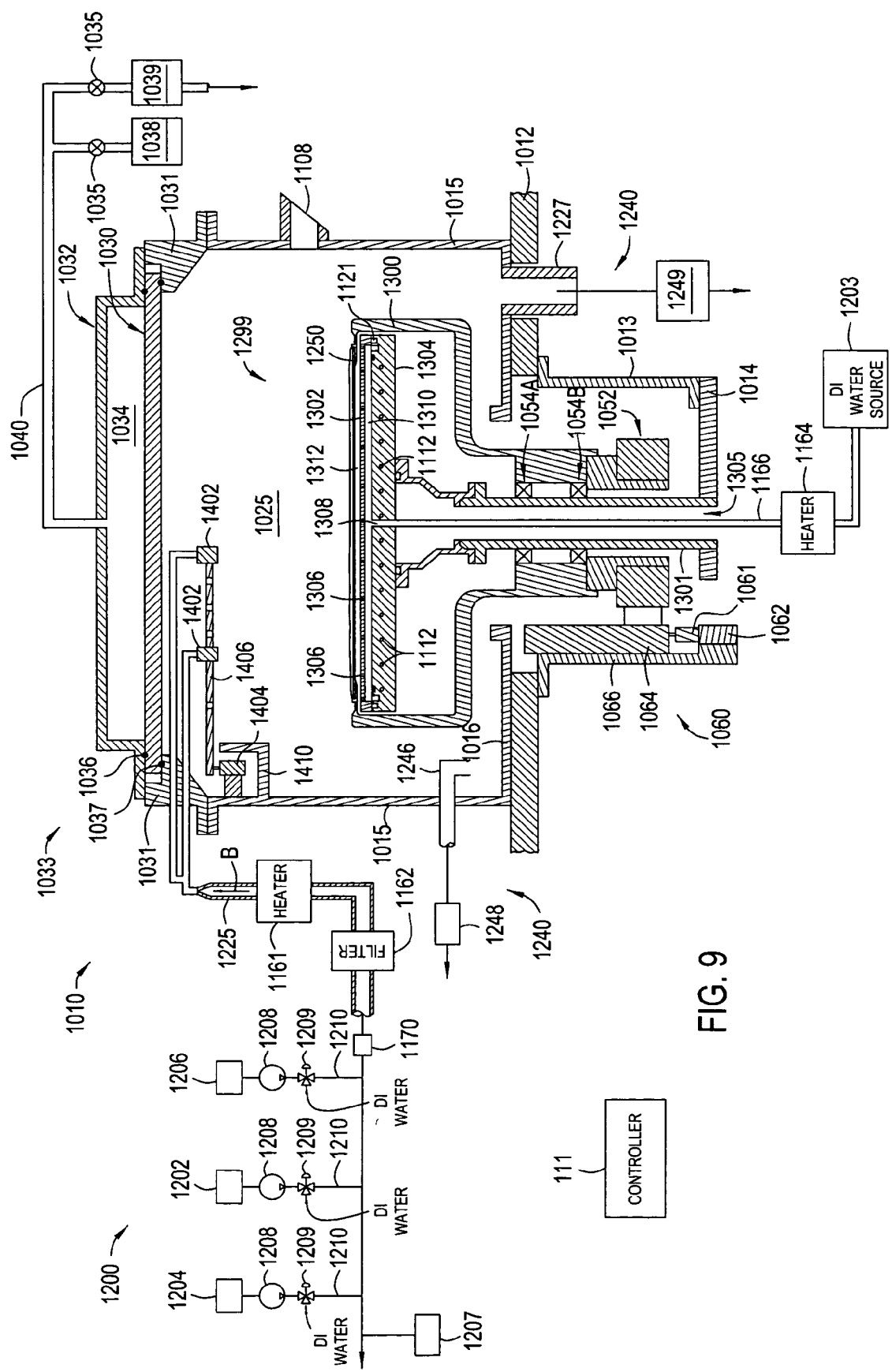
FIG. 9 is a vertical cross-sectional view of a face-up, electroless processing chamber that utilizes nozzles disposed on a fluid delivery arm within the chamber.
Figure 9A:
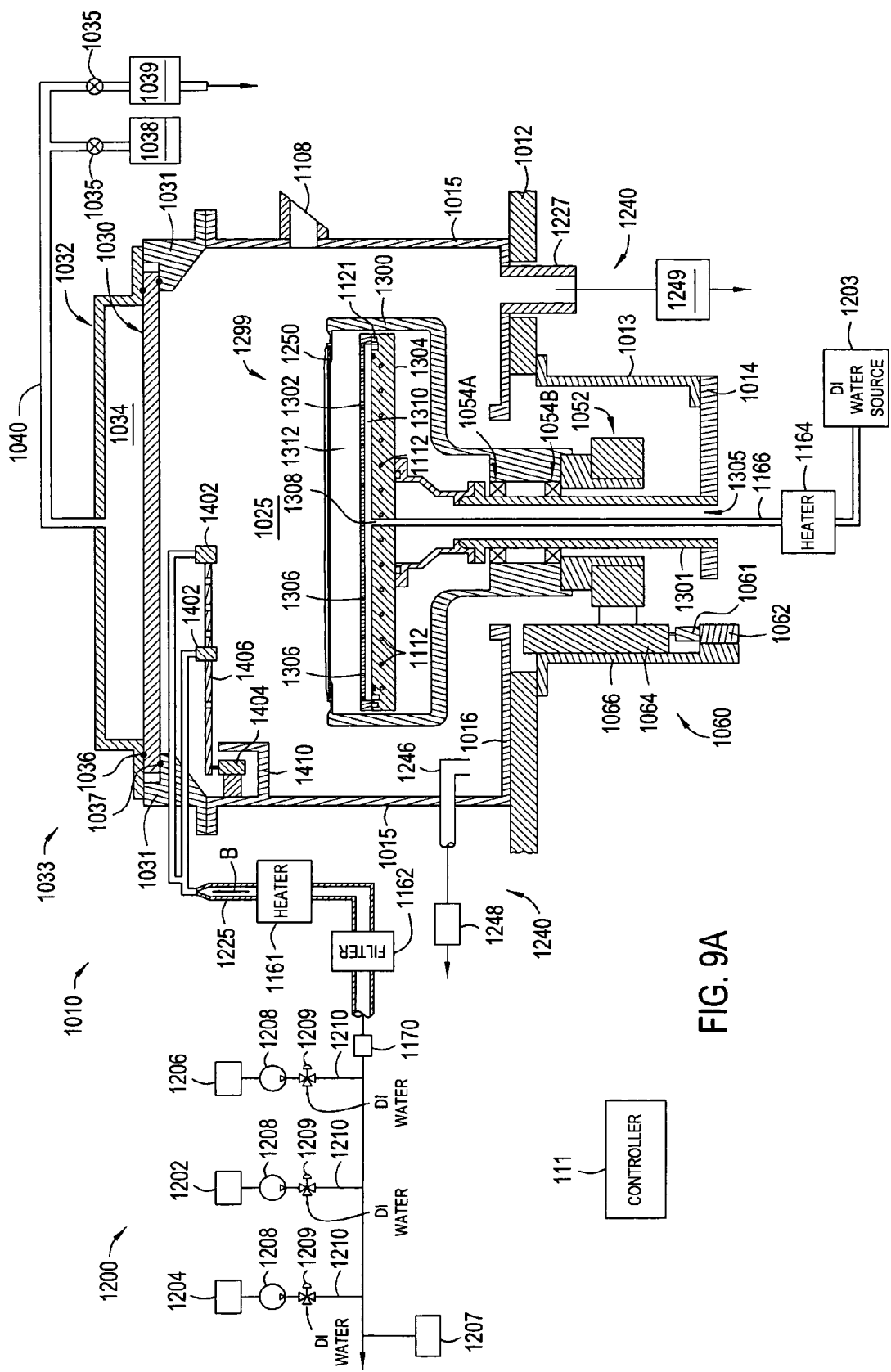
FIG. 9A is a vertical cross-sectional view of the electroless processing chamber shown in FIG. 9, with the substrate support assembly in its raised position.
Figure 9B:
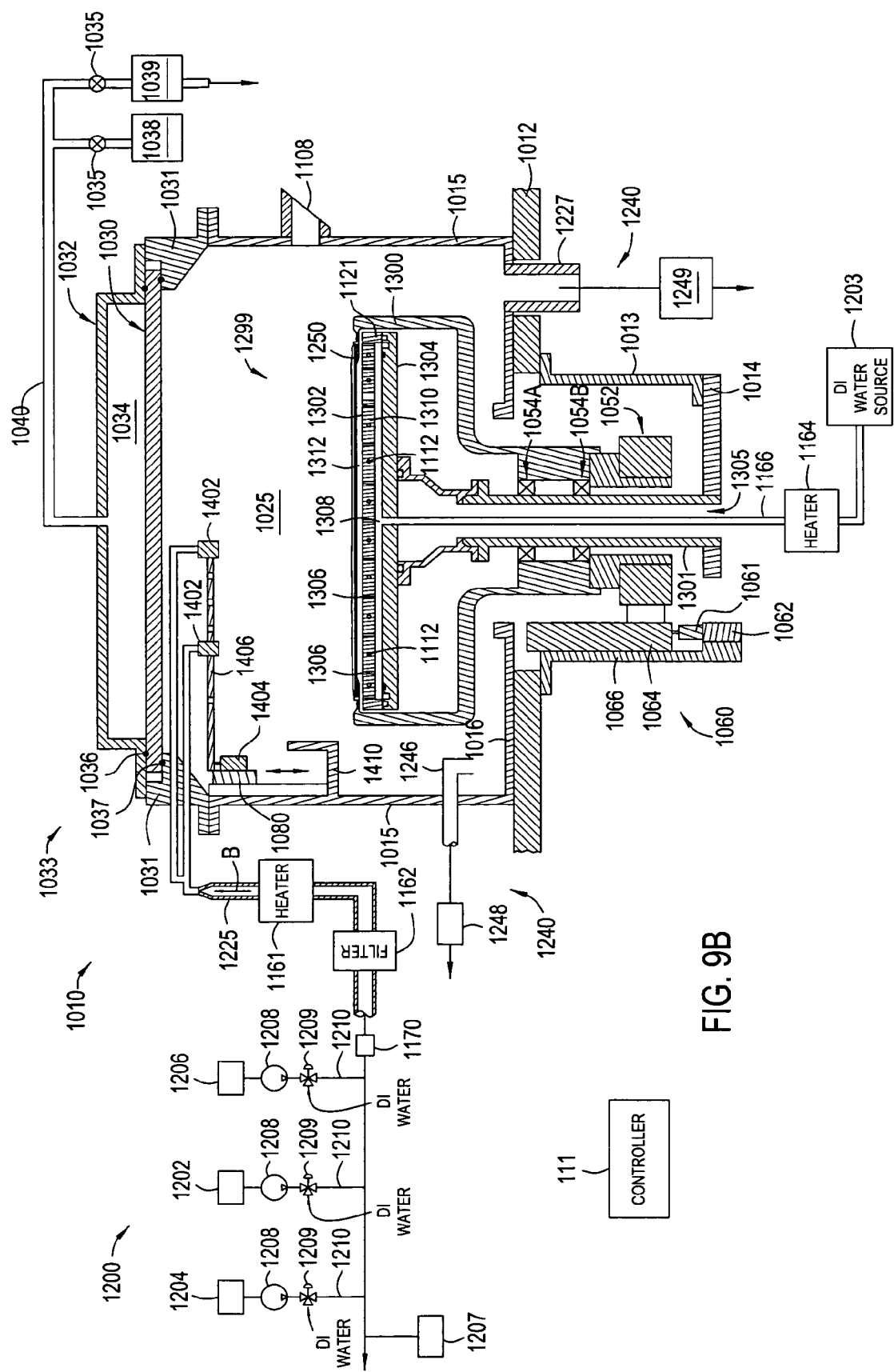
FIG. 9B is a vertical cross-sectional view of an alternate embodiment of the electroless processing chamber of FIG. 9.

The respective stations 402, 404 each include a dispense arm 406, 408 that is configured to pivot over the substrate 401 during processing to dispense a processing fluid onto the front side or production surface of the substrate 401. The fluid dispense arms 406, 408 may also be configured to be positioned vertically with respect to the substrate, i.e., the fluid dispensing portion of the dispense arms 406, 408 may be positioned between about 0.5 mm and about 30 mm, or more particularly, between about 5 mm and about 15 mm, or between about 4 mm and about 10 mm from the surface of the substrate 401 being processed. The vertical and/or angular position of the fluid dispensing portion of the dispense arms 406, 408 may be adjusted during processing of a substrate if desired. The dispense arms 406, 408 may include more than one fluid conduit therein, and as such, the dispense arms 406, 408 may be configured to dispense multiple processing fluids therefrom onto the substrate 401. In one embodiment, one or more fluid inlet systems 1200, discussed below in conjunction with FIGS. 9 and 9A-B, are connected to the dispense arm 406 and/or 408 to deliver a processing fluid to the substrate 401 surface.

Exemplary solutions that may be dispensed by either dispense arm 406 or arm 408 include rinsing solutions, cleaning solutions, activating solutions, electroless plating solutions, and other fluid solutions that may be necessary to support an electroless deposition process. Additionally, the fluid conduits (not shown) in the respective dispense arms 406, 408 may be heated/cooled to control the temperature of the fluids dispensed therefrom. Heating/cooling in the arm conduits provides advantages, namely, that the fluid does not have time to cool before being dispensed onto the substrate. This configuration, therefore, operates to improve electroless deposition uniformity, which is dependent upon temperature. Further, the terminating end of the fluid dispense arms 406, 408, i.e., the location where the processing fluid is dispensed, is movably positioned in embodiments of the invention. As such, the spacing between the fluid dispensing portion of the dispense arms 406, 408 and the substrate surface may be adjusted. This spacing operates to minimize splashing of the processing solutions and allows for control over the positioning of the fluid dispensing operations onto the production surface of the substrate.

FIG. 4 is a sectional view of an exemplary pair of processing stations 402, 404. The sectional view of FIG. 4 also shows the processing enclosure 302 that defines the first and second processing volumes 312, 313 that are divided by the central interior wall 308, as described above with respect to FIG. 2. Each of the processing stations 402, 404 includes a substrate processing platen assembly 403 that forms a substantially horizontal upper surface configured to be positioned immediately below a substrate during processing. The platen assembly 403, which is also illustrated in the detailed sectional view of FIG. 5A, collectively includes a fluid diffusion member 405 positioned over a base plate member 417 such that the fluid diffusion member 405 and the base plate member 417 form a fluid volume 410 there between.

Figure 5A:
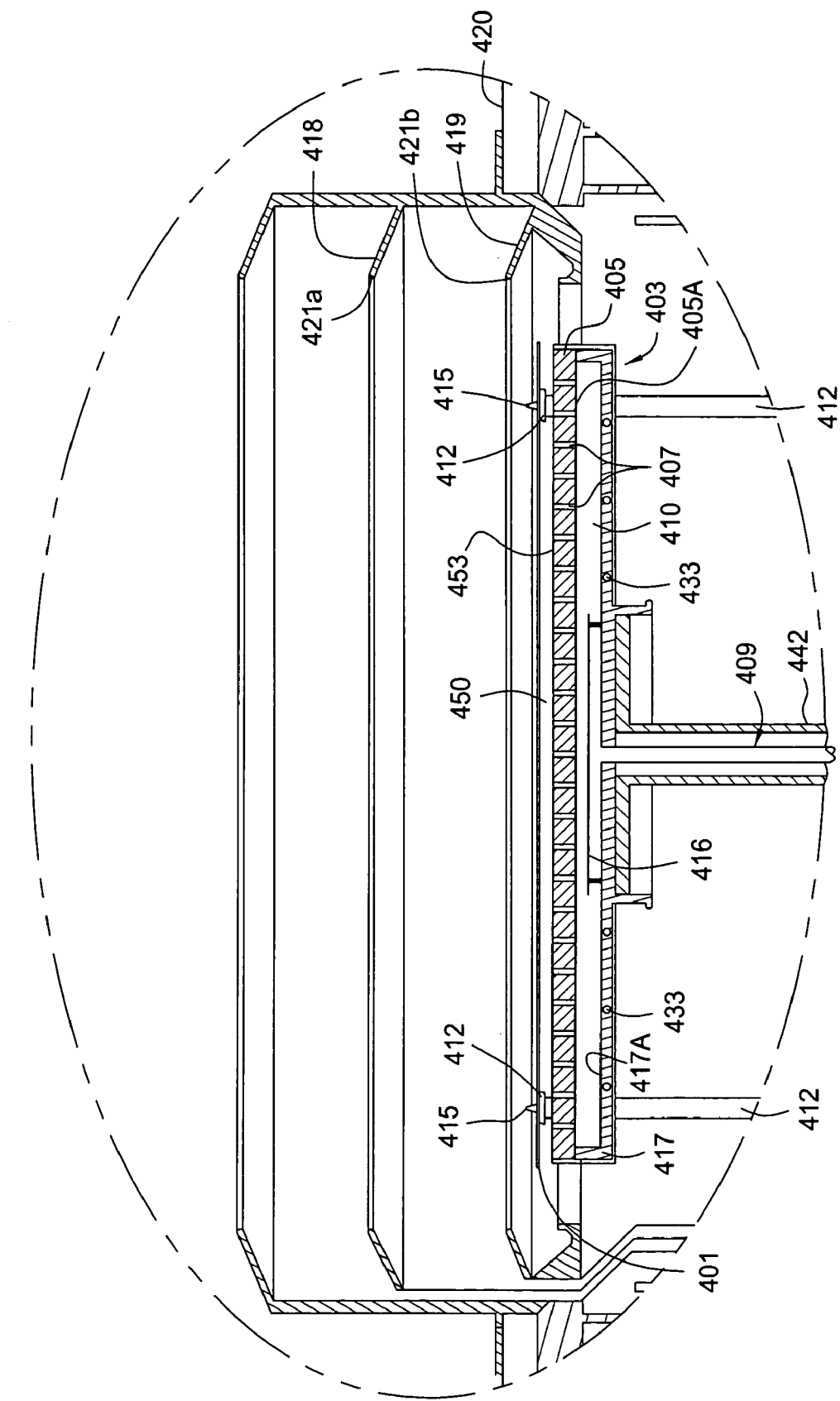
FIG. 5A is a vertical cross-sectional view of an exemplary fluid processing station.

Referring to FIGS. 4 and 5A, a fluid supply conduit 409 is positioned to be in fluid communication with the fluid volume 410 and the fluid diffusion member 405. In one aspect, a fluid source 409B, such as a deionized (DI) water source or inert gas source, is adapted to deliver a fluid through the fluid supply conduit 409 and into the fluid volume 410. In another aspect, the fluid delivered from the fluid source 409B may be heated by passing the fluid through a fluid heater 409A before it enters the fluid volume 410. The fluid heater 409A is used to control the temperature of the fluid delivered to the fluid volume 410. The fluid heater 409A may be any type of device that imparts energy into the temperature controlled fluid. Preferably the heater is a jacketed type resistive heater (e.g., heater heats the fluid through the wall of the inlet tubing) rather than an immersion type heater (e.g., heater element touches the solution). The fluid heater 409A, used in conjunction with a controller 111 and temperature probe (not shown), can be utilized to assure that the temperature of the fluid entering the fluid volume 410 is at the desired temperature.

In one aspect, an optional fluid flow baffle 416 is attached to the base plate member 417 and is positioned in the fluid volume 410 between the terminating end of the fluid supply conduit 409 and a lower surface of the fluid diffusion member 405. The fluid baffle 416 is adapted to allow temperature controlled fluid delivered from the fluid source 409B and fluid heater 409A to be uniformly delivered to the fluid diffusion member 405.

The base plate member 417 and fluid diffusion member 405 may be manufactured from a ceramic material (such as fully pressed aluminum nitride, alumina $Al_2O_3$, silicon carbide (SiC)), a polymer coated metal (such as Teflon™ polymer coated aluminum or stainless steel), a polymer material, or other material suitable for semiconductor fluid processing. Preferred polymer coatings or polymer materials are fluorinated polymers such as Tefzel (ETFE), Halar (ECTFE), perfluoroalkoxy resin (PFA), PolyTetraFluoroEthylene (PTFE), TetraFluorEthylene-Perfluorpropylene (FEP), polyvinylidenefluoride (PVDF), etc. A more detailed description of the configuration, components, and operation of the fluid processing cell 500 of the invention may be found in commonly assigned U.S. Pat. No. 7,223,308, issued on May 29, 2007, entitled "Apparatus to Improve Wafer Temperature Uniformity for Face-up Wet Processing", which is hereby incorporated by reference in its entirety to the extent not inconsistent with the present invention.

Referring to FIG. 5A, in operation, a substrate 401 is secured by the support fingers 412 and is vertically positioned just above the fluid diffusion member 405. The space 450 between the fluid diffusion member 405 and the substrate 401 is filled with the temperature controlled fluid delivered from the fluid source 409B and fluid heater 409A and is dispensed through the fluid supply conduit 409 and fluid diffusion member 405. The temperature controlled fluid contacts the backside of the substrate 401 and transfers heat thereto to heat the substrate. In this embodiment, the substrate is generally positioned in parallel relationship to the upper surface of the fluid diffusion member 405 and between about 0.1 mm and about 15 mm away from the upper surface of the fluid diffusion member 405, and more particularly between about 0.5 mm and about 2 mm away from the upper surface of the fluid diffusion member 405. In one aspect, the substrate 401 is rotated relative to the diffusion member 405 and the temperature controlled fluid flowing therefrom, by use of a support motor 443 (FIG. 4) attached to the substrate support assembly 414. The rotation of the substrate 401 relative to the fluid diffusion member 405 and the temperature controlled fluid can be advantageous to improve the heat transfer between the temperature controlled fluid and the substrate 401.

In another embodiment, the interior of the platen assembly 403 may include a heater 433, which may be a resistive-type heater, that is configured to increase the temperature of the platen assembly 403 to transfer heat to the substrate 401 being processed. In one aspect, a fluid supply 409B and fluid heater 409A may be configured to deliver the temperature controlled fluid passing through the fluid supply conduit 409 prior to the fluid contacting the substrate 401 positioned on the support fingers 412. In this configuration the heaters (e.g., elements 433 and 409A) may be in communication with the system controller 111, such that the system controller 111 may regulate the operation of the respective heaters to control the temperature of the temperature controlled fluid and the substrate being processed.

The fluid diffusion member 405 includes a plurality of holes 407 formed therethrough that connect an downstream side, or top surface 453, of the fluid diffusion member 405 to a lower surface, or upstream side 405A, of the fluid diffusion member 405. A perimeter portion of the fluid diffusion member 405 is generally in sealed communication with the base plate member 417, and as such, fluid may be introduced into the fluid volume 410 by fluid supply conduit 409 and caused to uniformity flow through the holes 407 formed in the fluid diffusion member 405 as a result of the fluid backpressure pressure generated in the sealed fluid volume 410 due to the fluid introduction. The fluid volume 410 is thus enclosed by the upstream side 405A of the fluid diffusion member 405 and the internal surface 417A of the base plate member 417.

In one embodiment, the fluid diffusion member 405 may include between about 10 and about 200 holes 407 that generally have a diameter of between about 0.5 mm and about 15 mm, or more particularly, a diameter of between about 0.7 mm and about 3 mm. The holes 407 may be positioned vertically, or alternatively, at an angle with respect to the top surface 453 of the fluid diffusion member 405. The holes 407 may be positioned at an angle of between about 5° and about 45° from vertical to facilitate an outward fluid flow pattern across the surface of the fluid diffusion member 405. Further, the angled holes 407 may be configured to reduce fluid turbulence.

Figure 5C:
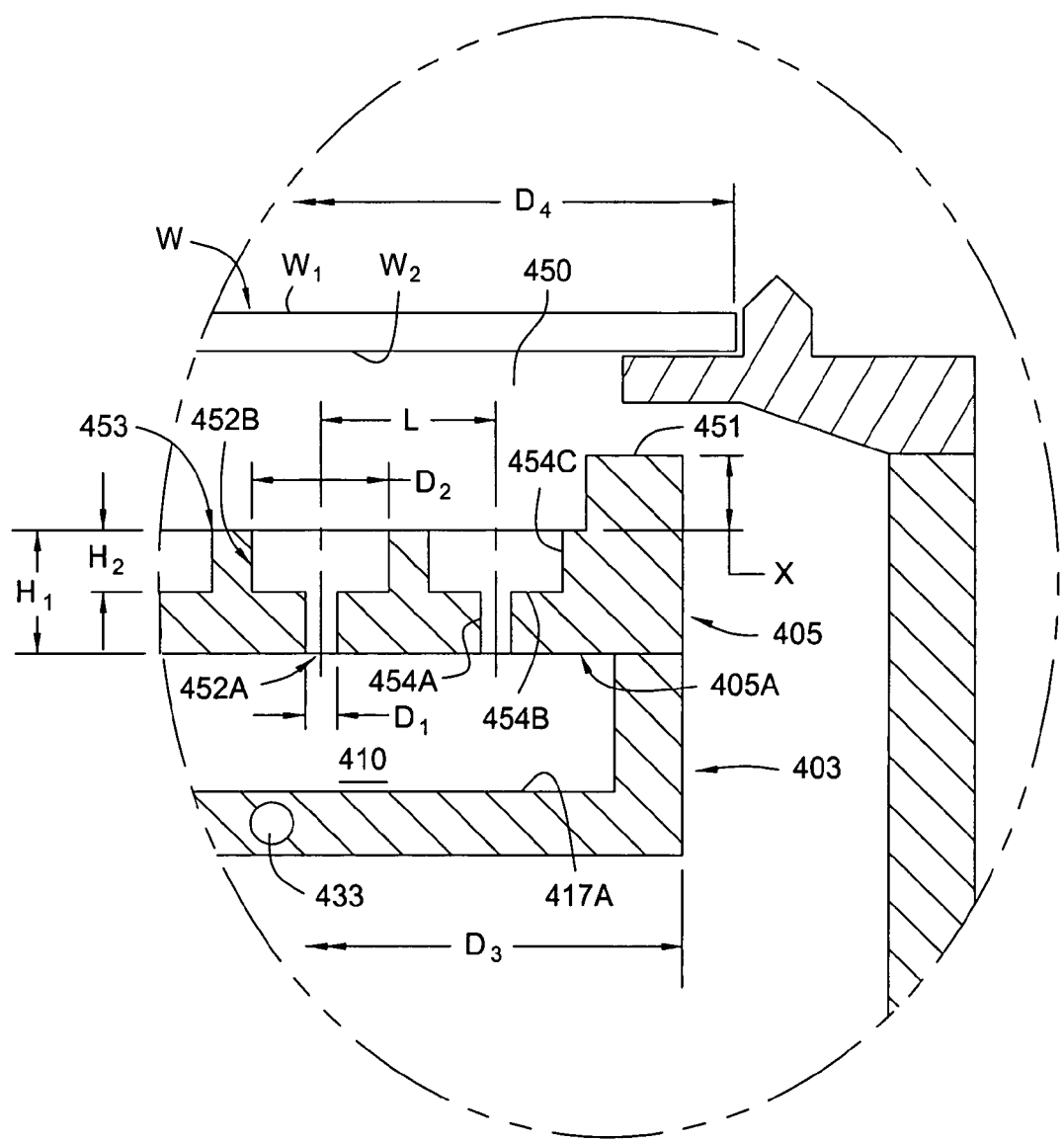
FIG. 5C is an enlarged vertical cross-sectional view of a portion of the exemplary platen assembly illustrated in FIG. 5B.
Figure 5D:
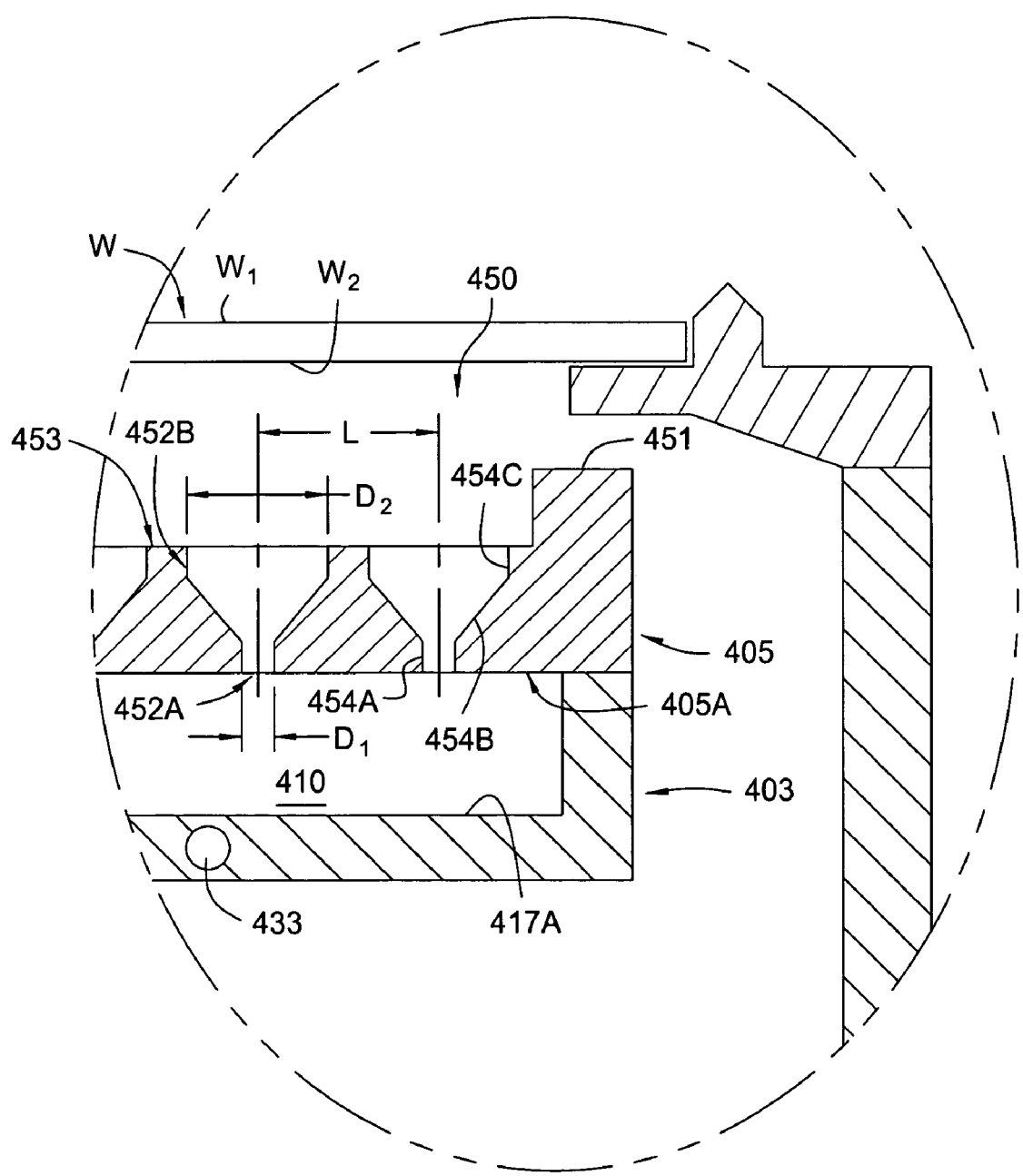
FIG. 5D is an enlarged vertical cross-sectional view of a portion of another embodiment of cross-sectional view of an exemplary platen assembly positioned in the fluid processing station.

FIG. 5B illustrates another embodiment of the fluid diffusion member 405 that has a plurality of multifaceted holes 452 and an dam 451 to improve the temperature controlled fluid distribution uniformity across a surface of a substrate positioned on the support fingers 412. In one embodiment, as shown in FIGS. 5B-D, the multifaceted holes 452 have an inlet section 452A that is smaller in diameter (elements $D_1$ FIG. 5C) than the diameter (elements $D_2$ FIG. 5C) of outlet section 452B. In this configuration the smaller inlet section 452A of the multifaceted holes 452 are sized to restrict the flow through the multifaceted holes 452 to improve the flow uniformity across the surface of the fluid diffusion member 405 and substrate. The outlet section 452B (item# $D_2$) is larger than the inlet section 452A (item# $D_1$) to reduce the velocity of the temperature controlled fluid exiting the outlet section 452B and also reduce the surface area of top surface 453 (FIG. 5C), or downstream side, of the fluid diffusion member 405. Reducing the surface area of the top surface 453 has been found to be advantageous, because it reduces the chance of forming areas on the backside of the substrate that are not in contact with the flowing temperature controlled fluid, or "dry regions." It is believed that the formation of these "dry regions" are affected by the surface tension of the flowing temperature controlled fluid and the ability of the temperature controlled fluid to "wet" the substrate surface and/or top surface 453 of the fluid diffusion member 405. In one aspect, it may be desirable to roughen the top surface 453 of the fluid diffusion member 405 to a surface roughness ($R_a$) of between about 1.6 micrometers (μm) to about 20 micrometers (μm) to improve the ability of the fluid to "wet" the top surface. If the "dry regions" are large enough, the temperature uniformity across the substrate will be affected by the lack of heat transferred from the temperature controlled fluid to the substrate and thus affect the deposition process results. In one aspect the top surface 453 is roughened by use of a bead blasting or grit blasting process. While the discussion above describes the use of holes having a "diameter", other embodiments of the multifaceted hole contemplate the use of other shaped regions (e.g., square, octagon, etc.) that have constant or varying cross-sectional area through the diffusion member 405. In one aspect of the invention, the size and shape of the multifaceted holes 452 may be varied across the surface of the diffusion member 405 to achieve a desired fluid coverage, heat transfer profile, and/or process result.

The dam 451, or "raised portion", is an annular ring that protrudes above the top surface 453 of the fluid diffusion member 405, and is generally used to collect and constrict the flow of the flowing temperature controlled fluid (item "A" FIG. 5B) as it leaves the space 450 formed between the substrate and the top surface 453. The dam 451 is thus used to minimize, or eliminate, the formation of "dry regions," since it causes the temperature controlled fluid exiting the multi-faceted holes 452 to collect before it flows over the dam 451. The dam 451 thus tends to retain, or cause the temperature controlled fluid to "pool" on the top surface 453 of the fluid diffusion member 405. Referring to FIG. 5C, in one aspect the dam 451 protrudes a distance "X" above the top surface 453, where the distance "X" is between about 0.5 mm and about 25 mm.

FIG. 5C also illustrates a close-up view of the edge of the cross-sectional view shown in FIG. 5B. In one aspect of the platen assembly 403, the outer diameter $D_3$ (i.e., outer surface) of the dam 451, and the fluid diffusion member 405, is less than then the diameter of the substrate (item# $D_4$). This configuration is desirable since it minimizes the chance of a fluid dispensed on the top surface of the substrate (item# $W_1$) from contacting the temperature controlled fluid and keeps the components in the fluid dispensed on the top surface of the substrate from contaminating the backside of the substrate (item# $W_2$).

FIG. 5C illustrates one embodiment of the platen assembly 403 that contains multifaceted holes 452 having two features, an inlet section 452A and outlet section 452B as described above, equally spaced a distance "L" apart. As shown in FIG. 5C the inlet section 452A is $H_1$ in depth and the outlet section 452B is $H_2$ in depth. FIG. 5D illustrates another embodiment of the fluid diffusion member 405 that has multifaceted holes 542 that have surfaces (items# 454A-C) that are not at right angles to each other to have a more gentle transition from the inlet section 452A to the outlet section 452B. For example, in one embodiment, it may be advantageous to make the angle between the surface 454B the center line of the holes about 60 degrees. The number of surfaces (items# 454A-C as shown) and the shape of the surfaces (i.e., linear or non-linear (e.g., exponential, second order curves, etc.)) as shown in FIG. 5D is not intended to be limiting to the scope of the present invention. While FIGS. 5C-D illustrate multifaceted holes that have features that are coaxial, e.g., the features have coincident axes of symmetry, other embodiments may have features that are not symmetric, or not have centers of symmetry that coincide, without varying from the basic scope of the invention.

Figure 5E:
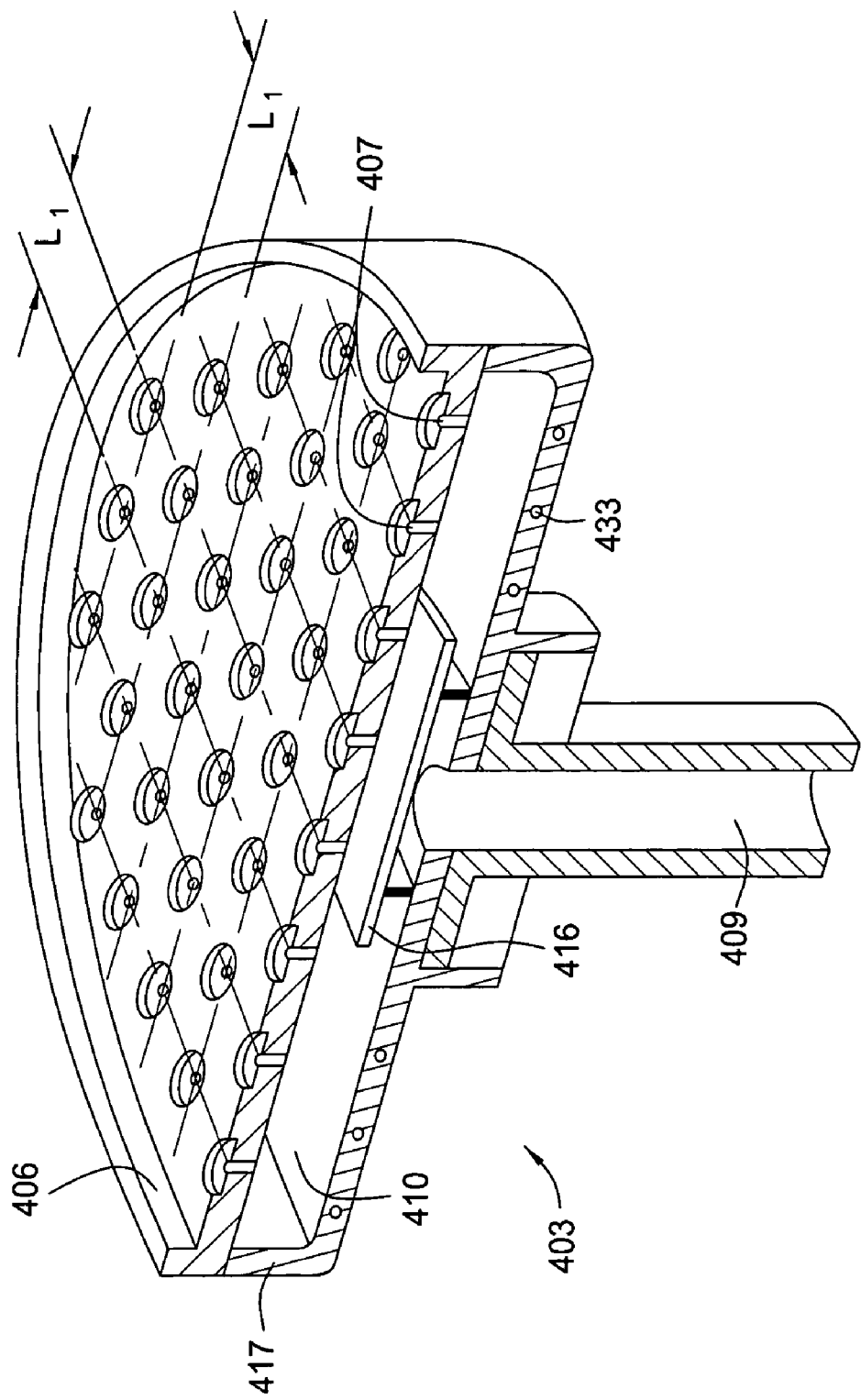
FIG. 5E a vertical cross-sectional view of an exemplary platen assembly positioned in the fluid processing station illustrated in FIG. 5A.

FIG. 5E illustrates an isometric cross-sectional view of the platen assembly 403 which illustrates one embodiment of a multifaceted hole pattern across the fluid diffusion member 405. In one embodiment, as shown in FIG. 5E, the multifaceted hole 452 pattern are arranged in a square type hole pattern (e.g., $L_1$ by $L_1$). In other embodiments, the fluid diffusion member 405 may have sectors, quadrants, or the whole surface that have an array of holes that are arranged in a hexagonal close pack pattern (i.e., a recurring pattern of a single hole surrounded by six equally spaced holes), rectangular hole pattern, radially symmetric hole pattern, and/or other non-uniform hole pattern that improves or adjusts the temperature profile across the substrate to improve the uniformity of the electroless deposition process performed on a substrate surface.

Figure 5F:
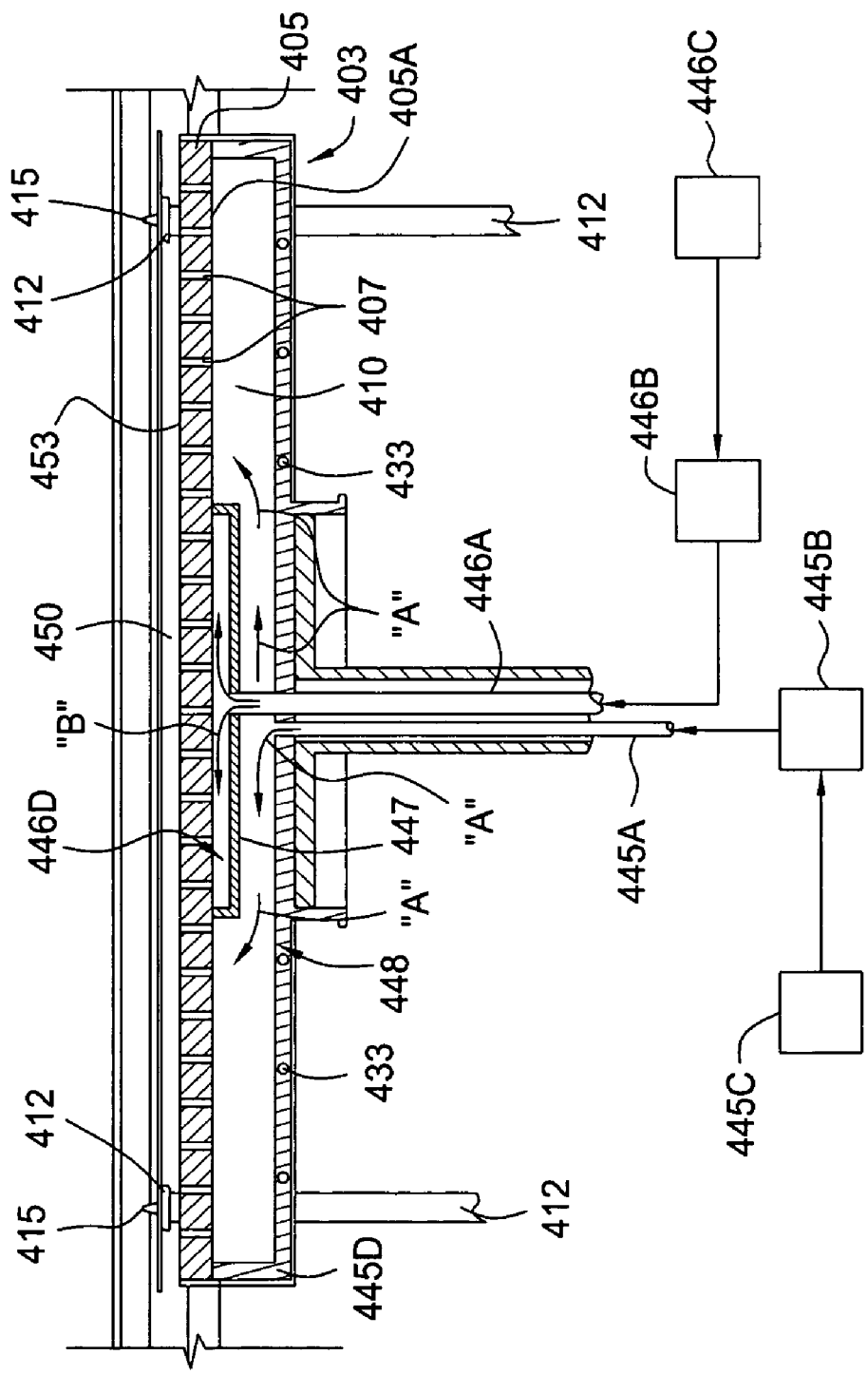
FIG. 5F is a vertical cross-sectional view of an exemplary fluid processing station.

FIG. 5F illustrates a cross-sectional view of one embodiment of the platen assembly 403 which divides the fluid volume 410 into two zones that can deliver one or more temperature controlled fluids at different temperatures into the space 450 between the fluid diffusion member 405 and the substrate 401. This configuration may be useful to achieve a desired temperature profile across the substrate and thus achieve desirable electroless deposition process results. In this configuration, the platen assembly 403 may contain a first zone hardware assembly 447 and a second zone hardware assembly 448. The first zone hardware assembly 447 may contain a first fluid supply conduit 446A, a first fluid heater 446B, a first fluid source 446C and a first base member 446D. The second zone hardware assembly 447 may contain a second fluid supply conduit 445A, a second fluid heater 445B, a second fluid source 445C and a second base member 445D. In the configuration shown in FIG. 5F the second base member 445D is the base member 417 shown in FIGS. 5A and 7. In one aspect, the first zone hardware assembly 447 is configured to deliver a first temperature controlled fluid (element "B") and the second zone hardware assembly 448 is configured to deliver a second temperature controlled fluid (element "A") to the substrate 401 positioned on the support fingers 412, wherein the first and second temperature controlled fluids are at different temperatures. In another embodiment of the invention, the interior of the platen assembly 403 may include one or more resistive-type heaters (not shown) that are adapted to increase the temperature of the fluid in the first base member 446D of the first zone hardware assembly 447 and/or the second base member 445D of the second zone hardware assembly 448. In this configuration the heaters (e.g., resistive heaters, element 445B, element 446B) are in communication with the system controller 111, such that the system controller 111 may regulate the operation of the respective heaters to control the temperature of the temperature controlled fluid and thus the substrate being processed. While FIG. 5F illustrates one embodiment of the platen assembly 403 that contains two zones, in other embodiments of the invention it may be desirable to divide up the fluid volume 410 into three or more zones that can separately control the temperature of the fluid that contacts the substrate. In one aspect, separate heated fluids are supplied to different areas of the backside of the substrate via individual or groups of holes 407, thus providing control over the temperature variation across the substrate as a result of the position of the individual holes 407 and the temperature of the heated fluid flowing through the individual holes 407. This embodiment may be used to generate increased temperatures near the center or edge of the substrate during processing, for example.

In another embodiment of the invention, the fluid diffusion member 405 may comprise a porous material, such as a porous ceramic, for example, configured to allow fluid to flow therethrough. In one aspect, the porous ceramic material is an alumina oxide material, for example. In this embodiment, the holes 407 are generally not required; however, the inventors have contemplated implementing some holes 407 in conjunction with the porous fluid diffusion member 405 to increase fluid flow where necessary. In one aspect, the fluid diffusion member 405 may comprise a porous plastic material, such as, a polyethylene, polypropylene, PVDF, PTFE, Teflon, or other compatible porous plastic material. A plastic material that has a hydrophilic surface may be advantageous to promote "wetting" of the fluid diffusion member 405 surfaces.

In one embodiment, the fluid diffusion member 405 is designed with pores having dimensions from about 0.1 micrometers to about 500 micrometers. Since the fluid flow resistance through a fluid diffusion member 405 is a function of the distance that the fluid travels through the flow fluid diffusion member 405, the vertical height of the fluid diffusion member 405 can be altered to provide desired fluid flow characteristics.

Figure 7:
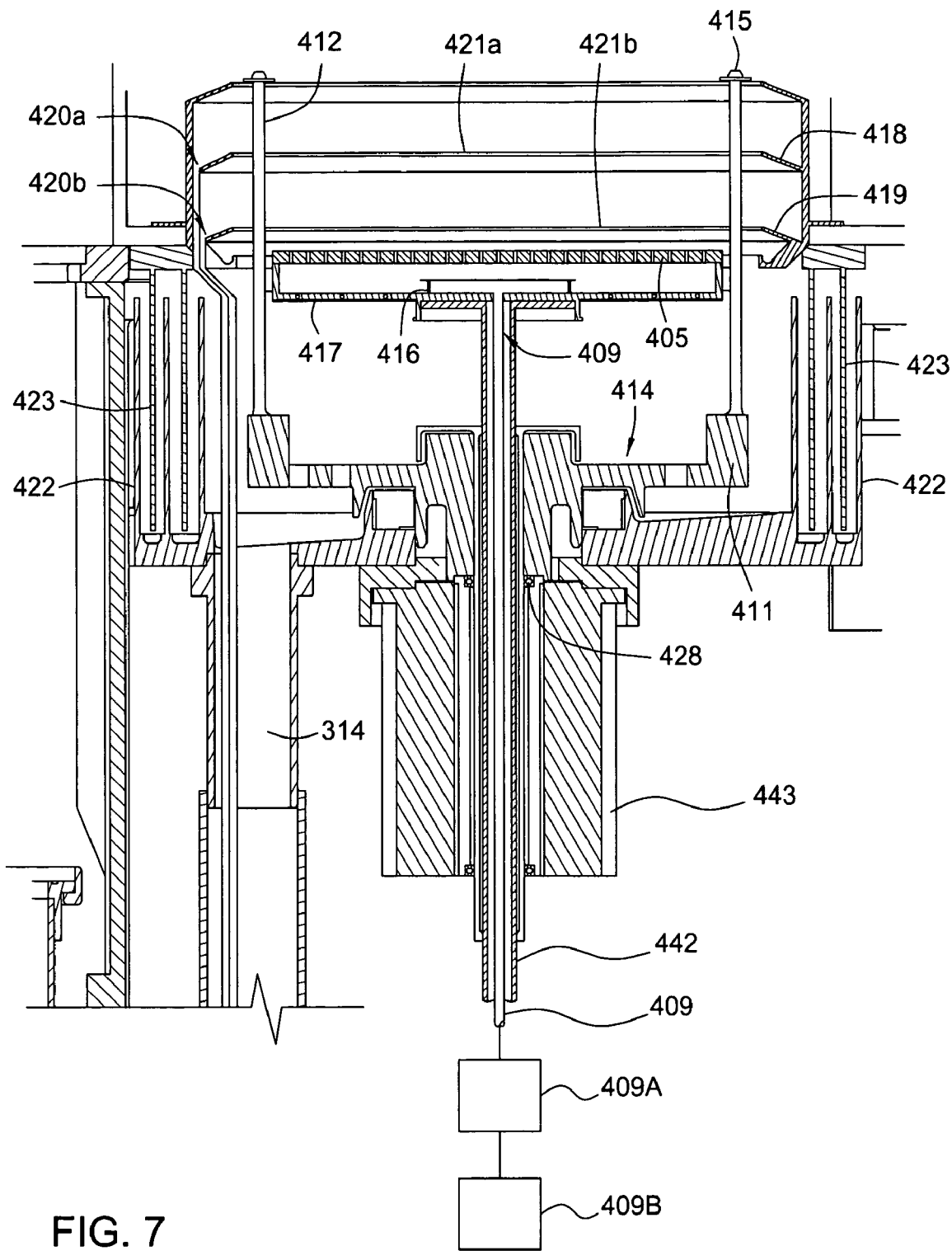
FIG. 7 is a vertical cross-sectional view of an exemplary fluid processing station.

Referring to FIGS. 4 and 7, the process of positioning a substrate for processing generally involves moving the lift assembly 413 between a loading position and a processing position. The lift assembly 413 is illustrated in a loading position in the left processing station 402 of FIG. 4, where the lift assembly is in a vertical position such that support fingers 412 extend above upper catch ring 418. In this position, the dispense arm 406 is vertically spaced above the support fingers 412 to allow for loading of a substrate 401. The dispense arm 406 (and the other fluid dispensing arms of the electroless deposition system) includes a stationary base member 426 that telescopically receives an upper arm member 425. A drive motor telescopically moves that upper arm member 425 relative to the base member 426 to adjust the vertical position of the dispense arm 406. The substrate 401 is positioned above the support fingers 412 by the mainframe robot 120 or the substrate transfer shuttle 305, and then the support fingers 412 may be vertically actuated to remove the substrate 401 from the respective robot/shuttle 120, 305. Once the substrate 401 is supported by the support fingers 412 above the robot/shuttle 120, 305, then the robot/shuttle 120, 305 may be removed from below the substrate 401, and the support fingers 412 may be lowered into a processing position.

The lift assembly 413 is illustrated in a processing position in the right processing station 404 of FIG. 4, where the lift assembly 413 is vertically positioned such that the support fingers 412 position the substrate 401 at a vertical position proximate one of the catch rings 418, 419. In the processing position, the fluid dispensing arm 408 is lowered and positioned proximate the upper surface of the substrate 401, as illustrated at processing station 404 in FIG. 4. The lift assembly 413 is generally actuated by a powered jack screw assembly 427 configured to vertically actuate the lift assembly 413 and the components attached thereto. More particularly, the lower portion of the fluid processing cell is attached to the lift assembly 413 and moves cooperatively therewith. The lower portion of the processing cell generally includes the substrate support assembly 414 (including support fingers 412 and ring 411), the lower interleaving walls 424, and the exhaust port 314.

Referring to FIGS. 4 and 7, in one embodiment, the platen assembly 403 remains stationary and does not move with the lift assembly 413 components (e.g., support fingers 412, ring 411). In this configuration, the base plate support 442, which is connected to the base plate member 417 and the fluid diffusion member 405, is mounted to the mainframe 113 through one or more structural supports (not shown). Thus, in this embodiment, the base plate support 442, base plate member 417 and fluid diffusion member 405 do not translate when the substrate lift assembly 413 lifts the substrate support assembly 414 or rotate when the support motor 443 rotates the substrate support assembly 414. In one aspect, the substrate support assembly 414 is aligned to the base plate support 442 using one or more bearings (not shown; see elements 1054A-B in FIG. 9) that also support and guide the substrate support assembly 414 components relative to the base plate support 442. This embodiment is advantageous, since requiring the base plate member 417 and fluid diffusion member 405 to rotate would require the use of a rotating fluid seal (not shown), which are generally unreliable and generate particles, which can be detrimental to device yield performance. In one aspect, the base plate support 442 also houses electrical wires (not shown) and the fluid supply conduit(s) 409 (FIGS. 5A and 7).

Figure 6:
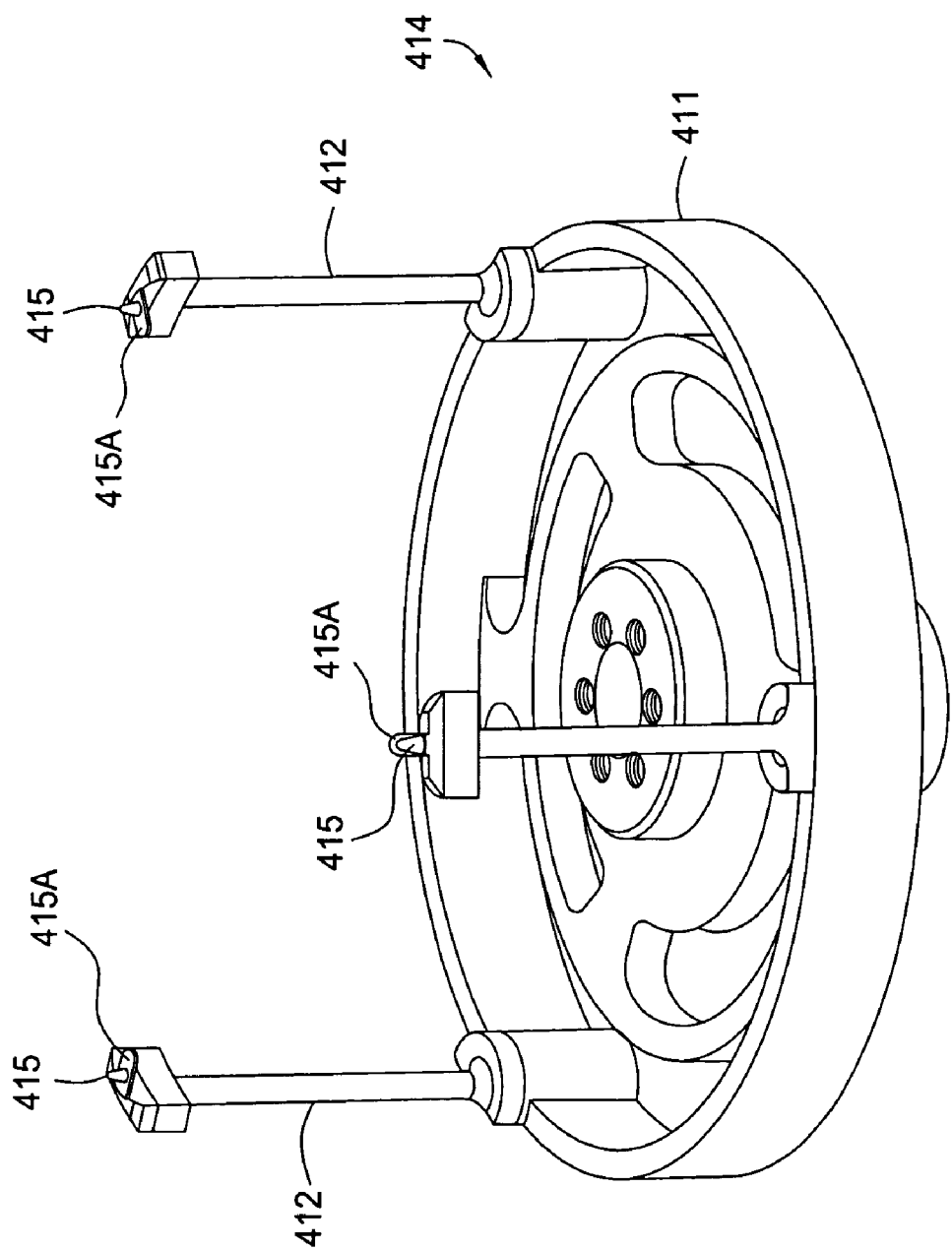
FIG. 6 is a isometric view an exemplary substrate support assembly.

Referring to FIG. 6, the substrate support assembly 414 generally contains the support fingers 412, vertical post member 415, substrate supporting surface 415A, and ring 411. A substrate that is placed on the substrate supporting surface 415A is captured or retained by the vertical post members 415. In one aspect of the invention, the substrate support assembly 414 is designed so that thermal expansion of the various components will not affect the ability of the substrate support assembly 414 to retain a substrate resting on the substrate supporting surface 415A. Thermal expansion of the substrate support assembly 414 can lead to misplacement and/or damage to the substrates placed between the vertical post members 415. One method of reducing thermal expansion is to design the substrate support assembly 414 using materials that have a low coefficient of thermal expansion, for example, tungsten, alumina, or boron carbide. In another aspect, the ring 411 may be designed to have a geometry that will minimize the movement of the support fingers 412 and vertical post members 415.

Referring to FIGS. 4 and 7, the lower portion of each of the respective processing stations 402, 404 each includes a plurality of interleaving wall assembly 422. The interleaving wall assembly 422 is configured to cooperatively move with the lift assembly 413 between the loading position illustrated at location 402 in FIG. 4 and the processing position illustrated at location 404 in FIG. 4. The interleaving wall assembly 422 generally includes upper interleaving walls 423, which are rigidly attached to the mainframe 113, and lower interleaving walls 424, which are attached to the lift assembly 413 and configured to move therewith. The lower interleaving walls 424 (specifically the innermost pair of interleaving walls 424 positioned closest to the cell) may be filled with a fluid, such as deionized water, that operates to seal the lower portion of the processing stations 402, 404 from the environment outside of the enclosed environment. The deionized water is generally continually supplied to the space between the lower interleaving walls 424 through a conventional "drip" mechanism, for example. The use of the fluid sealing interleaving wall assembly 422 allows the processing stations 402, 404 of the invention to form a reliable seal and also remove the need for a single seal 428 to seal while the structure is rotating and moving in a linear fashion. In conventional applications it is common to use a seal that works both as a rotational and linear seal that are positioned on a common guide shaft. The interleaving wall assembly 422 allows the seal 428 illustrated in FIG. 7 to be only a rotational seal, and not a combination of a rotational seal and a vertical sliding seal, which are often difficult to reliably operate in fluid processing systems.

As noted above, each of the stations 402, 404 may also include an upper catch ring 418 and a lower fluid catch ring 419, as illustrated in FIGS. 4, 5 and 7. The respective catch rings 418, 419 generally comprise annularly shaped members that extend inwardly and upwardly from an inner wall of the respective stations 402, 404. The rings 418, 419 may be attached to the inner wall of the cells or may be an integral part of the inner wall of the cells. The inner terminating edge 421a, 421b of catch rings 418, 419 is generally sized to have a diameter that is between about 5 mm and about 50 mm larger than the diameter of the substrate 401 being processed. As such, the substrate 401 may be vertically raised and lowered through the respective rings 418, 419 during processing. Additionally, each of the catch rings 418, 419 also includes a fluid drain 420a, 420b respectively, configured to collect processing fluids landing on the fluid catch rings 418, 419 (FIG. 7). The fluid drains 420a, 420b are in fluid communication with the exhaust port 314, as shown in FIG. 7. The exhaust port 314 connects to a separation box 429 (FIG. 4), where the gases and fluids may be separated from each other. Separation box 429 includes a gas exhaust port 430 positioned on an upper portion of the separation box 429, and a fluid drain 431 positioned on a lower portion of the box. Separation box 429 further includes a recapture port 432 (FIG. 4) that is configured to deliver processing fluids collected in the fluid drain 420a of the catch ring 418, or fluid drain 420b of the catch ring 419, to a reclamation device (not shown) for collection and reuse.

Referring to FIG. 7, the catch rings 418 and 419 are configured to allow for fluid processing of a substrate 401 at multiple vertical positions within each of the processing stations 402, 404. For example, in one position a substrate 401 may be situated such that the upper surface of the substrate 401 is positioned slightly above the terminating edge 421a of the upper catch ring 418 for a first fluid processing step. In this configuration a first processing fluid may be dispensed onto substrate 401 by a dispense arm 406, 408 while the substrate support assembly 414, and thus substrate 401, is rotated at a speed between about 5 rpm and about 120 rpm using the support motor 443. The rotation of the substrate 401 causes the fluid dispensed onto the substrate to flow radially outward off of the substrate. As the fluid flows over the edge of the substrate is travels outward and downward and is received on the upper catch ring 418. The fluid may be captured by the fluid drain 420a and sent to the recapture port 432 or recirculated for subsequent processing if desired. Once the first fluid processing step is complete, the substrate 401 may be vertically moved to a second processing position where the upper surface of the substrate 401 is positioned slightly above the terminating end 421b of the lower fluid catch ring 419 for a second fluid processing step. The substrate 401 is processed in this configuration in a similar fashion to the first fluid processing step and the fluid used in the process may be collected by a fluid drain 420b. An advantage of this configuration is that multiple fluid processing chemistries may be used in a single processing station. Additionally, the fluid processing chemistries may be compatible or incompatible, as the separate fluid catch rings 418, 419 that each have independent fluid drains 420a, 420b allows for separate collection of incompatible processing fluids.

Figure 8A:
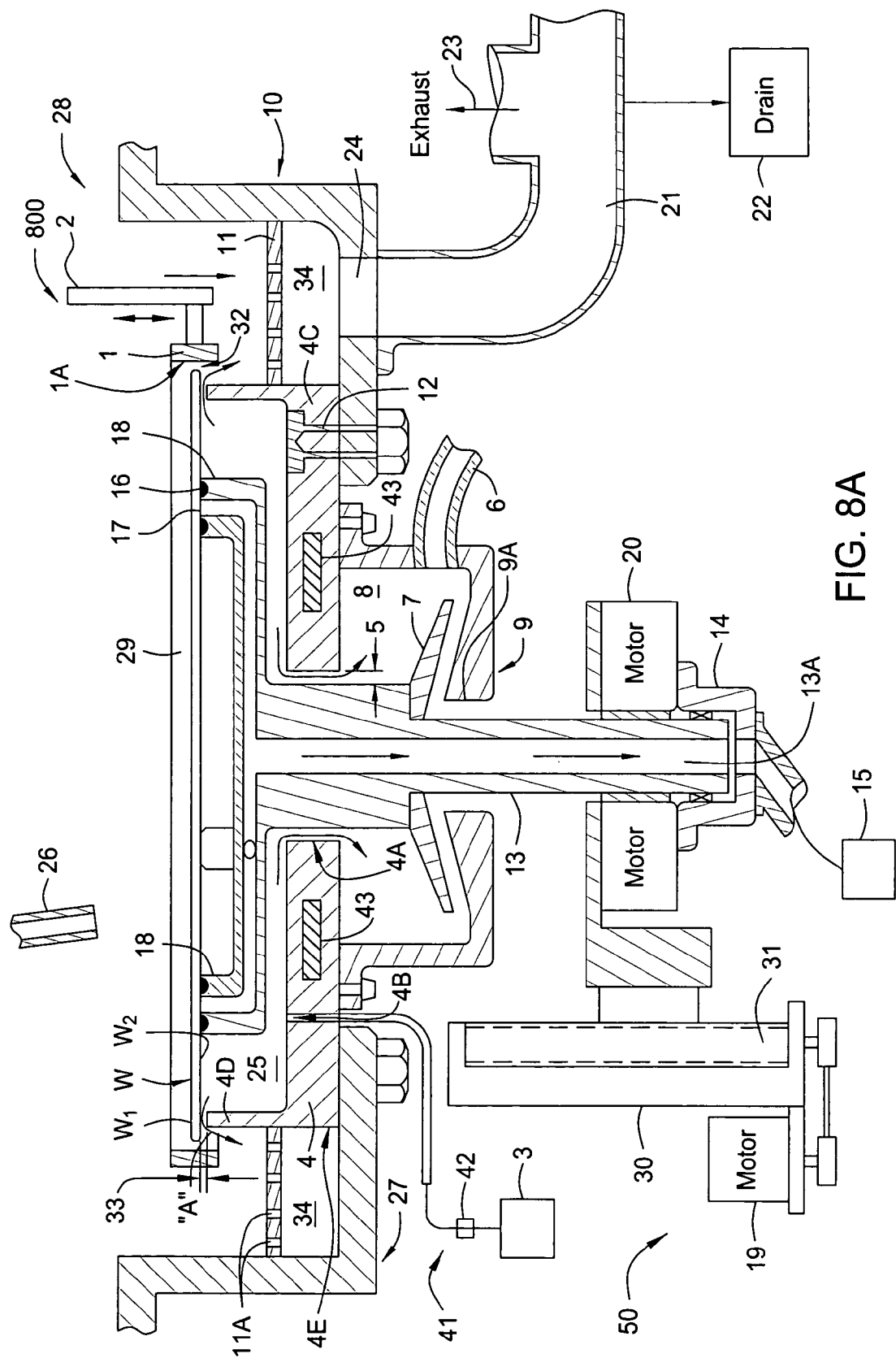
FIG. 8A is an enlarged vertical cross-sectional view of an exemplary fluid processing station.

FIG. 8A illustrates a cross-sectional view of an exemplary fluid processing chamber 800 that may be adapted to perform various aspects of the invention. Fluid processing chamber 800 may be positioned at any one of the processing cell locations 102, 104, 106, 108, 110, 112, 114, 116 illustrated in FIG. 1. Alternatively, fluid processing chamber 800 may be implemented as a stand alone plating cell, or in conjunction with another substrate processing platform. Fluid processing chamber 800 generally includes a processing compartment 28 that includes a top (optional, not shown), sidewalls 10 and a base 27. A bowl 4 having a circular sidewall and an aperture 4A in the center of its bottom 4C is generally disposed in the central location of the base 27. A spindle 13 is generally disposed in the aperture 4A of the bowl 4. A plurality of substrate support fingers 18 are connected to the spindle 13 that is positioned inside the aperture 4A of the bowl 4. The substrate support fingers 18 are configured to retain a substrate W by means of friction and/or "chucking" the substrate, by supplying a vacuum to the substrate backside W2 of the substrate W. The spindle 13 and the substrate support fingers 18 can be raised or lowered relative to the bowl 4 by use of a linear slide 30. When in the processing position, as shown in FIG. 8A, the substrate W retained on the substrate support fingers 18 is positioned by use of the linear slide 30 to form an adjustable gap 33 between the sidewall top 4D of the bowl 4 and the substrate backside W2 of the substrate W. The gap 33 is generally adjusted to restrict and control the flow of a temperature controlled fluid from a fluid volume 25 formed between the substrate backside W2 and the bowl 4. A fluid source 3 delivers the temperature controlled fluid to the fluid volume 25.

In one embodiment, an edge dam 1 is positioned radially outward of the perimeter of the substrate W. The edge dam 1 is generally a continuous annular ring that circumscribes the substrate W, which may be attached to the sidewall 10 directly (as shown in FIG. 8B) or attached to a vertical lift assembly 2 that can vertically raise and lower the edge dam 1. The edge dam 1 is generally configured to retain an amount of fluid delivered from the fluid dispense port 26 on to the processing surface W1 of the substrate W. In one aspect, the processing surface W1 of the substrate W and the inner wall 1A of the edge dam 1 define a fluid volume region 29 in which the fluid retained on the processing surface W1 is collected. In one aspect, the edge dam 1 is configured to have an inner diameter that is larger than an outer diameter of the substrate W such that a gap 32 is formed between the perimeter of the substrate W and the inner wall of the edge dam 1. The gap 32 is generally sized to minimize the amount of fluid that flows through the gap 32, due to its size and the surface tension created between the substrate W, edge dam 1 and fluid retained in fluid volume region 29.

In one aspect, the edge dam 1 is used to allow the fluid to collect on the processing surface W1 of the substrate, prevent the fluid from contaminating the substrate backside W2 of the substrate W, and limit the consumption of processing solutions dispensed into the fluid volume region 29. In one aspect, the gap 32 can be between about 0.5 mm and about 2 mm.

In one embodiment, the edge dam 1 may be raised or lowered by a vertical lift assembly 2 that is adapted to position the edge dam 1 in two or more vertical positions. The vertical lift assembly 2 may be a conventional pneumatic actuator or DC servo motor attached to a lead screw (not shown). In one aspect, raising or lowering the edge dam 1 can be used to adjust the amount of the processing fluid retained in the fluid volume region 29 and thus the amount of fluid that resides on the processing surface W1 of the substrate W. In another aspect, when the edge dam 1 may be lowered to a position so that the top of the edge dam 1 is lower than the substrate W, or raised to a position such that the bottom of the edge dam 1 is higher than the substrate W, so that the fluid retained on the substrate W is allowed to flow radially outward and off the substrate W surface, due to gravity or centrifugal force created by rotating the substrate. Other processes, such as rinsing process and drying process, can also be performed when the edge dam 1 is lowered or raised.

FIGS. 8C and 8D illustrate one embodiment of the edge dam 1, which has an elongated portion 1C positioned below the substrate W. In one aspect, the elongated portion 1C extends inwardly from the inner wall 1A of the edge dam 1, and thus gives the edge dam 1 an "L" shaped cross-section. The elongated portion 1C is generally configured to have an inner diameter that is smaller than an outer diameter of the substrate W. In one aspect, as shown in FIG. 8C, the edge dam 1 is positioned to form the gap 32 to restrict the flow of the fluid retained in the fluid volume region 29 during processing.

In one aspect, as shown in FIG. 8D, the edge dam 1 is raised high enough so that the elongated portion 1C of the edge dam 1 contacts a surface of the substrate W allowing a static "pool" of the dispensed fluid to be formed on the substrate W (FIG. 8D). In another aspect, the elongated portion 1C may be used to lift the substrate W from the substrate support fingers 18 to allow the substrate W to be processed without the substrate backside W2 being heated by the temperature controlled fluid contained in the fluid volume 25. In another aspect, by use of the vertical lift assembly 2 the edge dam 1 may be lowered to a position so that the top of the edge dam 1 is lower than the substrate W, so that the processing fluid retained on the substrate can flow radially outward and off the substrate W, due to gravity or the rotation of the substrate. Other processes, such as rinsing process and drying process, can also be performed when the edge dam 1 is lowered.

Referring to FIG. 8A, generally, three or more substrate support fingers 18 may be radially attached to the top of the spindle 13 to support a substrate thereon. In one aspect, the three substrate support fingers 18 are evenly arranged in a radial orientation, i.e., the angle between fingers is 120 degrees apart. The substrate support fingers 18 generally have a central channel 17 that is in fluid communication with a spindle port 13A formed in the spindle 13. In one aspect, the spindle port 13A and central channel 17 are in fluid communication with a vacuum source 15, such as a vacuum venturi. In this configuration a substrate can be retained on the seals 16 (e.g., o-ring 16A, elastomeric diaphragm 16B) on the substrate support fingers 18 by creating a pressure drop between the atmospheric pressure above the substrate processing surface W1 and a vacuum created by vacuum source 15 in the central channel 17. The use of vacuum to retain the substrate can be used to prevent the substrate from slipping off of the substrate support fingers 18 when the substrate W and support fingers 18 are being rotated by a substrate support finger motor 20 and/or moved vertically by a substrate support lift assembly 50.

Figure 8F:
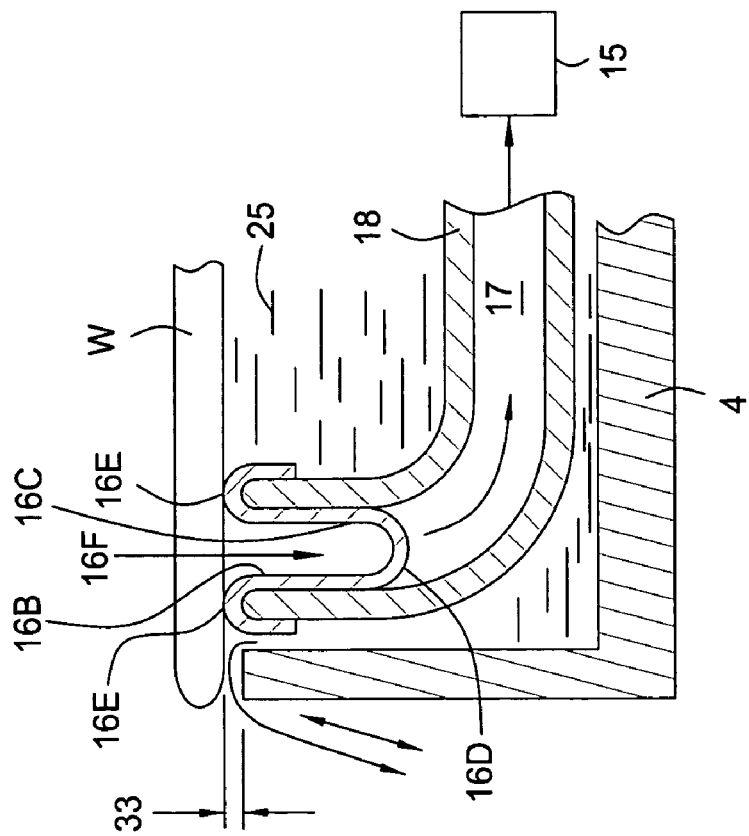
FIG. 8F is a cross-sectional view of another embodiment of a tip of a finger of the wafer holder assembly position in the fluid processing station illustrated in FIG. 8A.
Figure 8E:
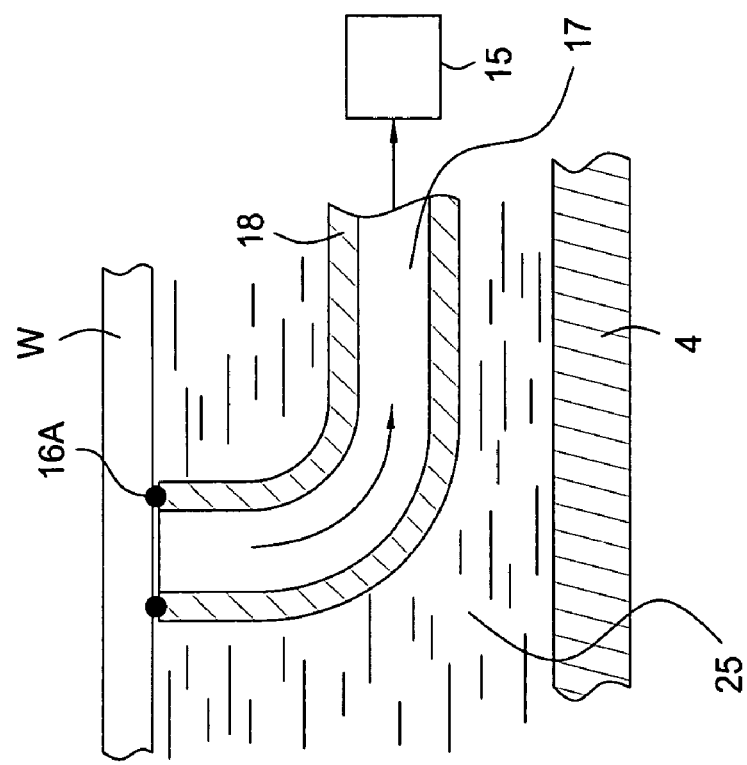
FIG. 8E is a cross-sectional view of a tip of an exemplary finger of the wafer holder assembly position in the fluid processing station illustrated in FIG. 8A.

FIG. 8E illustrates a more detailed view of a tip of the substrate support fingers 18 that has an o-ring 16A positioned thereon to support a substrate W. The shape and material hardness of the o-ring 16A may be optimized on each of the substrate support fingers 18 to compensate for the flatness issues and surface irregularities often found in semiconductor wafers. Soft elastometric seals that have a large cross-sectional area, and are made of "non-slippery" materials (e.g., Viton™, buna-N, etc.) are desirable choices for the O-ring 16A. In this configuration the seal 16A acts as the primary seal when a vacuum has been applied by vacuum source 15 to hold the substrate W to the fingers 18. The O-ring 16A may also prevent leakage of the fluid retained in the fluid volume 25 into the central channel 17.

FIG. 8F illustrates another embodiment of the substrate support fingers 18 that have a substrate retained on an elastomeric diaphragm 16B. In this configuration, an elastomeric diaphragm 16B may be positioned on each of the substrate support fingers 18 to provide a fluid tight seal over the end of the substrate support fingers 18 to prevent fluid from making its way to the vacuum source 15. The elastomeric diaphragm 16B is adapted to retain a substrate positioned thereon, by use of a sub-atmospheric pressure, or vacuum, created in a region 16F formed between the substrate backside W2 and the upper surface 16C of the elastomeric diaphragm 16B. The sub-atmospheric pressure, or vacuum, is formed when the elastomeric diaphragm 16B is displaced (e.g., stretched or distorted) by the generation of a sub-atmospheric pressure behind the backside 16D of the elastomeric diaphragm 16B by use of the vacuum source 15. The displacement of the elastomeric diaphragm 16B causes the "vacuum" to be formed between the substrate backside W2 and the seal formed between the contact points 16E on the upper surface 16C of the elastomeric diaphragm 16B. Generally, it is desirable for the elastometric diaphragm 16B to be made from a soft and non-slippery material, such as Viton™ and buna-N.

Referring to FIG. 8A, the fluid processing chamber 800 further comprises a substrate support finger motor 20 which is connected to the spindle 13 and is generally configured to rotate and support the substrate support fingers 18 and the spindle 13. A rotary seal assembly 14 may be positioned to provide a rotational seal between the spindle 13 and the vacuum source 15. A rotational movement is imparted from the motor 20 to the substrate W through the spindle 13 and substrate support fingers 18. The rotational speed of the substrate support fingers and the spindle 13 may be varied according to a particular process being performed, such as deposition, rinsing and drying. In the case of deposition, the substrate support fingers may be adapted to rotate at relatively slow speeds, such as between about 5 rpm and about 150 rpm, depending on the viscosity of the processing fluids. During the rinsing process, the substrate support fingers 18 may be adapted to spin at relatively moderate speeds, such as between about 5 rpm and about 1000 rpm. In the case of drying, the substrate support fingers may be adapted to spin at relatively fast speeds, such as between about 500 rpm and about 3000 rpm to spin dry the substrate W positioned thereon.

The substrate support finger motor 20 may be connected to a substrate support lift assembly 50 which generally comprises a linear slide 30 coupled to a lead screw 31 and a substrate support lift motor 19. In one arrangement, the substrate support lift motor 19 is a precision motor that transmits its rotational movement to the lead screw 31. Rotational movement of the lead screw 31 converts to linear motion of the linear slide 30 which translates to movement of the spindle 13.

Referring to FIG. 8A, the bowl 4 may be mounted to the base 27 with a plurality of bolt assemblies 12. The shape of the bowl 4 forms a fluid volume 25 which is in fluid communication with a fluid source 3 through one or more inlets 4B on the bottom of the bowl 4. The fluid source 3 may be adapted to deliver a fluid, such as heated DI water. In one aspect, the fluid source 3 is adapted to cause a fluid to flow through one or more inlets 4B, then through the fluid volume 25 and then over the sidewall top 4D of the bowl 4. In one aspect, the substrate W is positioned such that a gap 33 is formed between the substrate backside W2 and sidewall top 4D of the bowl 4 to assure contact between the substrate backside W2 and the fluid delivered or flowing from the fluid source 3. The size of the gap 33 is configured to allow fluid to flow over the sidewall top 4D (see the arrows marked "A") and to ensure fluid contact to the substrate backside W2. In one aspect, the bowl 4 is configured to generate and maintain a fluid at a uniform temperature within the fluid volume 25, especially near the substrate backside W2. Generally, this is accomplished by optimizing the size and shape of the fluid volume 25 and/or positioning the one or more inlets away from the substrate backside W2. The optimum size of the fluid volume 25 to achieve a uniform substrate temperature may vary depending on the type of fluid delivered to the fluid volume 25, the flow of fluid through the fluid volume 25, the set point temperature of the fluid, the physical size of the substrate support fingers 18, and rotation speed of the substrate support fingers 18. Since laminar flow regimes have been shown to exhibit poor heat transfer characteristics, the rotation of the substrate support fingers 18 may also adapted to maintain a turbulent flow in the fluid volume 25. In one aspect, the fluid delivered to the fluid volume 25 is temperature controlled by use of a fluid heater 41. The fluid heater 41 may contain an in-line fluid heater 42 attached to fluid source 3, and/or heating elements 43 attached or embedded in the bowl 4.

In one aspect, the outward flow of the fluid from the fluid source 3 and through the gap 33 is designed to prevent or minimize the processing fluid flowing out of the fluid volume region 29 from undesirably contacting the backside of the substrate W. Preventing contact between the processing fluid with the backside of the substrate will prevent particles or unwanted materials from depositing on the backside of the substrate, which can affect semiconductor device yield.

In one embodiment, a gap 5 may be configured between the spindle 13 and the aperture 4A of the bowl 4 to allow rotational movement of the spindle 13 relative to the bowl 4. The gap 5 may be between about 0.1 mm and about 0.5 mm wide. However, larger or smaller gaps may be used. A catching member 9 having an aperture 9A is positioned under the bowl 4 and around the spindle 13. Inside the catching member 9, a labyrinth seal is formed between the shield 7 and the catching member 9. A labyrinth seal is generally defined as a group of over lapping features (i.e., element 7 and 9 in FIG. 8A) which prevent a fluid from making its way through the seal, due to the geometry and configuration of the over lapping features. The fluid flowing through the gap 5 is collected in the collection region 8 by the catching member 9 and then directed to a drain 6 positioned near the bottom of the catching member 9. Alternatively, seals may be used between the spindle 13 and the aperture 4A of the bowl 4, thus, removing the need for the labyrinth seal.

The edge dam 1, the bowl 4, the substrate support fingers 18, and the spindle 13 may be manufactured from a ceramic material (such as fully pressed aluminum nitride, alumina $Al_2O_3$, silicon carbide (SiC)), a polymer coated metal (such as Teflon™ polymer coated aluminum or stainless steel), a polymer material, or other material suitable for semiconductor fluid processing. Preferred polymer coatings or polymer materials are fluorinated polymers such as Tefzel (ETFE), Halar (ECTFE), perfluoroalkoxy resin (PFA), PolyTetraFluoroEthylene (PTFE), TetraFluorEthylene-Perfluorpropylene (FEP), PVDF, etc.

The fluid processing chamber 800 further comprises a perforated plate 11 which may be positioned above the base 27 and in between the outside wall 4E of the bowl 4 and inside of the sidewall 10. The sidewall 4E of bowl 4, the base 27, the sidewall 10 and the perforated plate 11 define a compartment 34. The compartment 34 is in fluid communication with the processing compartment 28 through a plurality of holes 11A in the perforated plate 11. A drain port 24 is generally positioned in the base 27 and is connected to an exhaust port 21 which may be connected to a conventional scrubbed exhaust system 23 and a fluid drain 22.

In one aspect, during a deposition process the amount of oxygen or other gases in the processing compartment 28 is controlled by delivering a processing gas, such as nitrogen, helium, hydrogen, argon, and/or mixture of these or other gases commonly used in semiconductor processing. The processing gas may be introduced to the processing compartment 28 through a HEPA-type filtration system (see FIG. 2, element 313) and removed from the exhaust port 21. The presence of the perforated plate 11 having a plurality of holes 11A formed therethrough improves the uniformity of the processing gas flow through the processing compartment 28.

The fluid processing chamber 800 further comprises a fluid dispense port 26 configured to dispense a processing fluid onto the substrate W while it is positioned on the substrate support fingers 18. The fluid dispense port 26, similar to the fluid inlet system 1200 (discussed below in FIGS. 9, 9A, 9B, et al), is generally in fluid communication with at least one fluid supply source (e.g., solution sources 1202, 1204, 1206 shown in FIG. 9) via at least one fluid supply valves (e.g., valves 1209, shown in FIG. 9). As such, multiple chemicals maybe mixed and supplied from the fluid dispense port 26 to perform various electroless plating processes discussed below.

System Operation

In operation, embodiments of the system 100 of the invention may be used to conduct an electroless preclean process, an electroless activation process, an electroless plating process, an electroless post clean process, and/or other processing steps that may be used in an electroless process. An exemplary process sequence for conducting an electroless plating process using embodiments of the invention will now be described with respect to the embodiments of the invention discussed herein. An electroless plating process generally begins with the insertion of a substrate into the enclosed processing enclosure 302 (see FIG. 2). The insertion process generally includes opening the valved access port 304 and inserting a substrate 401 into the processing enclosure 302 with the mainframe robot 120. The substrate 401 is inserted in a face up orientation, i.e., the surface of the substrate 401 to be plated is facing upward.

Once the substrate is inserted into the enclosed processing enclosure 302, the mainframe robot 120 positions the substrate onto the support fingers 412 in processing station 404, and the mainframe robot retracts from the processing enclosure 302. The support fingers 412 may then vertically position the substrate 401 for processing, while valved access port 304 is closed. During the insertion process, i.e., during the time period when the valved access port 304 is open, the gas supply in the environmental control assembly 315 is "on" and is caused to fill the enclosed processing enclosure 302 with an inert processing gas. The process of flowing the inert gas into the processing volume causes an outward flow of the processing gas through the access ports 304 that is configured to prevent ambient gasses, oxygen in particular, from entering the enclosed processing enclosure 302, as oxygen is known to have a detrimental effect (oxidation) on plated materials and, in particular, copper. The flow of the processing gas is continued after the valved access port 304 is closed, and is generally on before the valved access port 304 is opened. The flow of processing gas is continued during the electroless cleaning, activation, and plating sequence and the exhaust port 314, a gas vent, and/or vacuum pump may be used to maintain a desired processing pressure in the enclosed processing enclosure 302 once the valved access port 304 is closed. The combination of the gas supply, a HEPA filter, and the exhaust port 314 are used to control the oxygen content in the enclosed processing enclosure 302 during particular processing steps, i.e., the oxygen content in the processing enclosure 302 may be controlled and optimized for each individual processing step if desired.

Once the substrate is positioned in the processing cell, the electroless plating processes of the invention generally begin with a substrate pre-cleaning process. The precleaning process begins with the upper surface of the substrate being positioned slightly, generally between about 2 mm and about 10 mm, above the terminating edge 421a of the upper catch ring 418. The cleaning process is accomplished via a cleaning solution being dispensed onto the substrate surface by the dispense arm 406. The cleaning solution may be dispensed onto the substrate surface during the lowering process to save process time and increase throughput of the cell. The cleaning solution may be an acidic or basic solution, depending upon the desired cleaning characteristics, and the temperature of the cleaning solution may be controlled (heated or cooled) in accordance with a processing recipe. Additionally, the cleaning solution may include a surfactant additive. The rotation of the substrate, which is generally between about 10 0rpm and about 60 rpm, causes the cleaning solution to flow radially outward off of the substrate and onto the upper catch ring 418, where the cleaning solution is captured, transmitted to drain 420a, and then communicated to separation box 429 via the exhaust port 314 for separation and recycling, if desired.

Once the substrate has been cleaned, the substrate surface is generally rinsed. The rinsing process includes dispensing a rinsing solution, such as deionized water, onto the substrate surface while rotating the substrate. The rinsing solution is dispensed at a flow rate and temperature configured to effectively remove any residual cleaning fluid from the substrate surface. The substrate is rotated at a speed sufficient to urge the rinsing solution off of the surface of the substrate, i.e., between about 5 rpm and about 120 rpm, for example.

Once the substrate has been rinsed, a second rinsing step may be employed. More particularly, prior to an activation step, which generally includes application of an acidic activation solution to the substrate surface, the substrate surface may first be treated with an acidic conditioning rinse solution. The conditioning rinse solution generally includes an acid, such as the acid used in the activation solution, for example, which operates to condition the substrate surface for the application of the acidic activation solution. Exemplary acids that may be used for conditioning solutions include nitric acid, chloride based acids, methyl sulfonic acids, and other acids commonly used in electroless activation solutions. The substrate conditioning process may be conducted at a processing position adjacent the upper catch ring 418, or the substrate may be lowered to a processing position adjacent the lower catch ring 419, depending upon the compatibility of the chemistry used for the conditioning process with the chemistry used for the pre-cleaning process.

Once the substrate has been conditioned, an activation solution is applied to the substrate surface with the substrate positioned proximate the lower catch ring 419. The activation solution is generally used to act as a catalytic layer for subsequent deposition processes and/or promote adhesion between the substrate surface and the subsequently deposited layers. The activation solution is dispensed onto the substrate by arm 408 and is caused to flow radially outward over the edge of the substrate and onto the catch ring 419 as a result of the substrate being rotated. The activation solution is then collected by the fluid drain 420 for recirculation. The activation solution generally includes a palladium based solution having an acid foundation. During the activation step, the backside substrate surface, which is generally circular and similar in diameter to fluid diffusion member 405, is generally positioned between about 0.5 mm and about 10 mm from the upper surface of the fluid diffusion member 405. The space between the backside of the substrate and the fluid diffusion member 405 is filled with a temperature controlled fluid, which may be deionized water that is dispensed from the holes 407 formed into the fluid diffusion member 405. The temperature controlled fluid (generally a heated fluid, but may also be a cooled fluid) dispensed from the holes 407 contacts the backside of the substrate and transfers heat to/from the fluid to the substrate to heat/cool the substrate for processing. The temperature controlled fluid may be continually supplied, or alternatively, a predetermined volume of the fluid may be supplied and then the fluid supply terminated. The flow of the temperature controlled fluid contacting the backside of the substrate may be controlled to maintain a constant substrate temperature during the activation process. Additionally, the substrate may be rotated at between about 10 rpm and about 100 rpm during the activation process to facilitate even heating/cooling and fluid spreading.

Once the substrate surface has been activated, an additional rinsing and/or cleaning solution may be applied to the substrate surface to clean the activation solution therefrom. A first rinsing and/or cleaning solution that may be used after activation includes another acid, preferably selected to match the acid of the activation solution. After the acid post rinse, the substrate may also be rinsed with a neutral solution, such as deionized water, to remove any residual acid from the substrate surface. The post activation cleaning and rinsing steps may be conducted at either the upper processing position or the lower processing position, depending upon the compatibility of the chemistries.

When the activation steps are completed, the substrate may be transferred from the electroless activation station 402 to the deposition station 404 by the substrate transfer shuttle 305. The transfer process includes raising the substrate out of the electroless activation station 402 with the support fingers 412, moving the substrate transfer shuttle 305 under the substrate, lowering the substrate onto the substrate transfer shuttle 305, and transferring the substrate from the electroless activation station 402 to the deposition station 404. Once the substrate is in the deposition station 404, the substrate support fingers 412 for the deposition station 404 may be used to remove the substrate from the substrate transfer shuttle 305 and position the substrate for processing.

The positioning of the substrate generally includes positioning the substrate proximate the upper catch ring 418 for a pre-cleaning process. The precleaning process includes dispensing a precleaning solution onto the substrate with arm 408, wherein the precleaning solution is generally selected to have a similar pH as the electroless plating solution subsequently applied so that the precleaning solution may condition the substrate surface to the pH of the deposition solution. The precleaning solution may be a basic solution that is the same as the foundation for the electroless deposition solution that is to be applied after the conditioning step. The precleaning of the substrate surface with a solution having the same pH as the plating solution also improves the wetability of the substrate surface for the deposition process. The precleaning solution may be heated or cooled, as required by the processing recipe.

When the substrate surface has been conditioned by the basic solution, the next step in the electroless deposition process is to apply the plating solution to the substrate surface. The plating solution generally includes a metal, such as cobalt, tungsten, and/or phosphorous, etc. that is to be deposited onto the substrate surface in the form of a pure metal or an alloy of several metals. The plating solution is generally basic in pH and may include a surfactant and/or a reductant configured to facilitate the electroless plating process. The substrate is generally lowered to a position slightly above the lower fluid catch ring 419 for the deposition step. As such, the deposition solution applied by arm 408 flows outward over the edge of the substrate and is received by the catch ring 419, where it may be collected by drain 420b for possible recycling. Additionally, the backside of the substrate is generally positioned between about 0.5 mm and about 10 mm, or between about 1 mm and about 5 mm away from the upper surface of the fluid diffusion member 405 during the deposition step. The space between the backside of the substrate and the fluid diffusion member 405 is filled with a temperature controlled (generally heated) fluid, which may be deionized water that is dispensed through the holes 407 formed into the fluid diffusion member 405. The temperature controlled fluid dispensed from the holes 407 contacts the backside of the substrate and transfers heat from the fluid to the substrate to heat the substrate for the deposition process. The temperature controlled fluid is generally continually supplied throughout the deposition process. The flow of the temperature controlled fluid contacting the backside of the substrate during the deposition process is controlled to maintain a constant substrate temperature during the deposition process. Additionally, the substrate may be rotated at between about 10 rpm and about 100 rpm during the deposition process to facilitate even heating and spreading of the deposition solution applied to the substrate surface.

Once the deposition process is completed, the substrate surface is generally cleaned in a post deposition cleaning process that includes applying a post deposition cleaning solution to the substrate. The post deposition cleaning process may be conducted at either the upper or lower processing position, depending upon the compatibility of the process chemistries. The post deposition cleaning solution generally includes a basic solution having about the same pH as the plating solution. The substrate is rotated during the cleaning process to urge the cleaning solution off of the substrate surface. Once the cleaning process is completed, the substrate surface may be rinsed with deionized water, for example, and spun dry to remove any residual chemicals from the substrate surface. Alternatively, the substrate may be vapor dried via application of a solvent with a high vapor pressure, such as acetone, alcohols, etc.

In the exemplary system 100 of the invention, processing cell locations 102 and 112 may be configured to conduct an electroless preclean process, an electroless activation process, and an electroless post activation cleaning process, while processing cell locations 104, 110 may be configured as electroless deposition cells and electroless post deposition cleaning cells. In this configuration, reclamation of the chemistries from the respective processes is possible, as the respective activation and deposition chemistries are separated in the respective processing locations. Another advantage of this configuration is that the substrate is transferred from an activation solution to an electroless deposition solution in an inert environment, as the processing space for the fluid processing cell locations 102, 104, 110, 112 is within the enclosed processing enclosure 302. Further, the processing enclosure is flooded with an inert gas during loading and processing, and as such, the interior of the enclosed processing enclosure 302 has a substantially reduced percentage of oxygen, for example, less than about 100 ppm of oxygen, or more particularly, less than about 50 ppm of oxygen, or further still, less than about 10 ppm of oxygen. The combination of the substantially reduced oxygen content along with the close proximity and fast transfer times between the activation and plating cells (generally less than about 10 seconds) operates to prevent oxidation of the substrate surface between the activation and deposition steps, which has been a significant challenge for conventional electroless systems.

Throughout the fluid processing steps of the invention, the substrate position may be varied. More particularly, the vertical position of the substrate with respect to the fluid diffusion member 405 may be varied. The distance from the fluid diffusion member 405 may be increased to lower the temperature of the substrate, for example, during processing if desired. Similarly, the proximity of the substrate to the fluid diffusion member 405 may be decreased to increase the temperature of the substrate during processing.

Another advantage of embodiments of the invention is that the system 100 may be used with compatible or incompatible chemistries. For example, in a processing sequence that utilizes incompatible chemistries, e.g., acidic activation solutions and basic plating solutions, the acidic solutions will generally be exclusively used in one cell or station, while the basic solutions are exclusively used in another cell. The cells may be adjacently positioned and substrates may be transferred between the respective cells by one of the shuttles 305. The substrates are generally cleaned in each cell prior to being transferred to the adjacent cell, which prevents chemistry from one cell from contaminating another cell. Additionally, the multiple processing locations within each processing station or cell, e.g., the positioning of catch rings 418, 419 allows for the use of incompatible chemistries in a single cell or station, as the respective chemistries may be collected by different catch rings 418, 419 and kept separate from each other.

Embodiments of the invention may also be configured as single use-type chemistry cells, i.e., a single dose of the process chemistry may be used for a single substrate and then discarded without solution reclamation, i.e., without being used to process additional substrates. For example, system 100 may utilize common cells to activate, clean, and/or post process a substrate, while using other cells to conduct an electroless deposition and/or post-deposition cleaning process. Since each of these processes may utilize a different chemistry, the cell is generally configured to supply each of the required chemistries to the substrate when needed and drain the used chemistry therefrom once the process is completed. However, the cells are generally not configured to recapture the chemistries, as substantial contamination issues are presented by recapturing different chemistries from the single cell.

Additional processing cells that may be used in embodiments of the present invention may be found in commonly assigned U.S. Pat. No. 6,258,223, entitled "In-Situ Electroless Copper Seed Layer Enhancement in an Electroplating System", issued on Jul. 10, 2001, and commonly assigned U.S. Pat. No. 6,824,612, entitled "Electroless Plating System", issued on Nov. 30, 2004, both of which are hereby incorporated by reference in their entireties to the extent not inconsistent with the present invention.

Spray Dispense System

FIG. 9 illustrates a cross-sectional side view of one embodiment of a face-up, fluid processing cell 1010, which is similar to the respective stations 402, 404 described above. A substrate 1250 that is oriented face-up is seen in FIG. 9. While the various embodiments illustrated herein illustrate a processing cell 1010 that is configured to complete face-up processing, the orientation of the substrate is not intended to be limiting as to the various aspects of the invention. The term "electroless process" (or electroless deposition process) is meant to generally cover all process steps done to deposit an electroless deposited film onto a substrate including, for example, one or more of the pre-clean process steps (substrate preparation steps), the electroless activation process steps, the electroless deposition steps, and the post deposition cleaning and/or rinsing steps.

The fluid processing cell 1010 includes a cell body 1015. The cell body 1015 may be manufactured from various substances known to be nonreactive with fluid processing (electroless or electrochemical plating) solutions. Such substances include plastics, polymers, and ceramics. In the arrangement of FIG. 9, the cell body 1015 defines a circular or rectangular body forming a side wall for the cell 1010. The cell body 1015 receives and supports a lid assembly 1033 at its upper end. An integral bottom wall 1016 is provided with the cell body 1015 along its bottom end. The bottom wall 1016 has an opening for receiving a substrate support assembly 1299. Features of the substrate support assembly 1299 are described below.

In one embodiment, the substrate support assembly 1299 generally includes a base plate member 1304, and a fluid diffusion member 1302 attached thereto. The substrate support assembly 1299 depicted in FIGS. 9-12, illustrates another embodiment of the platen assembly 403, described above. An annular seal 1121, such as an o-ring type seal, is positioned near the perimeter of the fluid diffusion member 1302. The annular seal 1121 is generally configured to engage the top, outer edge of the base plate member 1304 to create a fluid tight seal between the fluid diffusion member 1302 and the base plate member 1304 to facilitate the fluid delivery process.

The base plate member 1304 generally defines a solid disk shaped member having a fluid inlet 1308 formed through a central portion thereof, or through another location on the base plate member 1304. The base plate member 1304 is preferably fabricated from a ceramic material or a coated metal. A polyvinylidenefluoride (PVDF) material may also be employed. A fluid volume 1310 is formed above the base plate member 1304 and below the fluid diffusion member 1302. In this manner, the fluid diffusion member 1302 is positioned above the base plate member 1304. The fluid volume 1310 may generally have a spacing between the fluid diffusion member 1302 and the base plate member 1304 of between about 2 mm and about 15 mm; however, larger or smaller spacings may be used.

The fluid diffusion member 1302 includes a plurality of fluid passages 1306 formed there through, as discussed above in conjunction with FIGS. 4, 5A-E and 7. When in use a fluid is caused to flow into the sealed fluid volume 1310 from the fluid inlet 1308, then through the fluid passages 1306 formed in the fluid diffusion member 1302, and into the heat transfer region 1312 between the backside of the substrate 1250 and the fluid diffusion member 1302. In one aspect, a fluid heater 1164, is used in conjunction with a controller 111 and temperature probe (not shown), to assure that the temperature of a fluid entering the heat transfer region 1312 from the fluid source 1203 is at a desired temperature. In one aspect, the fluid source 1203 is adapted to deliver deionized (DI) water. The presence of warmed fluid behind the substrate 1250, in turn, warms the back side of the substrate 1250. A uniform and elevated substrate temperature facilitates electroless plating operations. A plurality of heating coils 1112 may optionally be embedded in the base plate member 1304, and may be individually controlled, if desired, to more accurately control the DI water temperature flowing into the heat transfer region 1312 and thus the substrate temperature during processing. More particularly, individual control over the heating coils 1112 allows for precise control over the substrate surface, which is important to electroless plating processes.

Referring to FIG. 9B, an alternative to the heating arrangement described above, the optional heating coils 1112 may be removed from the base plate member 1304, and installed into the fluid diffusion member 1302. To accommodate this redesign, the base plate member 1304 may be thinned, while the geometry of the fluid diffusion member 1302 is increased. As deionized water flows through the fluid inlet 1308, it passes under the heated fluid diffusion member 1302, through the fluid passages 1306, and then into the heat transfer region 1312 between the backside of the substrate 1250 and the fluid diffusion member 1302. In this arrangement, the separate fluid heater 1164 may optionally be removed. It should be added that the fluid passages 1306 may be configured to direct DI water against the back side of the substrate 1250. The presence of water on the back side of the substrate 1250 not only warms the substrate 1250, but also prevents electroless fluids from undesirably contacting the back side of the substrate 1250.

The base plate member 1304 and fluid diffusion member 1302 may be manufactured from a ceramic material (such as fully pressed Aluminum Nitride, alumina ($Al_2O_3$), silicon carbide (SiC)), a polymer coated metal (such as Teflon™ polymer coated aluminum or stainless steel), a polymer material, or other material suitable for semiconductor fluid processing. Preferred polymer coatings or polymer materials are fluorinated polymers such as Tefzel (ETFE), Halar (ECTFE), perfluoroalkoxy resin (PFA), PolyTetraFluoroEthylene (PTFE), TetraFluorEthylene-Perfluorpropylene (FEP), PVDF, etc.

A plurality of substrate support fingers 1300 are generally positioned proximate the perimeter of the fluid diffusion member 1302. The substrate support fingers 1300 are configured to support the substrate 1250 at a desired distance above the fluid diffusion member 1302 to form the heat transfer region 1312. A robot blade (not shown) may be inserted below the substrate 1250 and between the substrate support fingers 1300 to lift and remove the substrate 1250 during a substrate removal and/or insertion process. In an alternate configuration a continuous ring (not shown), instead of the substrate support fingers 1300 may be used to support the substrate. In this configuration a lift pin assembly (not shown) may also be employed to lift the substrate from the continuous ring. In this way, the robot blade may again access the bottom of the substrate 1250 so that it may be transported into and out of the cell 1010. The fluid processing cell 1010 further includes a slot 1108. The slot defines an opening formed through the side wall 1015 to provide access for a robot (not shown) to deliver and retrieve the substrate 1250 to and from the cell 1010.

In the cell 1010 configuration of FIG. 9, the substrate support assembly 1299 can be selectively translated axially and rotated about the base plate support 1301 by use of the upper bearing 1054A and the lower bearing 1054B. To these ends, a substrate lift assembly 1060 is first provided. The substrate lift assembly 1060 includes a substrate support assembly motor 1062. In one arrangement, the substrate support assembly motor 1062 is a precision motor that rotates a lead screw 1061. Rotational movement of the support assembly motor 1062 converts to linear motion of a finger slide 1064. The finger slide 1064 rides along a grooved housing 1066 to drive the slide up and down. In this instance, the support assembly motor 1062 is preferably electrically actuated. Alternatively, the substrate support assembly motor 1062 may be a pneumatically actuated air cylinder.

The substrate lift assembly 1060 also includes a substrate support finger motor 1052. The finger motor 1052 rotates the substrate support fingers 1300 and supported substrate 1250. The substrate support fingers 1300 rotate about an axis formed by a non-rotating base plate support 1301. The rotational speed of the substrate support fingers 1300 may be varied according to a particular process being performed (e.g. deposition, rinsing, drying.) In the case of deposition, the substrate support member may be adapted to rotate at relatively slow speeds, such as between about 5 rpm and about 150 rpm, depending on the viscosity of the fluid, to spread the fluid across the surface of the substrate 1250 by virtue of the fluid inertia. In the case of rinsing, the substrate support fingers 1300 may be adapted to spin at relatively medium speeds, such as between about 5 rpm and about 1000 rpm. In the case of drying, the substrate support may be adapted to spin at relatively fast speeds, such as between about 500 rpm and about 3000 rpm to spin dry the substrate 1250.

The base plate support 1301 is mounted to a chamber base or platform 1012 through base members 1013 and 1014. Thus, in the preferred embodiment, the base plate member 1304 is not translated by the substrate lift assembly 1060, but serves as a guide for the substrate support fingers 1300. Upper bearing 1054A and lower bearing 1054B are provided to enable such support. The base plate support 1301 also acts as a conduit for electrical wires (not shown) and the fluid inlet 1308 fed by a tube 1166. Wires and tubing are passed through the base plate conduit 1305 in the base member 1014.

FIG. 9A presents a cross-sectional side view of the face-up, electroless processing chamber of FIG. 9. In this view, the substrate lift assembly 1060 is in its raised position. The substrate 1250 is lifted away from the surface of the base plate member 1304 to allow processing at the ambient temperature of the fluid processing cell 1010, since the substrate is not warmed by the fluid that is in contact with the fluid volume 1310 and base plate member 1304. This is also the position the substrate 1250 will typically be placed in prior to the robot coming in to pick-up a processed substrate 1250.

The fluid processing cell 1010 also includes a fluid inlet system 1200. The fluid inlet system 1200 operates to deliver various processing fluids (e.g., solution source 1202, solution source 1204, and solution source 1206, etc.) to the receiving surface of a substrate 1250. The number of processing fluids that can be used in the fluid processing cell 1010 will vary depending on the application, and will likely be more than the three as shown in FIG. 9. A metering pump 1208 is provided in connection with each solution sources 1202, 1204, 1206. In addition, a dispense valve 1209 is provided for controlling the release of each solution sources 1202, 1204, 1206 into a respective foreline 1210. Processing fluid from the solution sources 1202, 1204, 1206 are selectively introduced into the cell 1010 from the forelines 1210 through an inlet tubing 1225. As generally depicted in FIG. 9, the dispense valve 1209 can be configured to rinse the foreline 1210 after chemistry has been delivered from the process fluid sources upstream of the dispense valve 1209. In one aspect, the inlet tubing 1225 may be cleared of any residual fluid by the injection of a gas from a gas source 1207 connected to the inlet tubing 1225.

A filter 1162 is optionally incorporated in the fluid inlet system 1200 to prevent particles generated upstream from the filter 1162 from contaminating the fluid processing cell 1010 and ultimately the substrate 1250. In cases where the inlet tubing 1225 needs to be rinsed prior to removing the substrate, or in between process steps, the addition of a filter can greatly increase the time it takes to rinse the line due to the large surface area of the filter membranes and thus may not be used.

In another aspect of the invention, a heater 1161 is incorporated into the fluid inlet system 1200 to heat the fluid before it enters the processing area 1025. The heater 1161 contemplated in this invention can be any type of device that imparts energy into the processing fluid. Preferably the heater 1161 is a jacketed type resistive heater (e.g., heater heats the fluid through the wall of the inlet tubing) rather than an immersion type heater (e.g., heater element touches the solution). The heater 1161, used in conjunction with a controller 111, can be utilized to assure that the temperature of the processing fluid entering the processing area 1025 of the fluid processing cell 1010 is at a desired temperature.

In another aspect of the invention, the heater 1161 is a microwave power source and flow through microwave cavity used to rapidly impart energy into the processing fluid. In on embodiment the microwave power source is run at 2.54 GHz at a power from about 500 W to about a 2000 W. In one embodiment of an in-line microwave cavity heater, increases the temperature of the various solutions (e.g., cleaning chemistry, rinse solution, and post clean solution) up to an optimal level immediately before entering the processing cell. In one embodiment, two or more separate microwave heaters may be employed to selectively heat separate fluids delivered in separate fluid lines coming from the fluid inlet system 1200. Therefore, when in use different fluids delivered from each of the solution sources 1202, 1204, 1206 can be delivered at different temperatures to the surface of the substrate.

In another aspect of the invention, a fluid degassing unit 1170 is incorporated into the fluid inlet system 1200 to remove any trapped or dissolved gas in the processing fluid before it enters the processing area 1025. Since dissolved oxygen tends to inhibit the electroless deposition reactions, oxidize exposed metallic surfaces and affect the etch rate during the electroless cleaning processes the use of the fluid degassing unit can help to reduce any erosion and/or process variability caused by dissolved oxygen present in the in the processing fluids. A fluid degassing unit is generally defined as any unit that can extract dissolved gas from a solution, for example, by use of a gas permeable membrane and a vacuum source. A fluid degassing unit can be purchased, for example, from Mykrolis Corporation of Billerica, Mass.

In one embodiment of the fluid processing cell 1010, as shown in FIGS. 9, 9A and 9B, the fluid inlet system 1200 is adapted to deliver the processing fluid(s) through one or more spray nozzles 1402 to the surface of the substrate 1250. More specifically, processing fluids from the solution sources 1202, 1204, 1206, are selectively delivered to the receiving surface of the substrate 1250 via a fluid delivery arm 1406. A plurality of nozzles 1402 are formed along the fluid delivery arm 1406. The nozzles 1402 receive fluid from the inlet tubing 1225 and direct the processing fluids at the receiving surface of the substrate 1250. The nozzles 1402 may be disposed either at an end of the delivery arm 1406 or along a length of the fluid delivery arm 1406. In the arrangement of FIGS. 9, 9A and 9B, a pair of nozzles 1402 are placed in an equidistantly spaced apart arrangement. In one embodiment, one or more fluid inlet systems 1200 and/or nozzles 1402 are connected to the dispense arm 406 and/or 408 illustrated in FIGS. 3 and 4.

In the configuration of FIG. 9, the fluid delivery arm 1406 has a length that enables a distal end to extend over the center of the substrate 1250. It is preferred that at least one of the nozzles 1402 be positioned at the distal end of the fluid delivery arm 1406. It is also preferred that the fluid delivery arm 1406 be moveable about a dispense arm motor 1404, which is adapted to cause the fluid delivery arm 1406 to pivot to and from the center of the substrate 1250. In FIGS. 9, 9A and 9B, the fluid delivery arm 1406 pivots in response to movement of the dispense arm motor 1404. The dispense arm motor 1404 is preferably disposed behind a guard member 1410 to partially isolate the dispense arm motor 1404 from the chamber processing area 1025.

In one embodiment, the fluid delivery arm 1406 is adapted to not only pivot, but to move axially as well (FIG. 9). FIG. 9B presents a cross-sectional side view of the face-up, electroless processing chamber of FIG. 9, in an alternate embodiment. Here, the fluid delivery arm 1406 is connected to an axial motor 1080 (e.g., a linear motor). Movement of the fluid delivery arm 1406 in an axial direction allows the fluid delivery arm 1406 to be selectively positioned closer to the substrate 1250, if desired.

Figure 10:
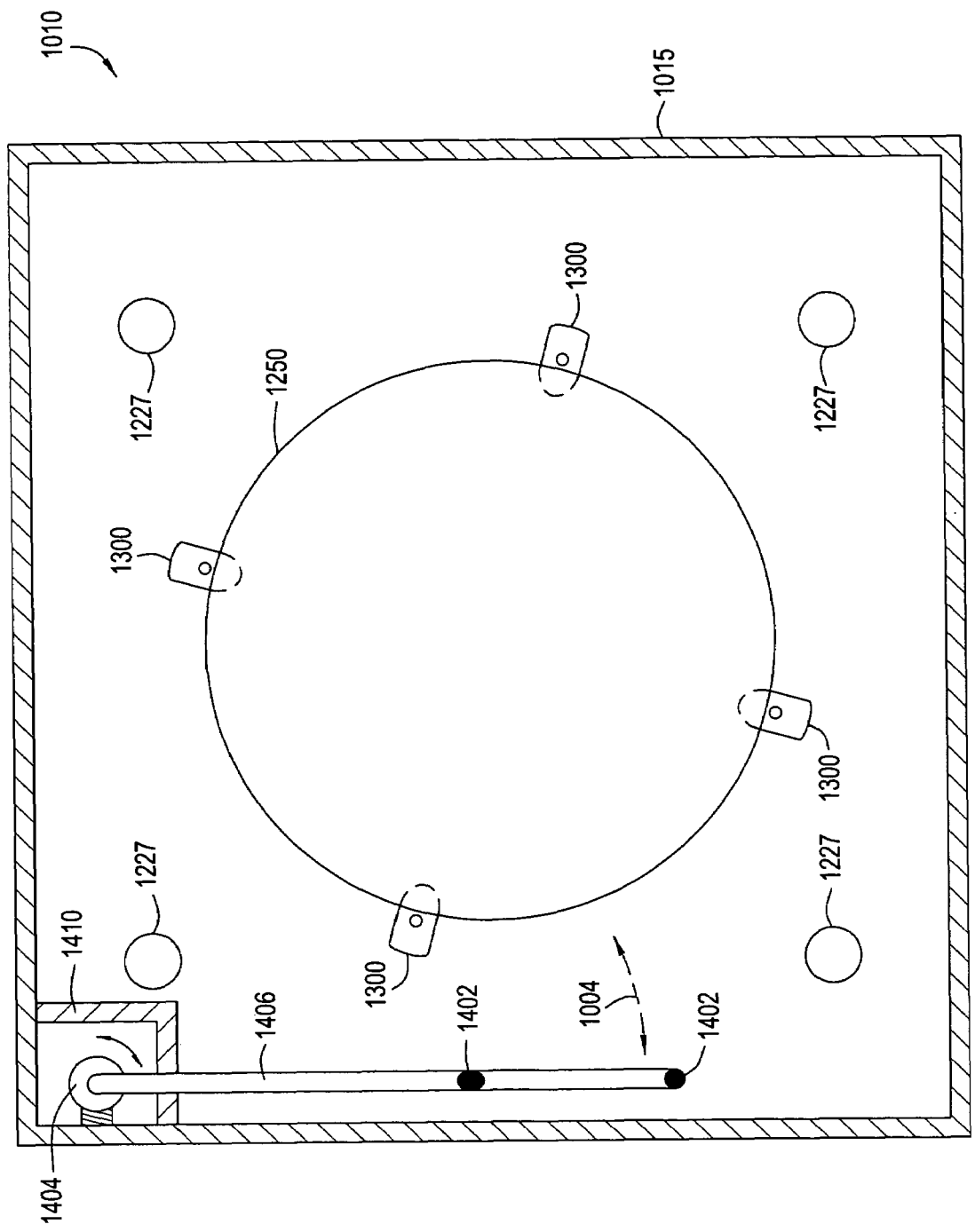
FIG. 10 is a horizontal cross-sectional view of the electroless processing chamber of FIG. 9.

FIG. 10 illustrates a top view of the face-up, electroless processing chamber of FIG. 9. Here, the fluid delivery arm 1406 of the fluid inlet system 1200 is seen relative to a mounted substrate 1250. Four illustrative support fingers 1300 are shown supporting the substrate 1250. The fluid delivery arm 1406 is rotated away from the substrate 1250 in this view. This position allows the substrate 1250 to be lifted using lift fingers 1300 by use of a substrate lift assembly 1060 described above. However, arrow 1004 indicates a rotational movement path for the fluid delivery arm 1406, demonstrating that the fluid delivery arm 1406 may rotate the nozzles 1402 over the substrate 1250 during processing. In one aspect, a rotational movement and/or a vertical movement of the fluid delivery arm 1406 is completed during the process of dispensing the processing fluids on the substrate surface to achieve a uniform or desired distribution of the processing solution across the substrate surface. Rotational and/or vertical movement may be completed by use of the dispense arm motor 1404 and axial motor 1080. Movement of the fluid delivery arm 1406 over the substrate 1250 can help to improve the uniformity and speed of fluid coverage of a desired surface of the substrate 1250. Preferably, the substrate support fingers 1330 and substrate 1250 rotates during dispensation of a fluid from the nozzle 1402 in order to increase fluid distribution uniformity and throughput of the system.

In another embodiment, processing fluids are delivered through one or more nozzles disposed on the fluid delivery arm 1406, which are proximate to the axis of rotation for the substrate, while at the same time, a carrier gas (such as $N_2$ or Argon) is delivered through nozzles disposed on the fluid delivery arm 1406, which are positioned near an outer edge of the substrate. During a fluid delivery operation, the substrate is preferably rotated. The injection of the carrier gas around the edge of the substrate 1250 forms a gas blanket around the processing area 1025. The gas blanket displaces any residual $O_2$ that may linger within the processing region. Those of ordinary skill in the art of electroless deposition processing will appreciate that oxygen can have a detrimental affect on certain process steps, such as the chemical activation step.

Figure 13:
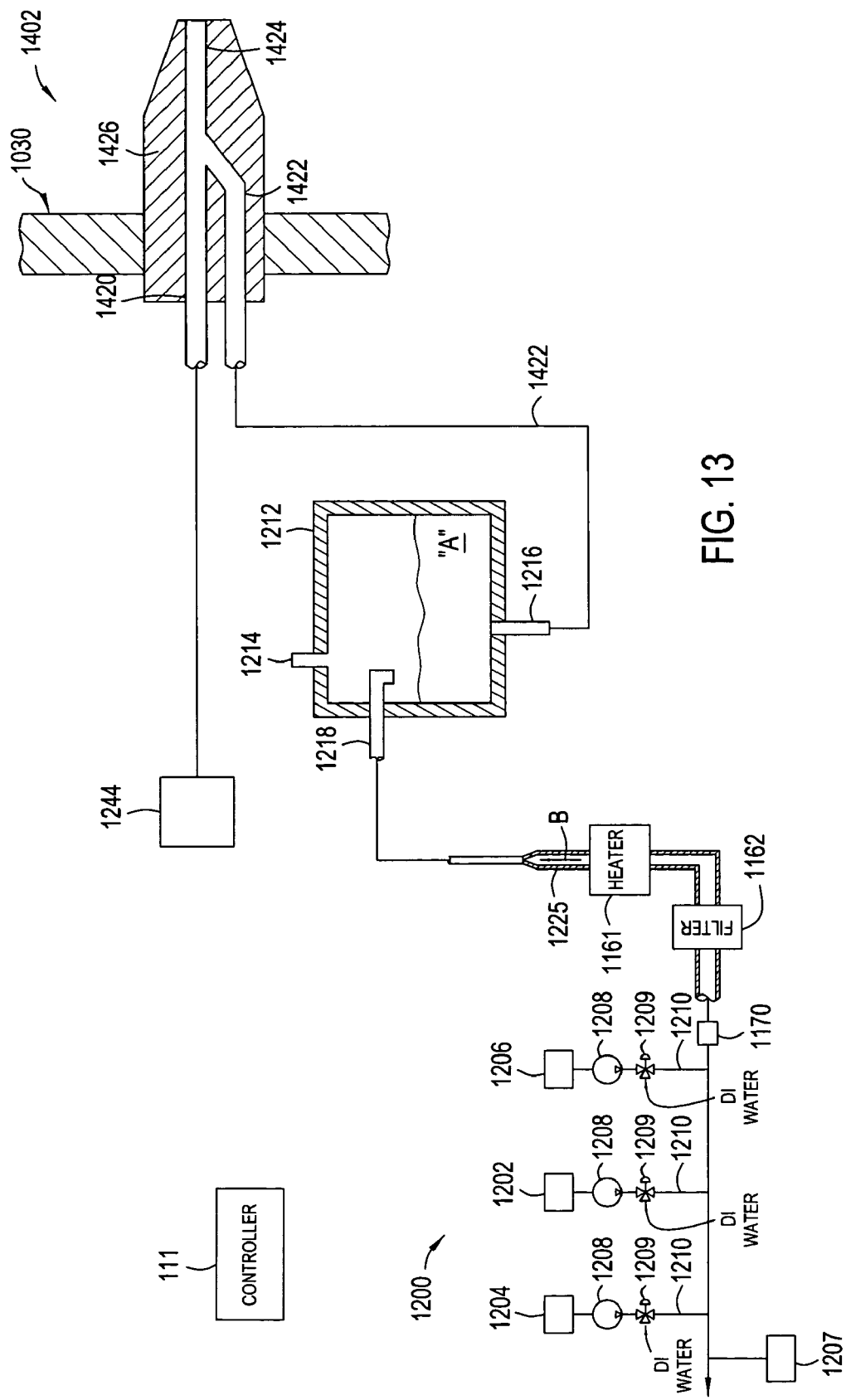
FIGS. 13 and 14 embodiment of processing fluid delivery system including cross-sectional views of two embodiments of nozzles as may be employed in connection with the electroless processing chambers described herein.

In one embodiment, the nozzles 1402 are ultrasonic spray nozzles, or "air atomizing nozzles." FIG. 13 shows a cross-sectional view of an air atomizing nozzle 1402 in one design. This is an internal fluid mix type nozzle. This means that fluids are mixed internally to produce a completely atomized spray, or mist of the processing fluid. In this configuration the carrier gas thus contains small droplets of processing solution which are directed towards the substrate surface. In one embodiment, the carrier gas is an inert gas, such as argon, nitrogen, or helium, which is used to transport an atomized processing fluid to the substrate surface.

In the nozzle design of FIG. 13, the nozzle 1402 includes a body 1426 and a tip 1424. The tip 1424 is generally about 10 μm to about 200 μm in diameter. In one embodiment, the tip 1424 is about 10 μm to about 50 μm in diameter. Fluids are delivered through the tip 1424 due to suction created by a venturi effect created when high pressure gas delivered from the nozzle gas supply 1244. In the arrangement of FIG. 13, the body 1426 provides separate channels 1422, 1420 for receiving separate liquid and gas streams, respectively. The fluid channel 1422 and gas channel 1420 merge at the tip 1424, allowing the two streams to blend. This may be referred to as a "concentric venturi design." In this arrangement, fluid distributed from the nozzle 1402 is pre-mixed to produce a completely atomized spray. The particular tip 1424 design of FIG. 13 produces a round spray pattern. However, it is understood that other tip configurations may be used to produce other spray patterns, such a flat or fan spray pattern.

Figure 14:
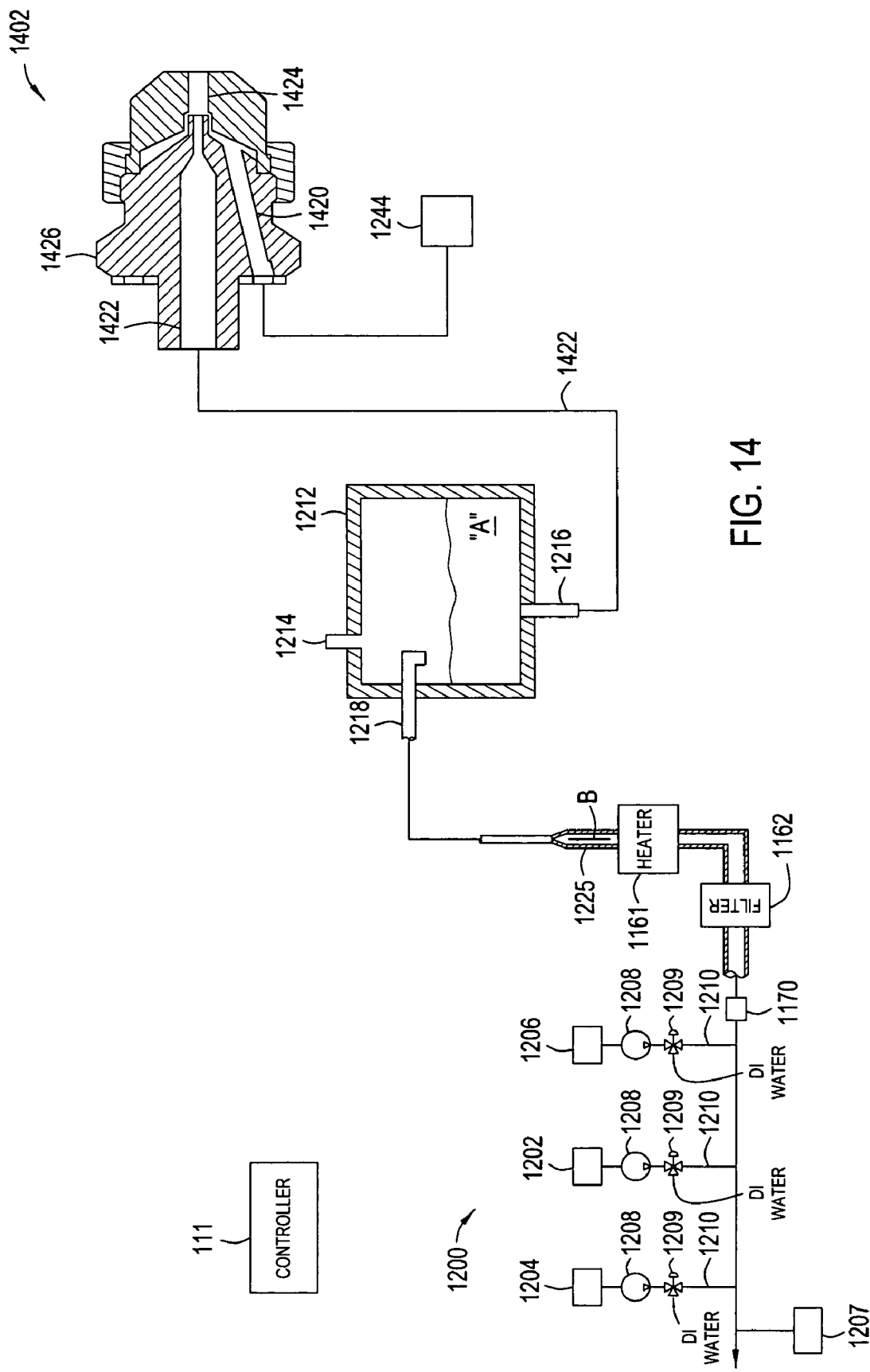

FIG. 14 provides a cross-sectional view of an air atomizing nozzle 1402 in a different design. This is an external fluid mix nozzle. In the nozzle design of FIG. 14, the nozzle 1402 again includes a body 1426 and a tip 1424. The tip 1424 is again generally about 10 μm to about 200 μm in diameter or, in another embodiment, about 10 μm to about 50 μm in diameter. In the arrangement of FIG. 14, the body 1426 again provides separate channels 1422, 1420 for receiving separate liquid and gas streams, respectively. However, in this arrangement the fluid channel 1422 delivers liquid through the nozzle 1402 independently of the gas channel 1420 so that the two streams do not blend within the body 1426, but mix outside of the tip 1424. This may be referred to as a "parallel venturi design." This arrangement has the benefit that gas and liquid flow can be controlled independently, which is effective for higher viscosity liquids and abrasive suspensions. This is in contrast to the internal mix type nozzle 1402, where a change in gas flow will affect the liquid flow.

In one aspect, the use of a conventional ultrasonic nozzle similar to the nozzles of FIGS. 13 and 14 is adapted to produce an atomized mist of the processing fluid that is directed at the receiving surface of a substrate. Direction of mist, as opposed to a liquid stream, serves to conserve the expensive electroless processing fluids. It also provides a more uniform coverage across the receiving surface. Also, a fluid dynamic boundary layer, which is created when the substrate 1250 is rotated by use of the substrate support finger motor 1052, can improve the distribution of the atomized processing fluid on the surface of the substrate 1250, since the shape of the turbulent boundary layer at the surface of a rotating disk is generally flat or parallel to the surface of the substrate in any direction. The boundary layer effect seen by the atomized processing fluid can be an advantage over conventional spray designs, which cause a stream of fluid to impinge the surface of the substrate, since any non-uniform spray patterns created by one or more nozzles may be minimized by the boundary layer's control over the transport of the atomized fluid to the surface of the substrate.

A fluid supply is provided for fluids delivered to the nozzles 1402. In FIGS. 13 and 14, a tank 1212 is shown. The tank 1212 includes a fluid inlet 1218, and a vent 1214. The vent 1214 is in fluid communication with atmospheric pressure. In addition, a fluid outlet 1216 is provided. During fluid delivery, gases from the nozzle gas supply 1244 are delivered to the nozzle 1402 at high velocities. This creates a relative negative pressure in fluid channel 1422 due to communication with atmospheric pressure through vent 1214. Fluids are then urged through the fluid outlet 1216 and into the nozzle 1402.

In general, a processing fluid delivered from the fluid inlet system 1200 may be an activation solution, an electroless deposition solution, and/or a cleaning solution that is dispensed on the substrate surface during processing. In one embodiment, the processing fluid is an activation solution. Examples of activation solutions include palladium salts include chlorides, bromides, fluorides, fluoborates, iodides, nitrates, sulfates, carbonyls, salts of metal acids, and combinations thereof. In one embodiment the palladium salts are chlorides, such as palladium chloride ($PdCl_2$). In another embodiment the palladium salt is a nitrate, alkanesulfonate, or another soluble derivative of $Pd^{+2}$ containing a non-coordinating anion not prone to cluster formation in either the solution or on the metal surface. In one embodiment the queue time (or wait time) between the end when the copper clean solution is applied and the start time of when the activation solution is applied is generally less than about 15 seconds, and preferably less than about 5 seconds. The activation solution generally operates to deposit an activated metal seed layer on to the exposed copper of the exposed features. Oxidation of the exposed portion of the copper layer after cleaning thereof may be detrimental to subsequent process steps, since copper oxides are known to have a higher electrical resistivity than copper. The short queue time between copper clean and activation minimizes oxidation, while the use of a carrier gas environment around the fluid processing cell may also help to prevent oxidation of the exposed portion of the copper layer, as described above.

In one embodiment the processing fluid is an electroless deposition solution. In one embodiment, an electrolessly deposited capping layer is deposited which is an alloy containing CoP, CoWP, CoB, CoWB, CoWPB, NiB, or NiWB, and preferably includes CoWP or CoWPB. The electroless deposition solution used to form the capping layer may include one or more metal salts and one or more reducing agents, depending of the capping layer material to be deposited. The electroless deposition solution may also include pH adjusters, such as acids or bases, as is generally known in the art. When the selected capping layer contains cobalt, the electroless deposition solution generally includes a cobalt salt. Examples of cobalt salts include chlorides, bromides, fluorides, acetates, fluoborates, iodides, nitrates, sulfates, salts of other strong or weak acids, and/or combinations thereof. Preferably, the cobalt salt includes cobalt sulfate, cobalt chloride or combinations thereof. If a tungsten-containing capping material is to be deposited, the electroless deposition solution includes a tungstate salt. Preferably, the tungstate salt includes a salt of tungstic acid, such as ammonium tungstate or tetramethyl ammonium tungstate, or may be generated through the neutralization of the tungstic acid. If a nickel-containing capping material is to be deposited, the electroless solution generally includes a nickels salt. Examples of nickel salts include chlorides, bromides, fluorides, acetates, fluoborates, iodides, nitrates, sulfates, carbonyls, salts of strong or weak acids, and/or combinations thereof.

When the selected capping layer material includes phosphorus, such as CoP, CoWP, or CoWPB, the reducing agent preferably includes a phosphorus compound, such as the hypophosphite anion ($H_2PO_2$). If the capping material includes boron, such as CoB, CoWB, CoWPB, the reducing agent generally includes a boron compound, a dimethylamine-borane (DMAB), a non-alkali metal salt of a borohydride ($BH_4^-$) anion, or combinations thereof. Other reducing agents may also be used in addition to or alternatively with the reducing agents above, such as hydrazine. In one embodiment a borane co-reducing agent is used for processes that are initiated on copper.

As noted, the electroless deposition solution (processing fluid) and/or the substrate may be heated to a temperature. Exemplary temperatures are between about 40° C. and about 95° C. In one aspect, heating the electroless deposition solution and/or the substrate structure increases the electroless deposition rate. This helps offset temperature drop experienced by the processing fluid when it exits the nozzles 1402. In one embodiment, the deposition rate of the capping material is about 100 Å/min or more. In one embodiment, the capping material is deposited to a thickness between about 100 Å and 300 Å, preferably about 150 Å to about 200 Å. However, it is desirable to maintain the temperature across the substrate at a uniform temperature, as the deposition rate of an electroless process is known to be dependent upon temperature. As such, heating coils 1112 of base plate member 1304 illustrated in FIG. 9 and/or the heater 1164 may be used.

The fluid processing cell 1010 also includes a fluid outlet system 1240. The fluid outlet system 1240 generally contains an outlet line 1227 that is connected to a fluid drain 1249. Optionally, more than one outlet line 1227 may be disposed about the cell 1010 in order to more evenly draw fluids through the cell 1010. In FIG. 10, it can be seen that four generally equidistantly spaced outlet lines 1227 are provided. The multiple outlet lines 1227 may be tied to a single exhaust plenum and fluid drain 1249. The fluid drain 1249, in turn, delivers the chamber effluent to a waste collection drain (not shown). In summary, the processing fluids will generally flow through the inlet tubing 1225 then through the nozzles 1402 mounted on the fluid delivery arm 1406 and then outward through the processing area 1025 towards the substrate 1250 and then out the one or more fluid lines 1227.

The fluid outlet system 1240 includes a gas exhaust. An exhaust inlet 1246 extends through the side wall 1015. An exhaust system 1248 pulls gases out of the processing area 1025. In one embodiment, the exhaust inlet 1246 is a ring/plenum which draws in gas evenly below the surface of the substrate 1250 to improve the gas flow near the surface of the substrate 1250.

Figure 11:
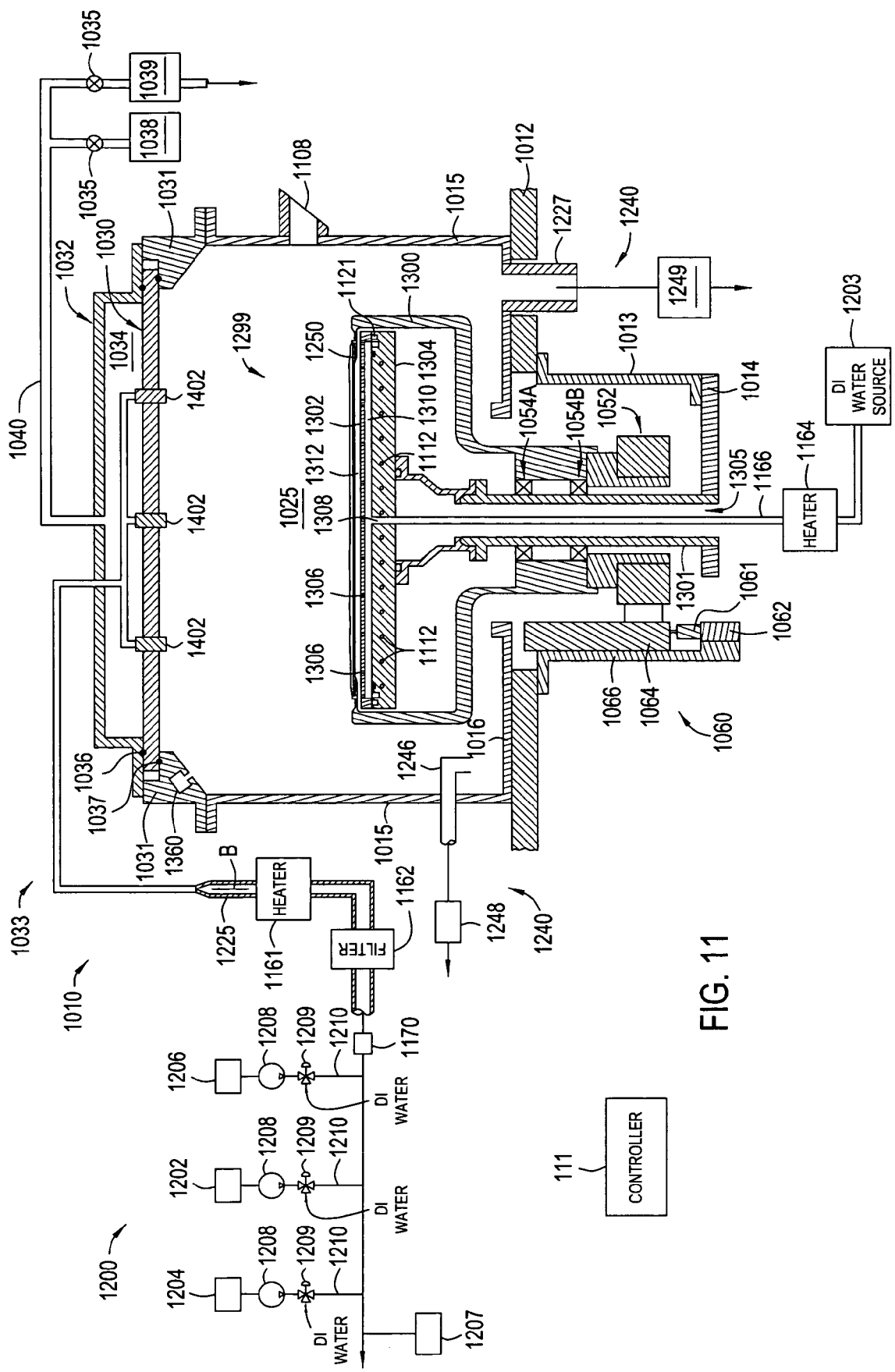
FIG. 11 is a vertical cross-sectional view of an alternate embodiment of an electroless processing chamber.

FIG. 11 provides a cross-sectional side view of a face-up, fluid processing cell 1010, in an alternate embodiment. A fluid intake system 1200 is again provided for delivering fluids to the receiving surface of a substrate 1250. Processing fluids are again delivered through one or more nozzles 1402. However, in this embodiment, the nozzles 1402 are disposed in a porous plate 1030 within the chamber lid assembly 1033.

Referring to FIGS. 9, 9A-B, 11 and 11A-B, the chamber lid assembly 1033 first includes a porous plate 1030. Preferably, the porous plate 1030 a plate that has holes, or pores, formed therein to permits a fluid to move there through. Exemplary materials for the porous plate include ceramic materials (e.g., alumina), polyethylene (PE), and Polypropylene, PVDF, with pores formed or holes fabricated therein to permit fluid communication. In one embodiment a HEPA filter arrangement may be employed. Generally, HEPA filters utilize glass fiber rolled into a paper-like material. The porous plate 1030 in FIGS. 9, 9A-B, 11 and 11A-B is supported by an upper support ring 1031. The chamber lid assembly 1033 next generally includes a lid 1032, the upper support ring 1031, and the porous plate 1030. The lid 1032 forms a plenum 1034 in the volume between the lid assembly 1033 and the porous plate 1030. In one aspect, the porous plate 1030 is sealed to the lid 1032 by use of two o-ring seals (elements 1036 and 1037). The lid 1032 is supported in the arrangement of FIG. 11 by both the porous plate 1030 and the upper support ring 1031.

In one embodiment of the lid assembly 1033, as shown in FIG. 11, the processing solution is delivered to the substrate 1250 from the solution sources 1202, 1204, 1206 through inlet tubing 1225 that extends through the lid 1032, and then manifolds to the one or more nozzles 1402 in the porous plate 1030, which direct the processing solution at the substrate surface. In one aspect, to provide uniform flow of gas in the processing region 1025 a line 1040 is used to provide a flow path to deliver a gas from a gas supply 1038 through the plenum 1034 and porous plate 1030, and into the processing region 1025. Valves 1035 are adapted to selectively open and close fluid communication between the plenum 1034 and gas supply 1038. In one aspect, the gas supply 1038 provides an inert gas, such as argon, nitrogen, helium, or combination thereof, to the processing region 1025. In another aspect, the gas supply 1038 provides an oxygen containing gas to the processing region 1025. It should be noted that oxygen is not objectionable in some phases of the electroless deposition processes, for example, oxygen may be added during the activation step. In this configuration, it may be preferable to form or deliver a carrier gas that contains hydrogen and oxygen at a desired ratio into the processing region 1025 through the porous plate 1030.

The plenum 1034 and porous plate 1030 are positioned above the substrate 1250 to allow a laminar flow of the carrier gas to be delivered over the substrate 1250. The laminar gas flow creates a uniform and perpendicular gas flow onto the substrate 1250. In this way, a uniform boundary layer is provided along the radius of the substrate 1250. This, in turn, allows for a more uniform heat loss across the wafer radius, and serves to reduce condensation of water and chemical vapors above and on the wafer. The porous plate 1030 acts as a gas flow diffuser. The gas flowing through the porous plate 1030 can thus help direct and evenly distribute the processing fluid mist flowing from the nozzles 1402 onto the receiving surface of the substrate 1250. Finally, gas is exhausted through an exhaust inlet 1246 by exhaust system 1248. The exhaust system 1248 may generally contain an exhaust fan or vacuum pump to draw gas from the fluid processing cell 1010. It is noted that the exhaust inlet 1246 helps to assure that the gas flow past the substrate 1250 is laminar.

In one embodiment, a heating element (not shown) is placed in the lid assembly 1033 proximate the plenum 1034. For example, heating coils (not shown) may be disposed within the porous plate 1030. This provides for heating of the gases delivered from line 1040, which in turn minimizes condensation and droplets formation above the substrate 1250.

In one embodiment, the line 1040 is connected to the fluid inlet system 1200 to allow a fluid (e.g., processing fluids), instead of gas, to be pushed through the porous plate 1030. In this way, the porous plate 1030 would act like a showerhead to deliver processing fluid to the surface of the substrate 1250.

In one embodiment, the line 1040 may serve as a fluid delivery line and also as a fluid removal line by the creation of a vacuum pressure in the plenum 1034 by use of a vacuum source 1039. The vacuum source 1039 may be used to prevent dripping of any fluid residing on the porous plate 1030 just before transferring the substrate 1250 out of the cell 1010. In this respect, the vacuum source 1039, such as a vacuum venturi, is actuated to create a vacuum in the plenum 1034, which, in turn, causes any fluid on the lower surface of the porous plate 1030 to be "sucked up" into the plenum 1034.

Figure 11A:
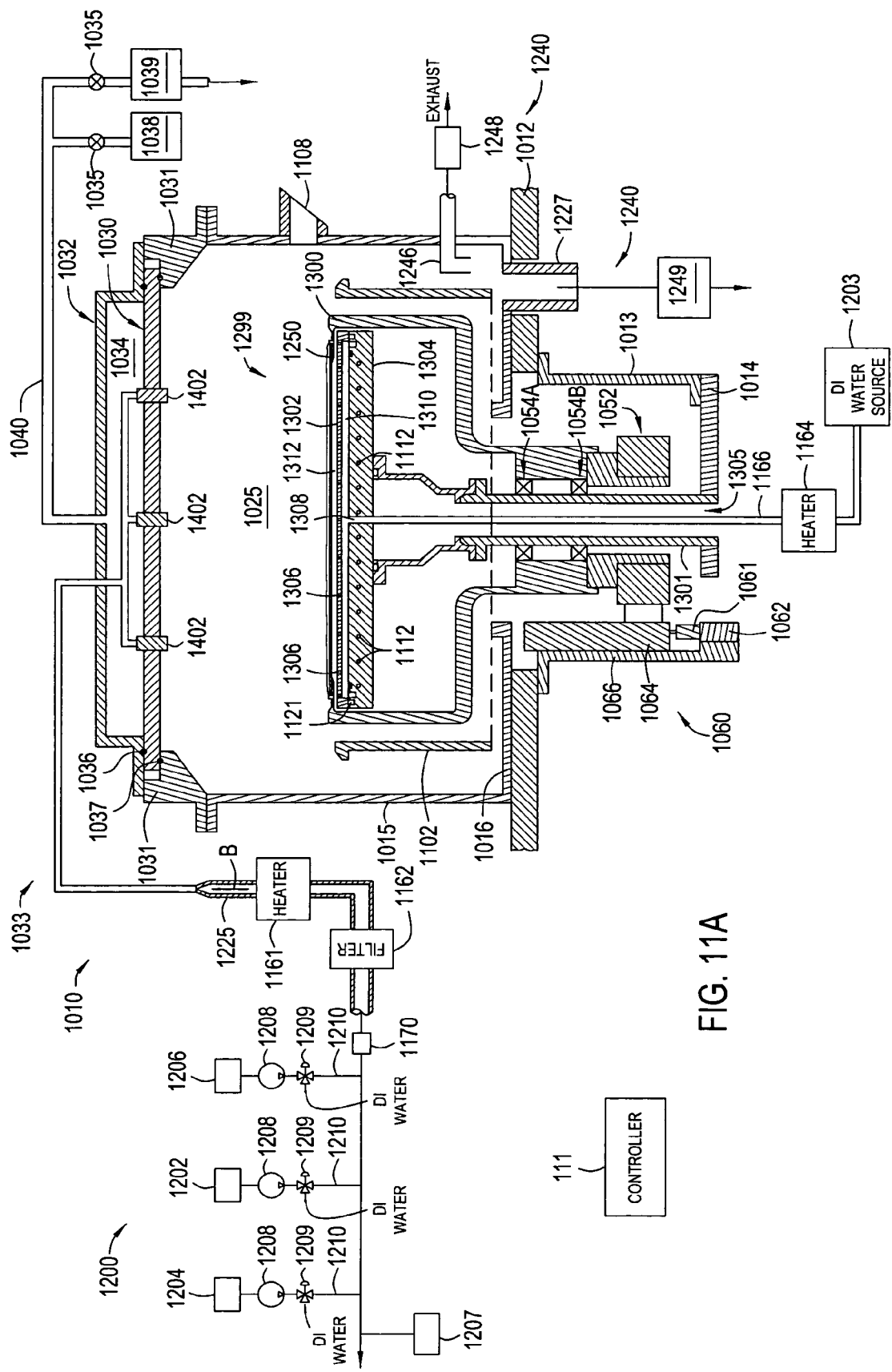
FIG. 11A is a cross-sectional view of the electroless processing chamber of FIG. 11, with a gas flow diverter positioned within the chamber.

FIG. 11A presents a cross-sectional side view of the face-up, electroless processing chamber of FIG. 11. In this view, a gas flow diverter 1102 is provided within the cell 1010. The gas flow diverter 1102 is selectively raised and lowered by use of a conventional lift mechanism (not shown). As illustrated in FIG. 11A, the gas flow diverter 1102 is in its lowered position, which can allow the substrate 1250 to be transferred in and/or out of the fluid processing cell 1010.

Figure 11B:
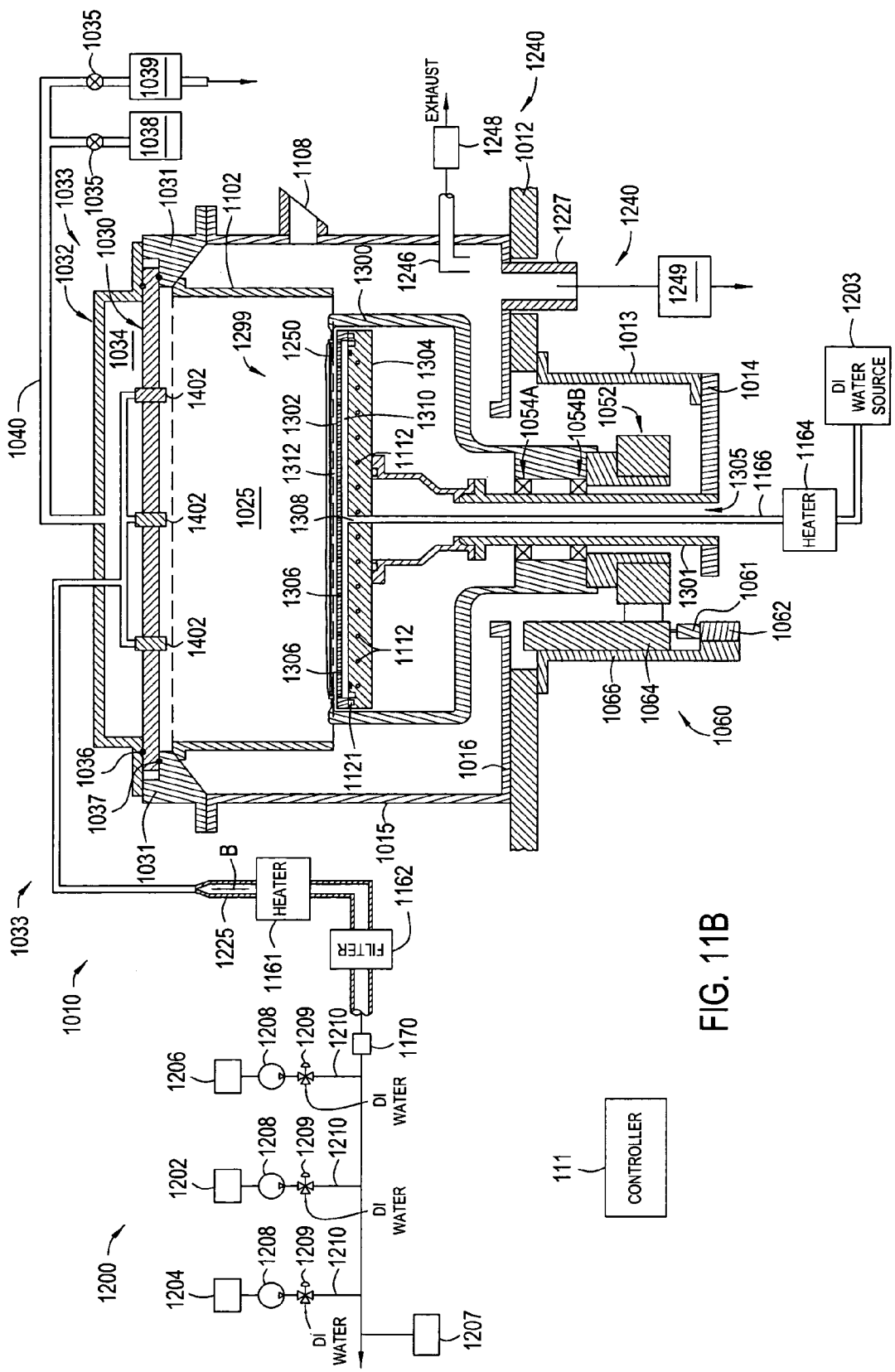
FIG. 11B is another vertical cross-sectional view of the electroless processing chamber of FIG. 11A, with the gas flow diverter in its raised position.

FIG. 11B shows another cross-sectional view of the face-up, electroless processing chamber of FIG. 11 that has a gas flow diverter 1102. Here, the gas flow diverter 1102 is in its raised position, so that it can be used to "straighten" and/or direct the flow of processing solution (e.g., processing solution mist) as it passes from the nozzles 1402 and the flow of gas as it passes from the gas supply 1038 and porous plate 1030 towards the substrate 1250 during processing. The gas flow diverter 1102 is thus used to improve the processing fluid and gas flow pattern repeatability and particle performance during processing, by limiting the number of obstructions and controlling the flow pattern of the arriving fluid.

It is desirable to provide a means to visually inspect the progress of fluid being dispensed on the substrate 1250 external to the cell 1010. In the arrangement of FIG. 11, a camera 1360 is provided inside the cell 1010. The camera may be disposed along the side wall 1015, under the porous plate 1030, along the upper support ring 1031, or any other place where adequate visualization of the substrate 1250 may be acquired. Preferably, the camera 1360 is placed on a stationary portion of the lid. In the embodiment of FIG. 11, the camera 1360 is affixed to the upper support ring 1031. The camera 1360 is preferably a charge coupled display camera ("CCD camera") that is in communication with the controller 111 and employs a series of pixels to record a digital image. A monitor (not shown) is set up external to the cell 1010 to provide optical visualization of the surface of the substrate 1250. In this way, visual confirmation may be provided as to the timing and adequacy of coverage of the electroless processing fluids of the substrate 1250 during the processing fluid dispense process or during the deposition process.

To aid the camera 1360, it may be desirable to provide a light source (not shown). The light source would also preferably be placed on a stationary portion of the lid; however, it may be positioned at any position adjacent the processing area 1025. The light source serves to illuminate the substrate 1250 during processing. In one aspect, the camera 1360 is used to detect light in the visible spectrum.

The visual confirmation is preferably provided through human monitoring. However, in one arrangement the visual confirmation process is provided through a machine vision control type process. In this arrangement, the image of an adequately covered substrate 1250 is programmed into a controller 111 (see element 111 above). In one aspect, the controller 111 then monitors the pixel images generated by the camera 1360 during a fluid dispensing process and compares the images to prerecorded images or other data so that various decisions about the process can be made by the controller 111. For example, the fluid dispensing process is not allowed to "time out," or end, at least until the actual substrate image detected by the pixels in the camera 1360 matches the prerecorded image.

In one aspect, the camera 1360 is an infrared camera. The infrared camera would filter out visual wavelengths, but recognize thermal wavelengths. A difference in temperature, which can be translated to color or intensity of the detected signal, within the detected image, as an indication of temperature differentials in the subject, i.e., the substrate 1250. Where the fluid being dispensed is at a temperature different than the surface of the substrate 1250, a temperature differential will be recorded as a color differential. Fluid dispensing would continue until the temperature differential disappears, providing an indication of complete coverage of the substrate 1250. Preferably, the temperature differential would again be monitored through machine vision type control created by use of the controller and camera 1360. Therefore, complete coverage of the substrate can be assured.

In another aspect, the camera 1360 can be a spectrometer used to receive incoming light and to output data indicating the various light wavelengths and their intensity. For example, a red light would have greater light component intensities grouped within the lower wavelengths of the visible spectrum. The spectrometer typically includes an optical prism (or grating) interface to optically split the incoming signal into its components, which in turn is projected onto a linear CCD detector array. One embodiment of a spectrometer may comprise a CCD detector array comprising thousands of individual detector elements (e.g., pixels) to receive the resultant spectrum from the prism (or grating). Collecting the intensity versus wavelength data the controller 111 which is in communication with the camera 1360 could then compare the currently received information with past or user defined values so that the electroless deposition process steps and process variables (e.g., fluid coverage, processing time, substrate temperature, substrate rotation speed) can be controlled to optimize the process results.

In one arrangement, the camera 1360 may operate under closed loop control with software optimization of the motion of the fluid delivery arm 1406 and flow regime from the chemical nozzles 1402 to ensure that the surface of the substrate 1250 has continuous chemical coverage. The closed loop control can be performed by use of the camera 1360, the dispense arm motor 1404, and components in the fluid inlet system 1200, which are all connected and controlled by the controller 111.

Figure 12:
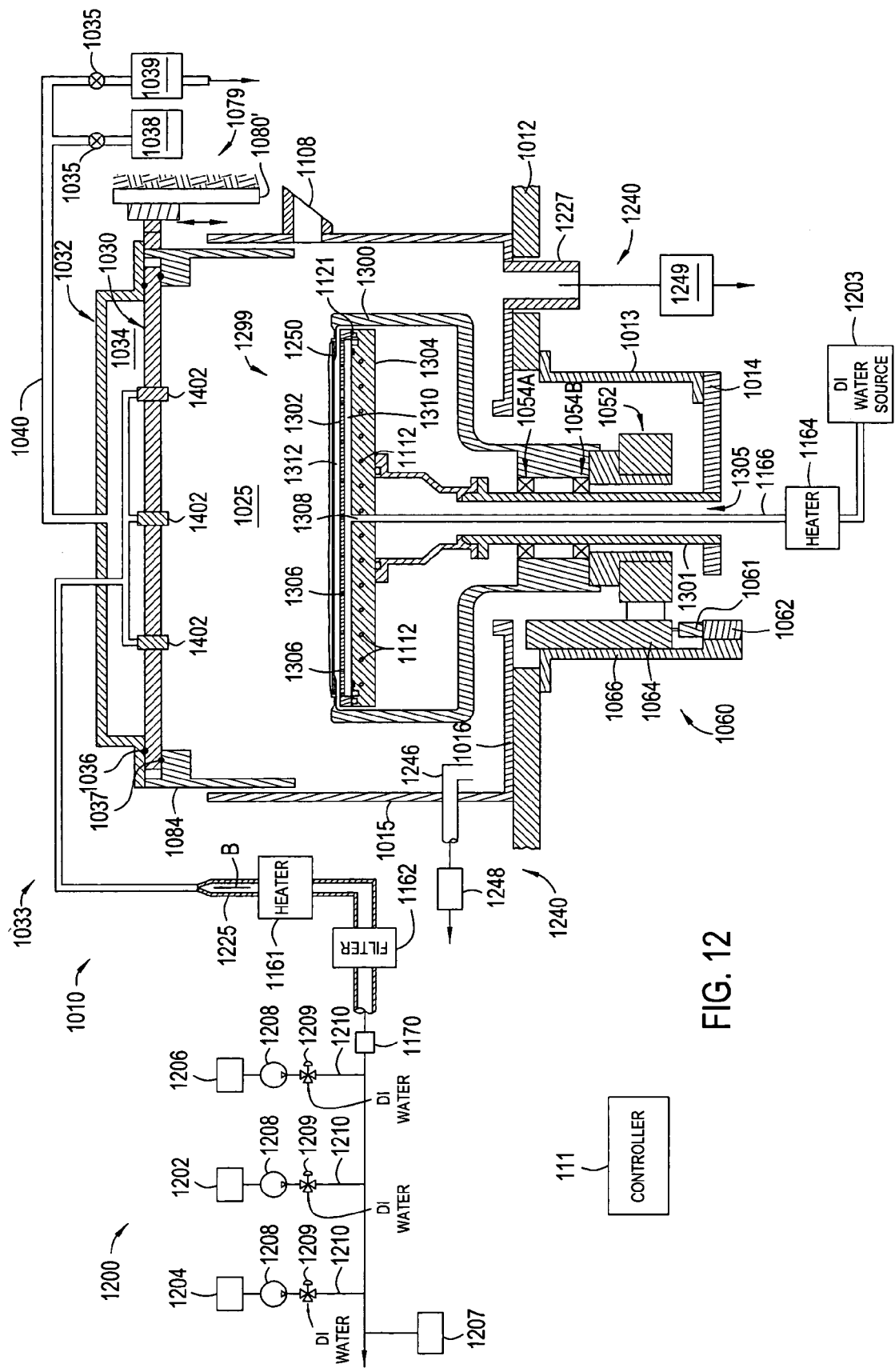
FIG. 12 is a vertical cross-sectional view of another embodiment of an electroless processing chamber, in which the chamber lid assembly is moveable.

FIG. 12 presents a cross-sectional view of a face-up, fluid processing cell 1010, in yet an additional alternate embodiment. Here, processing fluids are again applied to a receiving surface of a substrate 1250 by spraying fluids through nozzles 1402 disposed in a porous plate 1030. In this embodiment, the porous plate 1030 is selectively raised and lowered relative to the substrate 1250. More specifically, the chamber lid assembly 1033 moves axially relative to the substrate 1250. To accomplish this axial movement, a chamber lid lift assembly 1079 is employed. A chamber lid actuator (schematically represented by item 1080'), which is connected to chamber lid assembly 1033, may be used as part of the chamber lid lift assembly 1079. The actuator 1080' is preferably an electric actuator, and in one embodiment, is a linear DC servo motor. However, the actuator 1080' may alternatively be a pneumatically actuated air cylinder. In this configuration, by actuating the motor 1080', the chamber lid lift assembly 1079 controls the volume of the processing area 1025 between the porous plate 1030 and the substrate 1250 there below. Such an arrangement is useful to control the gas flow and oxygen level near the surface of the substrate 1250.

The various embodiments for a face up electroless plating cell described above have been described in the context of processing a substrate 1250. However, it is noted that during some maintenance activities it may be desirable to operate the processing cell 1010 without a substrate on the support fingers 1300 (or support ring). More specifically, the fluid inlet system 1200 and the fluid outlet system 1240 may be operated without placement of the substrate within the processing region 1025. For example, deionized water or other cleaning or rinsing fluid may be injected through a fluid delivery arm (such as fluid delivery arm 1406 of FIG. 9) or a fluid delivery plate (such as porous plate 1030 of FIG. 11) and onto the substrate support fingers 1300 and other chamber components. This step may be completed to clean the substrate support fingers 1300 and other chamber parts to reduce particle levels in the processing cell 1010. To further aid in this cleaning step, the fluid delivery arm may be lowered (FIG. 9B), the fluid delivery head may be lowered (FIG. 12) or the substrate support assembly may be raised (FIG. 9A).

While the foregoing is directed to embodiments of the present invention, other and further embodiments of the invention may be devised without departing from the basic scope thereof, and the scope thereof is determined by the claims that follow.

We claim:

1. A processing chamber having a processing region adapted to process a substrate, comprising:
   a platen assembly positioned in the processing region, the platen assembly comprising:
      a base plate member having a fluid aperture formed therethrough;
      a substantially disk shaped fluid diffusion member sealably positioned to the base plate member and having an upstream side and a downstream side, wherein the substantially disk shaped fluid diffusion member has a plurality of fluid passages in fluid communication between the upstream side and the downstream side;
      a fluid volume formed between the base plate member and the upstream side of the substantially disk shaped fluid diffusion member;
      a raised portion protruding a first distance above the downstream side of the diffusion member; and
   a rotatable substrate support assembly positioned in the processing region and having a substrate supporting surface, wherein the rotatable substrate support is coupled to the platen assembly and is adapted to rotate relative to the platen assembly.

2. The processing chamber of claim 1, wherein the substantially disk shaped fluid diffusion member has an outer edge and a surface of the raised portion is coincident with the outer edge of the substantially disk shaped fluid diffusion member.

3. The processing chamber of claim 1, wherein the first distance is between about 0.5 mm and about 25 mm.

4. The processing chamber of claim 1, wherein the substantially disk shaped fluid diffusion member has an upstream surface and a downstream surface, and the downstream surface of the substantially disk shaped fluid diffusion member has a surface roughness ($R_a$) of between about 1.6 µm to about 20 µm.

5. A processing chamber having a processing region adapted to process a substrate, comprising:
   a platen assembly positioned in the processing region, the platen assembly comprising:
      a base plate member having a fluid aperture formed therethrough;
      a substantially disk shaped fluid diffusion member sealably positioned to the base plate member and having a upstream side and a downstream side;
      a fluid volume formed between the base plate member and the upstream side of the substantially disk shaped fluid diffusion member; and
      a plurality of fluid passages formed in the substantially disk shaped fluid diffusion member, wherein the plurality of fluid passages are in fluid communication between the downstream side and the upstream side of the substantially disk shaped fluid diffusion member and at least one of the plurality of fluid passages further comprise:
         a first portion that is in fluid communication with the upstream side and has a first cross-sectional area; and
         a second portion having a second cross-sectional area different than the first cross-sectional area, wherein the first portion and the second portion are in fluid communication; and
   a rotatable substrate support assembly positioned in the processing region and having a substrate supporting surface, wherein the rotatable substrate support is coupled to the platen assembly and is adapted to rotate relative to the platen assembly.

6. The processing chamber of claim 5, wherein the second cross-sectional area is larger than the first cross-sectional area.

7. The processing chamber of claim 5, wherein the plurality of fluid passages comprises:
   an array of at least four fluid passages that are substantially evenly distributed across the downstream side; and
   an annular shaped feature protruding a first distance above a downstream surface of the substantially disk shaped fluid diffusion member, wherein the first distance is between about 0.5 mm and about 25 mm.

8. The processing chamber of claim 5, wherein the plurality of fluid passages comprises an array of fluid passages arranged in a square, rectangular, radial or hexagonal close packed orientation.

9. The processing chamber of claim 5, wherein at least two or more of the plurality of fluid passages further comprise a first cylindrical shape for a portion of its length extending from the upstream side and a second cylindrical shape that is in fluid communication with the first cylindrical shape, wherein the second cylindrical shape has a cross-sectional area larger than the first cylindrical shape.

10. A processing chamber having a processing region adapted to process a substrate, comprising:
a platen assembly positioned in the processing region, the platen assembly comprising:
a base plate member having a fluid aperture formed therethrough;
a substantially disk shaped fluid diffusion member sealably positioned to the base plate member and having an upstream side and a downstream side, wherein the substantially disk shaped fluid diffusion member has a plurality of fluid passages in fluid communication between the upstream side and the downstream side;
a fluid volume formed between the base plate member and the upstream side of the substantially disk shaped fluid diffusion member;
a raised portion protruding a first distance above the downstream side of the diffusion member; and
a rotatable substrate support assembly positioned in the processing region and having a substrate supporting surface, wherein the rotatable substrate support is coupled to the platen assembly and is adapted to rotate relative to the platen assembly, wherein the rotatable substrate support assembly has one or more substrate supporting surfaces, and the processing chamber further comprises:
an edge dam positioned in the processing region and having a first surface, wherein the edge dam and/or a substrate positioned on the one or more substrate supporting surfaces may be positioned to form a gap between the first surface of the edge dam and an edge of the substrate; and
a fluid source positioned to deliver an electroless processing solution to a surface of a substrate positioned on the substrate support.

11. The processing chamber of claim 10, wherein the fluid source further comprises a fluid heater in thermal communication with the electroless processing solution delivered from the fluid source.

12. The processing chamber of claim 10, wherein the edge dam further comprises a lift assembly that is adapted to position the edge dam relative to a surface of the substrate positioned on the one or more substrate supporting surfaces.

13. A processing chamber having a processing region adapted to process a substrate, comprising:
a platen assembly positioned in the processing region, the platen assembly comprising:
a base plate member having a fluid aperture formed therethrough;
a substantially disk shaped fluid diffusion member sealably positioned to the base plate member and having an upstream side and a downstream side, wherein the substantially disk shaped fluid diffusion member has a plurality of fluid passages in fluid communication between the upstream side and the downstream side;
a fluid volume formed between the base plate member and the upstream side of the substantially disk shaped fluid diffusion member;
a raised portion protruding a first distance above the downstream side of the diffusion member; and
a rotatable substrate support assembly positioned in the processing region and having a substrate supporting surface, wherein the rotatable substrate support is coupled to the platen assembly and is adapted to rotate relative to the platen assembly, wherein the rotatable substrate support assembly has one or more substrate supporting fingers that each have a substrate supporting surface, and the processing chamber further comprises:
a bowl assembly positioned in the processing region and having one or more walls that form the fluid volume, wherein the fluid volume is sized to allow the one or more substrate supporting features to be immersed in a fluid positioned in the fluid volume; and
a fluid source in fluid communication with the fluid volume and a substrate that is positioned on the one or more substrate supporting surfaces.

14. The processing chamber of claim 13, wherein the processing chamber further comprises a fluid heater in thermal communication with the fluid positioned in the fluid volume.

15. The processing chamber of claim 13, wherein the processing chamber further comprises a lift assembly that is adapted to position the rotatable substrate support assembly relative to the one or more walls of the bowl assembly.

16. The processing chamber of claim 13, wherein the rotatable substrate support assembly further comprises:
a plenum in fluid communication with the substrate supporting surface; and
a vacuum source in fluid communication with the plenum and a substrate positioned on the substrate supporting surface.

17. A processing chamber having a processing region adapted to process a substrate, comprising:
a platen assembly positioned in the processing region, the platen assembly comprising:
a base plate member having a fluid aperture formed therethrough;
a substantially disk shaped fluid diffusion member sealably positioned to the base plate member and having an upstream side and a downstream side, wherein the substantially disk shaped fluid diffusion member has a plurality of fluid passages in fluid communication between the upstream side and the downstream side;
a fluid volume formed between the base plate member and the upstream side of the substantially disk shaped fluid diffusion member;
a raised portion protruding a first distance above the downstream side of the diffusion member; and
a rotatable substrate support assembly positioned in the processing region and having a substrate supporting surface, wherein the rotatable substrate support is coupled to the platen assembly and is adapted to rotate relative to the platen assembly, wherein the substrate support assembly has one or more spaced substrate supporting fingers that each have a substrate supporting surface, and the processing chamber further comprises:
a bowl assembly positioned in the processing region and having one or more walls that form the fluid volume, wherein the fluid volume is sized to allow the one or more spaced substrate supporting fingers to be immersed in a fluid positioned in the fluid volume;
a motor adapted to rotate the one or more spaced substrate supporting fingers;
a gap formed between a surface of a substrate positioned on the one or more spaced substrate supporting fingers and a surface of the one or more walls of the bowl; and
a fluid source in fluid communication with the fluid volume and the surface of the substrate that is positioned on the one or more substrate supportfing surfaces.

* * * * *

UNITED STATES PATENT AND TRADEMARK OFFICE
CERTIFICATE OF CORRECTION

PATENT NO. : 7,654,221 B2                                Page 1 of 1
APPLICATION NO. : 11/175251
DATED : February 2, 2010
INVENTOR(S) : Lubomirsky et al.

It is certified that error appears in the above-identified patent and that said Letters Patent is hereby corrected as shown below:

Column 25, Line 1, please delete "0rpm" and insert --rpm-- therefor;

Column 42, Claim 17, Line 65, please delete "supportfing" and insert --supporting-- therefor.

Signed and Sealed this

Twentieth Day of April, 2010

David J. Kappos
*Director of the United States Patent and Trademark Office*